United States Patent [19]

Kawahara et al.

[11] Patent Number: 4,984,202
[45] Date of Patent: Jan. 8, 1991

[54] LOW VOLTAGE-OPERATED SEMICONDUCTOR INTEGRATED CIRCUIT

[75] Inventors: Takayuki Kawahara; Goro Kitsukawa; Yoshiki Kawajiri; Kiyoo Itoh, all of Tokyo, Japan

[73] Assignee: Hitachi, Ltd., Tokyo, Japan

[21] Appl. No.: 496,238

[22] Filed: Mar. 20, 1990

[30] Foreign Application Priority Data

Mar. 20, 1989 [JP] Japan ..................................... 1-66128

[51] Int. Cl.$^5$ ........................ G11C 13/00; G11C 11/40
[52] U.S. Cl. .................................... 365/177; 365/203; 357/43
[58] Field of Search ................... 365/177, 189.01, 226, 365/227, 203, 230.01; 357/43

[56] References Cited

U.S. PATENT DOCUMENTS 4,916,667 4/1990 Miyabayashi et al. ............... 365/203

Primary Examiner—Terrell W. Fears
Attorney, Agent, or Firm—Antonelli, Terry, Stout & Kraus

[57] ABSTRACT

A large-scale semiconductor integrated circuit comprising a low voltage-operated CMOS internal circuit, input and output circuits having bipolar transistors, said low voltage-operated CMOS internal circuit being supplied with an internal power supply voltage which is produced by dropping an external power supply voltage, and a level shifting circuit which converts the levels of signals in the chip. The input and output signals have the ECL level or the TTL level. The low voltage-operated CMOS internal circuit includes, for example, a DRAM of greater than 4 megabits and a microprocessor, and the internal operation voltage is smaller than 1.5 V. By the structure, a high-speed, low-power-consumption and low-noise semiconductor device is provided.

15 Claims, 35 Drawing Sheets

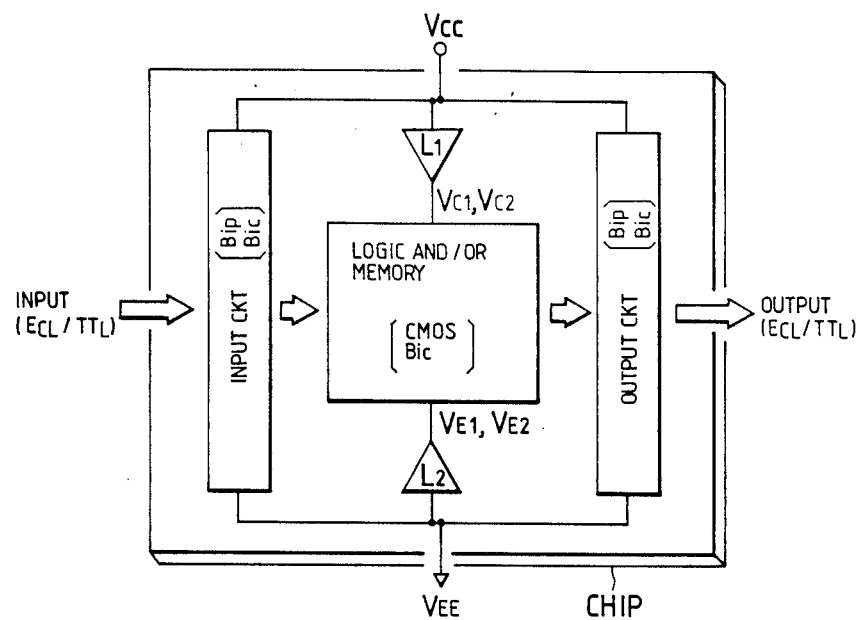
FIG. 1
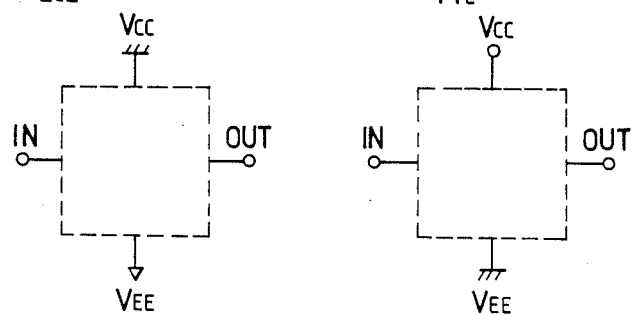
FIG. 2A
FIG. 2B

FIG. 58A

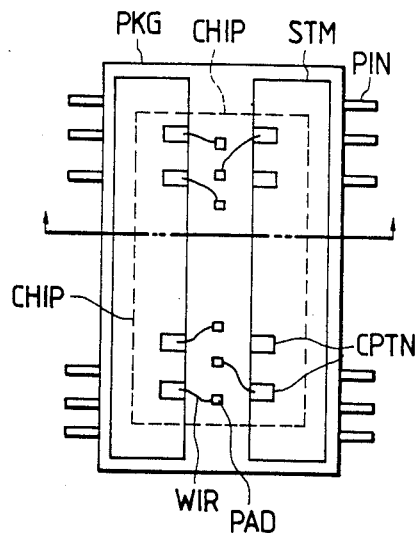

FIG. 58B

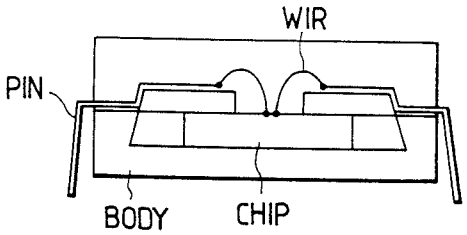

FIG. 59

| | |
|---|---|
| $A_0 \sim A_{11}$ | X ADDRESS INPUT |
| $A_{12} \sim A_{18}$ | Y ADDRESS INPUT |
| $A_{19} \sim A_{21}$ | Z ADDRESS INPUT |
| $\overline{CE}$ | CHIP ENABLE INPUT |
| $\overline{OE}$ | OUTPUT ENABLE INPUT |
| $\overline{REF}$ | REFRESH INPUT |
| $\overline{WE}$ | WRITE ENABLE INPUT |
| $D_{IN}$ | DATA-IN INPUT |
| $D_{OUT}$ | DATA-OUT INPUT |
| $V_{CC}$ | FIRST POWER SUPPLY VOLTAGE |
| $V_{CCR}$ | FIRST POWER SUPPLY VOLTAGE FOR REFERENCE VOLTAGE GENERATING CIRCUIT |
| $V_{EE}$ | SECOND POWER SUPPLY VOLTAGE |
| $V_{EER}$ | SECOND POWER SUPPLY VOLTAGE FOR REFERENCE VOLTAGE GENERATING CIRCUIT |

LOW VOLTAGE-OPERATED SEMICONDUCTOR INTEGRATED CIRCUIT

BACKGROUND OF THE INVENTION

The present invention relates to a high-speed, low-power-consumption, low-noise semiconductor device.

Attention has heretofore been given to BiCMOS technology as means for operating the semiconductor devices at high speeds as disclosed in Nikkei Microdevice, Feb., 1988, pp. 52-84.

As is well known, the BiCMOS technology is the one in which a bipolar transistor and a CMOS are combined together in an elementary circuit or on the same chip. This technology is intended to increase the operation speed of an LSI by utilizing higher driving capability of the bipolar transistor while maintaining the high-density and low-power characteristics comparable with that of the CMOS circuits.

According to the conventional BiCMOS technology, however, the operation speed can be doubled at the greatest compared with that of the CMOS circuits. Therefore, in order to use, for example, a dynamic random access memory (DRAM) together with the currently employed MPU [MC 68020 (trade name, Motorola Co. in U.S.A.)] having an operating frequency of 20 to 30 MHz or together with [A 80386 (trade name, Intel Co. in U.S.A.], the access time must be shorter than 50 ns. The access time will have to be further shortened in the future. However, the BiCMOS DRAM based on the conventional BiCMOS technology imposes limitation with regard to the operation speed. Therefore, the existing BiCMOS technology is no longer capable of further improving performance of information processing equipment.

In recent years, furthermore, LSI's with mixed analog-digital functions have been vigorously developed, and attention has been given to the BiCMOS technology which uses small signal detecting capability of the bipolar transistor for such LSI's. With the conventional BiCMOS technology, however, the signal amplitude of the BiCMOS circuit in the digital unit is nearly equal to a supply voltage (e.g., 5 volts), i.e., the signal amplitude of the BiCMOS circuit is great. Moreover, since the rising/falling time of the signal is very short, noise voltage is induced in the power supply lines and in the neighboring signal lines which are coupled to an analog unit that handles small signals to impair stability in the operation.

This is because the input and output signals of a number of BiCMOS circuits constituting the BiCMOS LSI have a large amplitude which is nearly the same as the supply voltage. This can be solved effectively if the amplitude of internal signals is decreased. For instance, an input signal of the ECL level from a unit outside the chip is received by a current switching circuit of a bipolar transistor to generate a signal of an amplitude of 0.8 V to 1.6 V. This signal is used to operate most of the internal circuits such as decoder circuits and like circuits such that the chip as a whole operates at high speeds suppressing noise. In, for example, the DRAM and SRAM, however, signals of a large amplitude are needed to drive the word lines of memory cells. In order to convert the level in the decoder or the word driver, therefore, it is necessary to use a level converter circuit that operates at high speeds yet consuming small amounts of electric power.

SUMMARY OF THE INVENTION

In order to achieve the above objects according to the present invention, the input/output circuit that gives and receives signals to and from the units outside the chip is constituted by a bipolar or a BiCMOS circuit. The input circuit receives input signals of the ECL/TTL level and generates signals having amplitudes of 0.8 V to 1.6 V. These signals are used to drive most of the CMOS circuits in the chip on low voltage such that the chip as a whole operates at high speeds suppressing the noise. Operating the CMOS circuits on a low voltage is also necessary from the standpoint of degradation in the voltage withstanding capability of small MOS transistors. Therefore, the voltage is set to be, for example, smaller than 1.5 V. However, the word lines in the MOS memory require signals having an amplitude of, for example, greater than 2 V. The level converter circuit from a low amplitude into a high amplitude is made up of a so-called current mirror circuit in which the sources of first and second MOS transistors having the same type of conduction are connected to a first power supply, and the gate and drain of the first transistor and the gate of the second transistor are connected in common. A first switch that is opened and closed by a first input signal is provided between the drain of the first transistor and the second power supply, the drain of the second transistor is used as an output terminal, and a second switch that is opened and closed by a second input signal is provided between the output terminal and the second power supply, such that an output signal having a large amplitude (voltage difference between the first power supply and the second power supply) is generated at a high speed from the first and second input signals having small amplitudes. The circuit for generating the first and second input signals of small amplitudes can be represented by an ECL circuit using bipolar transistors or a CMOS circuit that operates on a low voltage. When the first and second switches consist of MOS transistors and the threshold voltage $V_{TH}$ thereof is smaller than the output amplitude (e.g., 0.8 V to 1.6 V) of the ECL circuit, the switches can be directly driven by the output of the ECL circuit. Or, the first and second switches can also be driven by the output of the CMOS circuit that operates on a low voltage. These systems become more important as the technology for fine working advances enabling, for example, the gate length to become 0.3 μm and $V_{TH}$ to be 0.2 V.

The above-mentioned bipolar ECL circuit or the low voltage-operated CMOS circuit and the level converter circuit are combined together, and whereby the MOS memory cell array drive circuit only is driven with the output of a large amplitude and most of other circuits in the LSI are driven with the output of a small amplitude, making it possible to realize a high-speed, low-power-consumption and low-noise LSI.

These and other objects and many of the attendant advantages of this invention will be readily appreciated as the same becomes better understood by reference to the following detailed description when considered in connection with the accompanying drawings.

BRIEF DESCRIPTION OF THE DRAWINGS

FIG. 1 is a diagram illustrating a basic embodiment according to the present invention;

FIGS. 2A and 2B are diagrams illustrating the application of ECL/TTL supply voltages;

FIGS. 20A and 20B are diagrams illustrating embodiments in which FIGS. 19A and 19B are concretely constituted;

FIG. 58 is a diagram made up of FIGS. 58A and 58B showing how the chip of FIG. 57 is bonded; and FIG. 59 is a diagram of the pin constitution of a 4-megabit DRAM.

DETAILED DESCRIPTION OF THE INVENTION

The invention will now be described in detail by way of embodiments.

FIG. 1 illustrates a basic embodiment of the present invention wherein an input circuit and an output circuit of an ECL/TTL interface are constituted by a bipolar or a BiCMOS circuit and are operated on supply voltages ($V_{CC}$, $V_{EE}$) applied from external units. The internal logic circuit and the memory are operated on internal supply voltages $V_{C1}$, $V_{E1}$, etc. constituted by a CMOS circuit. One of them may be operated on $V_{E1}$ or $V_{C1}$ and the other one may be operated on $V_{EE}$ or $V_{CC}$. The internal circuit is served with an input signal of 0.8 to 1.6 V from an input circuit and operates at a high speed maintaining a small amplitude. Symbols $L_1$ and $L_2$ denote voltage limites that generate voltages $V_{C1}$, $V_{E1}$ that are lower than $V_{CC}$ but that are higher than $V_{EE}$ by using MOS or bipolar transistors. A voltage higher than $V_{CC}$ and a voltage lower than $V_{EE}$ can also be generated using a charge-pumping circuit. Bipolar transistors employed for the circuits $L_1$ and $L_2$ make it advantageous to increase the current supplying capability or to establish a highly strictly limited voltage. In a series of embodiments that will be described hereinbelow, the integrated circuit is an ECL interface, and the voltages applied from external units are $V_{CC}$ (higher voltage supply) = 0 V and $V_{EE}$ (lower voltage supply) = −4.5 V unless stated otherwise. Employment of ECL is effective not only for increasing the speed of the LSI to which attention is given but also for increasing the speed of the system as a whole. If the voltage withstanding capability of the devices decreases accompanying the decrease in the sizes of devices in the future, the voltage $V_{EE}$ applied from an external unit must further be inceased. The present invention makes it easy to adapt the conventional ECL supply voltage with $V_{EE} = -5.2$ V as a center as well as a high supply voltage $V_{EE}$ of about −3 V.

Figure 45:
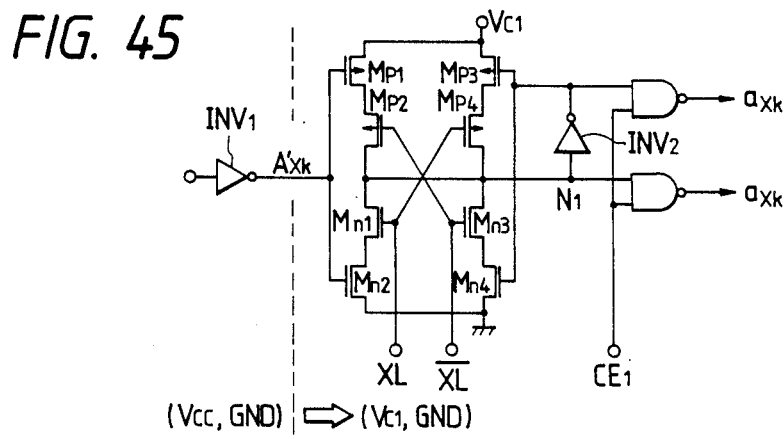
FIG. 45 is a diagram showing an address buffer of a TTL interface.
Figure 46:
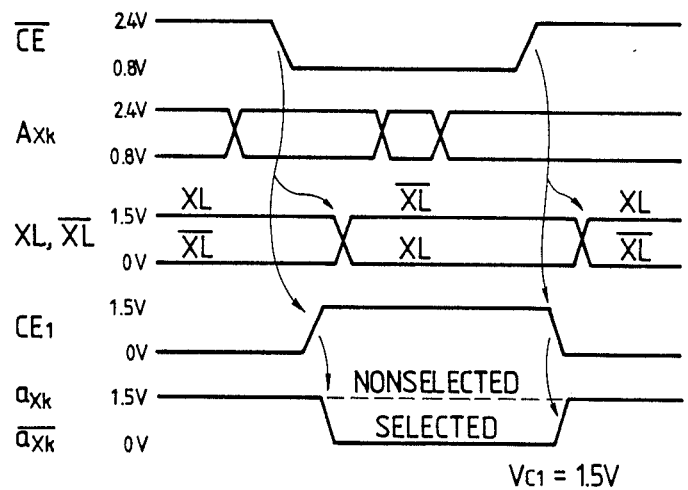
FIG. 46 is a diagram for explaining the operation of FIG. 45.
Figure 49:
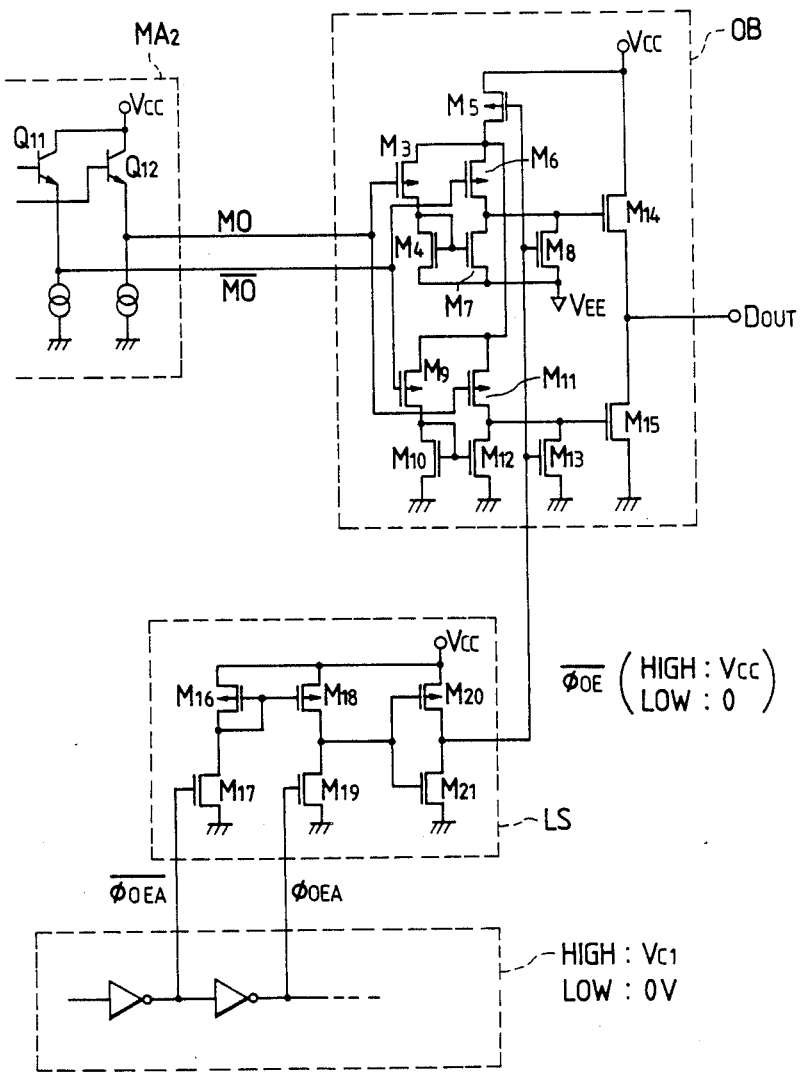
FIG. 49 is a diagram which illustrates an output circuit of the TTL interface.

When the present invention is to be adapted to the LSI of the TTL interface, furthermore, $V_{EE}$ is set to be 0 V as shown in FIGS. 2A and 2B, $V_{CC}$ is set to 3 to 5 V, a circuit shown, for example, in FIGS. 45 and 46 is used as an input circuit, and a circuit shown, for example, in FIG. 49 is used as an output circuit, such that the group of internal circuits of FIG. 1 can be commonly used for the ECL/TTL in the series of embodiments that will be described below.

Figure 3A:
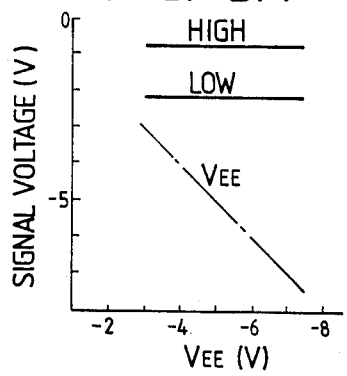
FIGS. 3A to 3D are diagrams showing two methods of setting dependency of signal voltages in the chip upon the supply voltage.
Figure 3B:
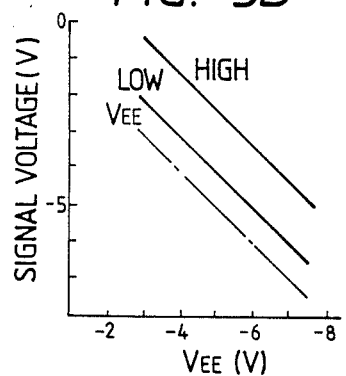
Figure 3C:
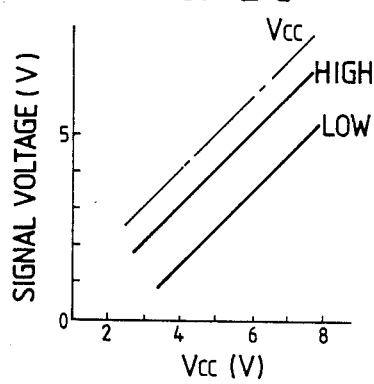
Figure 3D:
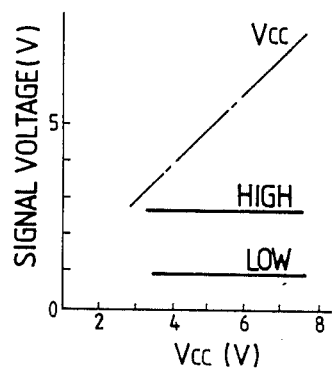

FIGS. 3A to 3D describe dependency of signal voltages of the group of internal circuits of FIG. 1 upon the supply voltage $V_{EE}$ or $V_{CC}$ applied from an external unit. In FIGS. 3A to 3D, the signal voltages have GND level ($V_{CC}$ for the ECL and $V_{EE}$ for the TTL) as a reference. FIGS. 3A and 3B are the cases of the ECL interface, and FIGS. 3C and 3D are the cases of the TTL interface. As shown in these FIGS. 3A to 3D, the signal amplitude (=High −Low) is maintained constant for the change in $V_{EE}$ or $V_{CC}$, so that the operation speed and the operational margin of the internal circuit will not be changed by the supply voltage. In FIGS. 3A and 3C, the high and low signal voltages are maintained constant with $V_{CC}$ as a reference, which are the outputs of an ordinary bipolar current switch. In FIGS. 3B and 3D, the high and low voltages are maintained constant with $V_{EE}$ as a reference. Which FIGS. 3A, 3C or FIGS. 3B, 3D are adopted is determined depending upon the constitutions of the voltage limiters $L_1$ and $L_2$ of FIG. 1.

Figure 4:
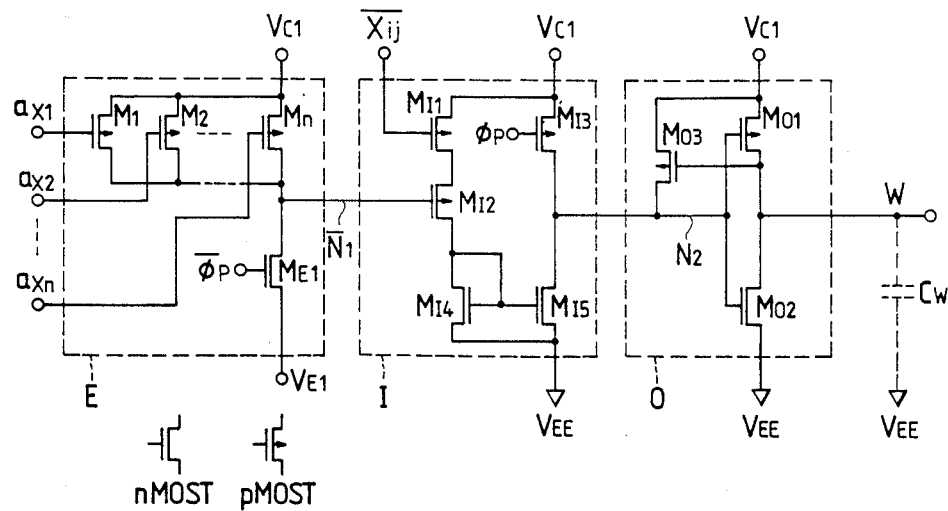
FIG. 4 is a diagram illustrating internal circuits according to a first embodiment of the present invention.

FIG. 4 illustrates an embodiment of internal circuits drawing a decoder and a word driver circuit in a memory, wherein a circuit block E is a decoder which inputs a signal generated, for example, by an ECL circuit of bipolar transistors and which operates utilizing a difference between the amplitude of the input signal and $|V_{TH}|$ of the MOS transistor. A circuit block I is a level converter circuit which has a current mirror constitution and generates a signal of a large amplitude based on a logic of an input signal of a small amplitude. A circuit block O is a word driver which drives the load $C_W$ maintaining a large amplitude. Symbols $V_{C1}$ and $V_{E1}$ denote internal supply voltages, and $V_{EE}$ denotes a low supply voltage applied from an external unit. The feature of this embodiment resides in that a large load at the output terminal W is driven at a high speed maintaining a large amplitude ($V_{C1} - V_{EE}$) while carrying out the logic operation with an input signal of a small amplitude ($V_{C1} - V_{E1}$) that is input to the block E. Hereinafter, the terminal's names and the signal's names are denoted by $a_{xl}$ to $a_{xn}$, $\overline{CE}$, $\phi_P$, $\overline{\phi_P}$, and the like, and the supply terminal's names, supply's names and voltage values are denoted by $V_{C1}$, $V_{E1}$, $V_{CC}$, $V_{EE}$, and the like, unless there develops no confusion.

In the block E of FIG. 4, symbols $M_l$ to $M_n$ denote OR circuits constituted by p-channel MOS transistors (hereinafter referred to as pMOSTs), and an n-channel MOS transistor (hereinafter referred to as nMOST) $M_{E1}$ is provided for precharging. Voltages are so set that $V_{CC} > V_{C1} > V_{E1} > V_{EE}$, and $|V_{C1} - V_{E1}|$ denotes a small voltage difference such as 0.8 V. The signals $a_{xl}$ to $a_{xn}$, $\overline{X_{ij}}$, $\phi_P$ and $\overline{\phi_P}$ are generated from address input signals and a chip enable signal $\overline{CE}$ (not shown in FIG. 4) that determines whether the chip be operated or not. The signals $a_{xl}$ to $a_{xn}$ have the high level $V_{C1}$, and the signal $\overline{\phi_P}$ has the low level $V_{E1}$, which are both in agreement with the source voltage of the MOST's. In this circuit, the logical sum of $a_{xl}$ to $a_{xn}$ has a small amplitude and the result thereof is sent to $\overline{N_1}$. In the block I of FIG. 4, MOS transistors $M_{I4}$ and $M_{I5}$ constitute a current mirror circuit, and MOS transistors $M_{I1}$ and $M_{I2}$ denote circuits that find a logical product of the signals $\overline{X_{ij}}$ and $\overline{N_1}$ to operate the current mirror circuit. Here, a MOS transistor $M_{I3}$ is provided for precharging. In this circuit, if a ratio of the gate width $W_{I4}$ of the MOS transistor $M_{I4}$ to the gate width $W_{I5}$ of $M_{I5}$ is $m = W_{I5}/W_{I4}$ ($m > 1$), an electric current flows into the MOS transistor $M_{I5}$ which is m times as great as the current flowing into $M_{I4}$. The signals $\overline{X_{ij}}$, $\overline{N_1}$ and $\phi_P$ have a small amplitude ($V_{C1} - V_{E1}$) and has the high level $V_{C1}$. This circuit finds a logical product of $\overline{X_{ij}}$ and $\overline{N_1}$ and converts the level into a signal $N_2$ of a large amplitude ($V_{C1} - V_{EE}$). The block O of FIG. 4 is an inverter circuit which receives $N_2$ and produces W, and drives a large load $C_W$. A pMOST $M_{O3}$ is a negative feedback circuit from the output W to the input $N_2$ and works to prevent erroneous operation caused by noise.

Figure 5:
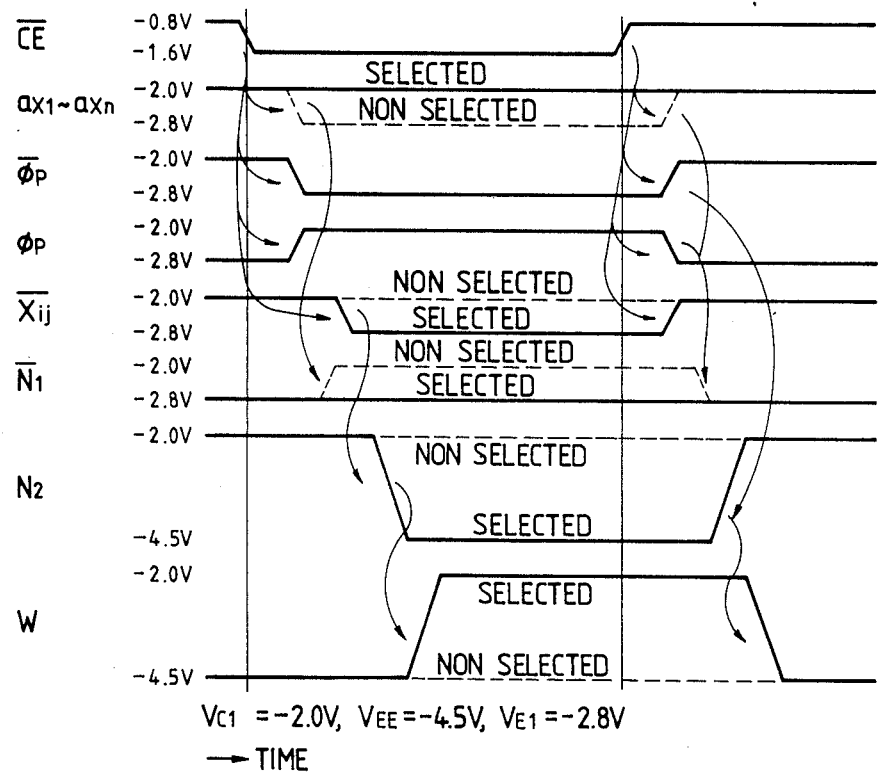
FIG. 5 is a diagram for explaining the operation of FIG. 4.

FIG. 5 is a timing diagram for explaining the operation of FIG. 4. When the chip enable input signal $\overline{CE}$ (not shown in FIG. 4) has the high level (e.g., −0.8 V), the circuit on the chip assumes the stand-by state, and the inputs $a_{xl}$ to $a_{xn}$, $\overline{X_{ij}}$, and $\overline{\phi_P}$ at this moment all have the high level, i.e., −2.0 V, and the input $\phi_P$ has the low level, i.e., −2.8 V. In the block E, therefore, $M_l$ to $M_n$ are all turned off and $M_{E1}$ is turned on, so that $\overline{N_1}$ assumes −2.8 V which is equal to $V_{E1}$. In the block I, $M_{I2}$ is turned on but $M_{I1}$ is turned off. Therefore, no current flows into $M_{I4}$ and no current flows either to $M_{I5}$ that constitutes a current mirror circuit together with $M_{I4}$. However, since $M'_{I3}$ is turned on, $N_2$ assumes the high level of −2.0 V. In the block O, the output W has the low level of −4.5 V since the input $N_2$ has −2.0 V. Next, as the chip enable signal $\overline{CE}$ changes from the high level into the low level (e.g., −1.6 V), the precharge signal $\overline{\phi_P}$ changes from −2.0 V to −2.8 V in the block E, and the signals $a_{xl}$ to $a_{xn}$ change from −2.0 V into −2.8 V due to address signals from the external unit or remains at −2.0 V. When at least one of the signals $a_{xl}$ to $a_{xn}$ changes from −2.0 V into −2.8 V, the signal $\overline{N_1}$ changes from −2.8 V into −2.0 V (nonselected), and $\overline{N_1}$ remains at −2.8 V (selected) only when all of the signals $a_{xl}$ to $a_{xn}$ remain at −2.0 V. In the block I, the precharge signal $\phi_P$ changes from −2.8 V into −2.0 V and $M_{I3}$ is turned off. The signal $\overline{X_{ij}}$ may change from −2.0 V into −2.8 V (selected) or may not change but remain at −2.0 V (nonselected) depending upon the external address input signals. The two MOST's $M_{I1}$ and $M_{I2}$ are turned on to flow the electric current only when $\overline{N_1}$ remains at −2.8 V and $\overline{X_{ij}}$ changes into −2.8 V. Even in this case, the logical product is obtained maintaining a small amplitude by utilizing the difference between a small amplitude (0.8 V in this case) of the input signal and $V_{TH}$ (e.g., 0.2 V) of the MOST. When a current flows into $M_{I1}$ and $M_{I2}$, the gate (drain) voltage of $M_{I4}$ rises to turn the $M_{I4}$ on. In this case, if the gate width of $M_{I5}$ is set to be m times as great as the gate width of $M_{I4}$ as described earlier, an electric current flows into $M_{I5}$ which is m times as great as that of $M_{I4}$. Therefore, the signal $N_2$ can be discharged at a high speed from $V_{C1}$ (−2.0 V) to $V_{EE}$ (−4.5 V). Thus, an output signal having an amplitude of 2.5 V (high level of −2.0 V and a low level of −4.5 V) is obtained from the input signal having an amplitude of 0.8 V (high level of −2.0 V and a low level of −2.8 V). In the block O, the output W remains at −4.5 V when $N_2$ remains at −2.0 V (nonselected) but changes from −4.5 V into −2.0 V when $N_2$ changes from −2.0 V into −4.5 V (selected). When the signal $\overline{CE}$ changes again from the low level into the high level, the inputs $a_{xI}$ to $a_{xn}$, $\overline{X_{ij}}$ and $\overline{\phi_P}$ all assume −2.0 V, and the input $\phi_P$ assumes −2.8 V. In the block E, $M_I$ to $M_n$ are all turned off, $M_{EI}$ is turned on, and $\overline{N_1}$ assumes −2.8 V to be ready for the next cycle. In the block I, $M_{I1}$ is turned off, $M_{I3}$ is turned on, and $N_2$ assumes −2.0 V, so that the output W of the block O assumes −4.5 V.

According to this embodiment as described above, the block E obtains the logic of input signals having small amplitudes, the block I converts the level into a signal having a large amplitude, and the block O amplifies the driving capability to drive a large load at high speeds.

According to this embodiment, the inputs $a_{xI}$ to $a_{xn}$ and $\overline{X_{ij}}$ were all presumed to have the high level (or the low level) under the stand-by state such that the invention could be adapted to a dynamic random access memory (DRAM). In the DRAM as is well known, the word lines (corresponds to W in FIG. 1) must all be placed under the nonselected condition during the stand-by state.

Figure 6:
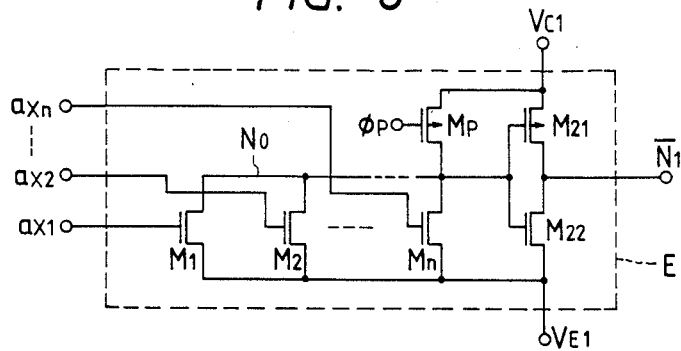
FIG. 6 is a diagram showing the block E of FIG. 4 according to another embodiment.

FIG. 6 illustrates another embodiment of the present invention in which the block E only of FIG. 4 is modified. In the block E of FIG. 4, the pMOST's were connected in parallel to obtain a logic of the inputs $a_{xI}$ to $a_{xn}$. In this embodiment, however, the nMOST's $M_I$ to $M_n$ are connected in parallel to achieve the same function. The transistor $M_P$ is provided for precharging, and $M_{21}$ and $M_{22}$ form inverter circuits that render the output signal $\overline{N_1}$ to have the same polarity as that of the block E of FIG. 4. The output $\overline{N_1}$ of the circuit block E of FIG. 4 is directly input to the block I of FIG. 4. The signals $a_{xI}$ to $a_{xn}$ have the low level $V_{EI}$ and the signal $\phi_P$ has the high level $V_{C1}$ which are both in agreement with the source voltage of the MOST. Here, symbols $V_{C1}$ and $V_{EI}$ denote voltage generated from the external power supplies $V_{CC}$, $V_{EE}$ in the chip, the relations being so set that $V_{CC} > V_{C1} > V_{EI} > V_{EE}$, and $|V_{C1} - V_{EI}|$ represents a small voltage difference such as 0.8 V. The feature of this embodiment resides in that a logical sum circuit is constituted by nMOST's $M_I$ to $M_n$ having a large driving capability per a unit gate width instead of using the pMOST's $M_I$ to $M_n$ of the block E of FIG. 4, and the result is inverted by an inverter circuit to produce the output $\overline{N_1}$, enabling the logical sum circuit to be laid out requiring a reduced area. Furthermore, even a large load carried by $\overline{N_1}$ can be driven at high speeds by the inverter circuit.

Figure 7:
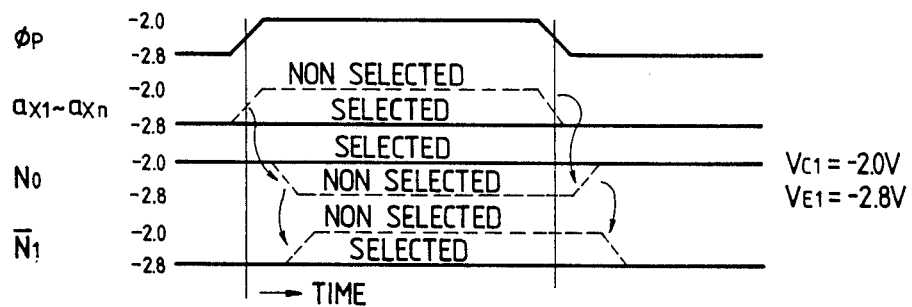
FIG. 7 is a diagram for explaining the operation of FIG. 6.

FIG. 7 is a diagram illustrating the operation timings of FIG. 6. First, the chip enable signal $\overline{CE}$ is −2.0 V (not shown), $\phi_P$ is −2.8 V, and $a_{xI}$ to $a_{xn}$ are all −2.8 V, such that $M_I$ to $M_n$ are off and $M_P$ is on. Therefore, a node $N_O$ is precharged to −2.0 V, and $\overline{N_1}$ assumes −2.8 V. When the signal $\overline{CE}$ changes from −0.8 V to −1.6 V, $\phi_P$ changes from −2.8 V to −2.0 V, $M_P$ is turned off, and $a_{xI}$ to $a_{xn}$ all remain at −2.8 V or change from −2.8 V into −2.0 V according to the external address input signals. When at least one of them changes from −2.8 V to −2.0 V, the node $N_O$ changes from −2.0 V to −2.8 V, and the output $\overline{N_1}$ changes from −2.8 V into −2.0 V (nonselected). Only when all of the signals $a_{xI}$ to $a_{xn}$ remain at −2.8 V, the node $N_O$ remains at −2.0 V and the output $\overline{N_1}$ remains at −2.8 V (selected). When the chip enable signal $\overline{CE}$ changes again from −1.6 V to −0.8 V, the signals $a_{xI}$ to $a_{xn}$ all assume −1.6 V, and $\phi_P$ assumes −1.6 V too. Therefore, $M_I$ to $M_n$ are turned off and $M_P$ is turned on, permitting all $N_O$ to assume −0.8 V and all $\overline{N_1}$ to assume −1.6 V. Thus, the output is obtained which is the same as that of the block E of FIG. 4.

Figure 8:
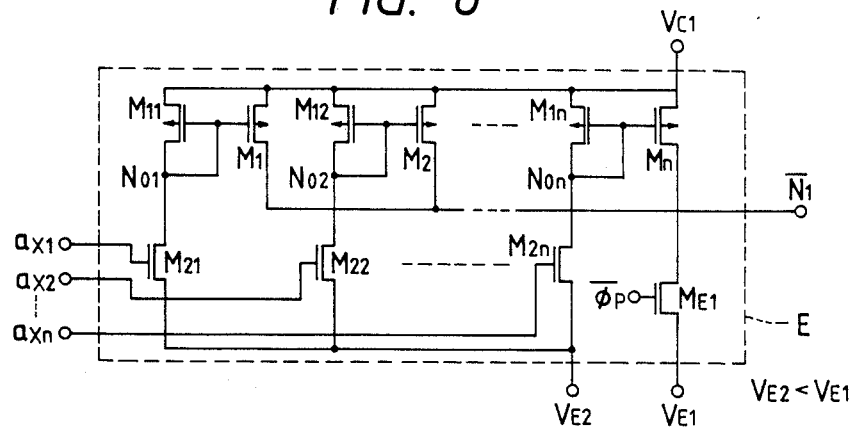
FIG. 8 is a diagram showing the block E of FIG. 4 according to a further embodiment.

FIG. 8 illustrates a further embodiment of the present invention modifying the block E of FIG. 4. In the block E of FIG. 4, the logic of the inputs $a_{xI}$ to $a_{xn}$ is obtained by the pMOSTs $M_I$ to $M_n$ that are connected in parallel. According to this embodiment, however, a current mirror circuit is used for each of the pMOSTs. That is, in the block E of FIG. 4, for example, the gate of pMOST $M_1$ is directly driven by $a_{xI}$ to electrically charge $\overline{N_1}$. According to the embodiment of FIG. 8, on the other hand, pMOST $M_{11}$ and nMOST $M_{21}$ are connected to the gate of the pMOST $M_1$, and a current flowing into $M_{21}$ (current flowing into $M_{11}$) is amplified through the current mirror circuit to drive $\overline{N_1}$. If $M_{11}$ has a gate width $W_{11}$ and $M_1$ has a gate width $W_1$, a current flows into $M_1$ which is $W_1/W_{11}$ times as great as the current flowing into $M_{11}$ as described earlier. The sources of $M_{21}$ to $M_{2n}$ are connected to the power supply $V_{E2}$ that is generated on-chip. Symbol $M_{EI}$ denotes a precharge transistor of which the source is connected to a power supply $V_{EI}$ generated on-chip. Symbols $V_{C1}$, $V_{EI}$ and $V_{E2}$ denote voltages generated from the external power supplies $V_{CC}$, $V_{EE}$ on-chip, the relations thereof being so set that $V_{CC} > V_{C1} > V_{EI} > V_{E2} > V_{EE}$, and $|V_{C1} - V_{EI}|$ represents a small voltage difference such as 0.8 V. The reason for setting the voltage $V_{E2}$ to be lower than the voltage $V_{EI}$ is to increase the conductance of $M_1$ to $M_n$ during the operation. The voltages $N_{O1}$ to $N_{On}$ are determined by driving capability ratios of $M_{11}$ to $M_{1n}$ and $M_{21}$ to $M_{2n}$. Therefore, $V_{E2}$ can be brought into agreement with $V_{EI}$ only when the gate widths of $M_{11}$ to $M_{1n}$ are made extremely small or only when the gate widths of $M_{21}$ to $M_{2n}$ are made extremely great. Generally, the voltages $N_{O1}$ to $N_{On}$ are higher than $V_{E2}$ and it is recommended that $V_{E2}$ is set to be low. Further, the low level of $a_{x1}$ to $a_{xn}$ is brought into agreement with $V_{E2}$ and the low level of $\phi_P$ is brought into agreement with $V_{EI}$. The feature of this embodiment resides in that the transistors $M_1$ to $M_n$ for obtaining the logical sum are operated at high speeds using current mirror circuits.

Figure 9:
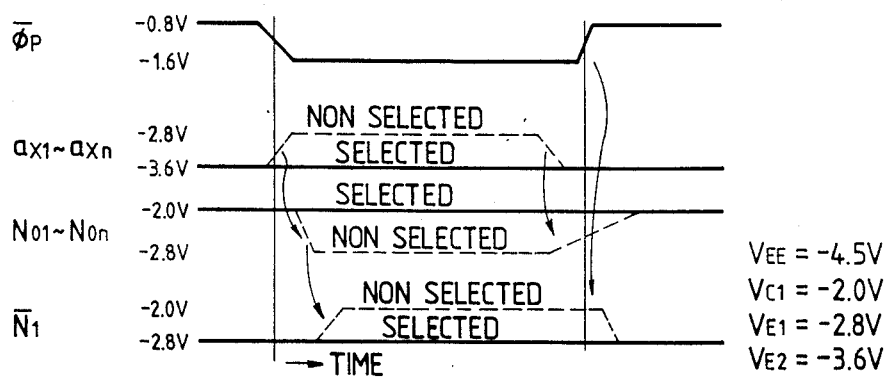
FIG. 9 is a diagram for explaining the operation of FIG. 8.

FIG. 9 is a diagram showing operation timings of the circuit of FIG. 8. The signals $\overline{CE}$ and $a_{x1}$ to $a_{xn}$ have timings which are the same as those of FIG. 5 and are not described here in detail. Therefore, the output is obtained which is the same as that of the block E of FIG. 4, and the level converter circuit block I and the driving circuit block O in the succeeding stages may be constituted in the same manner as above. The block E obtains a logic of input signals of small amplitude, the block I converts the level of the result thereof into a signal having a large amplitude, and the block O amplifies the driving capability to drive a large load.

Figure 10:
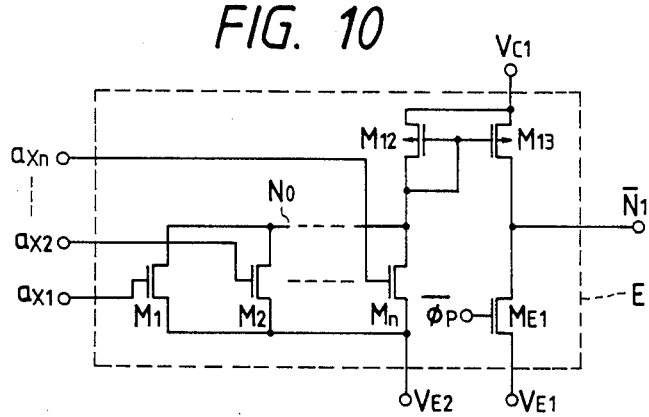
FIG. 10 is a diagram showing the block E of FIG. 4 according to a still further embodiment.

FIG. 10 illustrates a still further embodiment of the present invention modifying the block E of FIG. 4. In this embodiment, the logical sum circuit is constituted by nMOST's $M_1$ to $M_n$, and the current is amplified by a current mirror circuit consisting of $M_{12}$ and $M_{13}$ to drive the output $\overline{N_1}$. Symbol $M_{E1}$ denotes a precharge transistor. The internal supply voltages and signal voltages are set and the operation is carried out in the same manner as those of the embodiment of FIGS. 8 and 9. The difference from the embodiment of FIG. 8 is that the logical sum is obtained through current mirror circuits in FIG. 8, whereas in this embodiment, the logical sum if obtained and is then amplified through the current mirror circuit. The feature of this embodiment resides in that a high-speed logical sum circuit is realized using current mirror circuits using parts of a number smaller than that of the embodiment of FIG. 8. This embodiment has the same function as that of the block E of FIG. 4 to produce the same output signals. Like the block E of FIG. 4, therefore, the circuit can be connected to the level converter circuit block I and the driving circuit block O of the succeeding stages. Therefore, there is constituted a circuit in which the block E obtains a logic of input signals of small amplitudes, the block I converts the level thereof into a signal having a large amplitude, and a block O amplifies the driving capability to drive a large load.

In the foregoing were described embodiments of the decoder and word driver circuits in conjunction with FIGS. 4 to 10 as conrete examples of a low voltage CMOS circuit in the internal circuit pertaining to the basic embodiment of FIG. 1. However, the blocks I and O of FIG. 4 can also be used as ordinary driver circuits in addition to being used as decoder and word driver circuits. An embodiment will now be described.

Figure 11A:
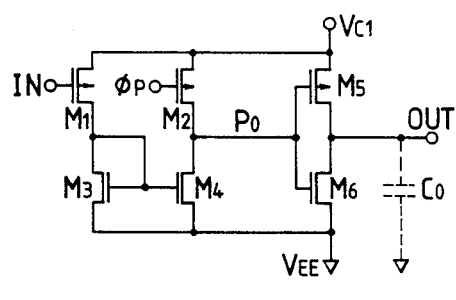
FIGS. 11A and 11B are diagrams illustrating the internal circuit according to a second embodiment of the present invention.
Figure 11B:
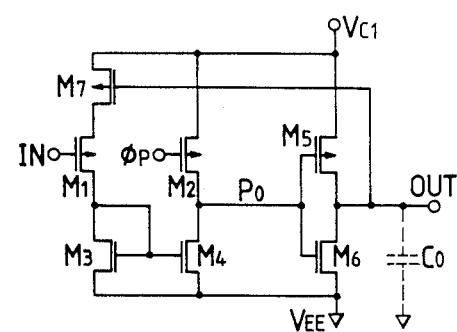

FIGS. 11A and 11B illustrate embodiments in which the present invention is used as an ordinary driver. In FIG. 11A, a MOS transistor $M_2$ is provided for precharging, MOS transistors $M_3$ and $M_4$ form a current mirror circuit that is operated by the gate input of $M_1$, and MOS transistors $M_5$ and $M_6$ form a CMOS inverter circuit for producing inverted outputs. The input IN and the precharge signal $\phi_P$ have the high level $V_{C1}$ and have an amplitude of, for example, 0.8 V. These two signals may be independent ones or may be an output of another inverter circuit, respectively. A first feature of this embodiment resides in that input signals of a small amplitude such as 0.8 V are received, the level is converted through a current mirror circuit, and a signal having a large amplitude is generated possessing a high level $V_{C1}$ and a low level $V_{EE}$. A second feature is that a large load $C_O$ can be driven at a high speed using the current mirror circuit though it is required to increase the MOS gate width of a CMOS inverter in the final stage that drives the load $C_O$. This is due to that a large current is supplied to $M_4$ as a result of using the current mirror circuit. FIG. 11B illustrates an embodiment which enables the current consumption to be more decreased than that of FIG. 11A. In FIG. 11B, a pMOST $M_7$ is inserted between the power supply $V_{C1}$ and the source of the pMOST $M_1$ to which the input signal is applied, and the gate thereof is connected to the output OUT of the inverter. In FIG. 11A, a constant current flows from $V_{C1}$ to $V_{EE}$ when the input IN assumes the low level and $M_1$ is turned on. If the gate width of $M_3$ is set to be small, the current can be suppressed to be small. When a number of circuits are simultaneously operated in the chip, however, the current becomes great as a whole. In the embodiment of FIG. 11B, the current path is cut off by utilizing the signal OUT so that there flows no constant current. According to this embodiment, the current consumption can be suppressed while obtaining the feature of the embodiment of FIG. 11A.

Figure 12:
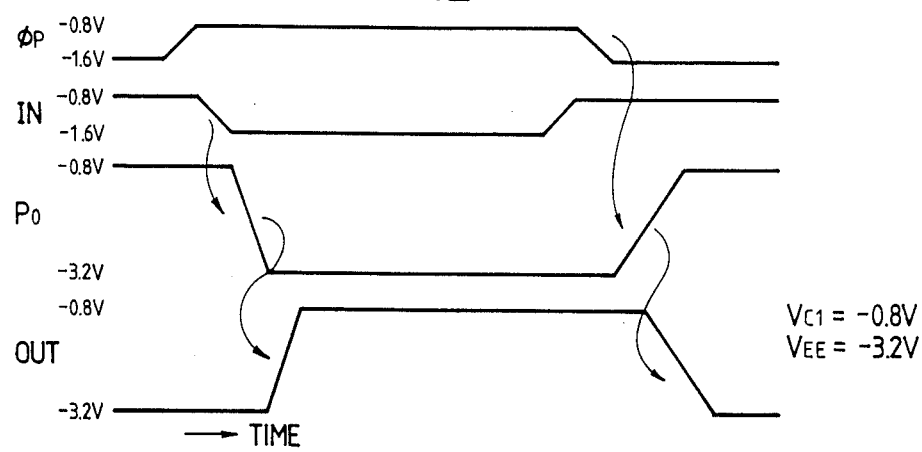
FIG. 12 is a diagram for explaining the operation of FIGS. 11A and 11B.

Operation of the circuit of FIG. 11B will now be described in conjunction with FIG. 12. First, the precharge signal $\phi_P$ assumes $-1.6$ V, the input signal IN assumes $-0.8$ V, $M_1$ is turned off, $M_2$ is turned on, and the node PO assumes $-0.8$ V and the output OUT assumes $-3.2$ V. The transistor $M_7$ is turned on. Then, when $\phi_P$ changes from $-1.6$ V to $-0.8$ V and IN changes from $-0.8$ V to $-1.6$ V, the transistor $M_2$ is turned off, $M_1$ is turned on, and the current mirror circuit is turned on enabling the node PO to be discharged to $-3.2$ V at a high speed. Therefore, the output OUT is charged to $-0.8$ V. Since $M_7$ is turned off, the current no longer flows into $M_1$ and $M_3$. Next, as the input signal IN changes from $-1.6$ V to $-0.8$ V and $\phi_P$ changes from $-0.8$ V to $-0.6$ V, the transistor $M_2$ is turned on, $M_1$ is turned off, the node PO is precharged again to $-0.8$ V, and the output OUT is discharged to $-3.2$ V. Therefore, the transistor $M_7$ is turned on again.

The method of suppressing the current consumption by inserting a MOST between the power supply and the input MOST of current mirror circuit can also be adapted to the embodiment of FIG. 8 or FIG. 10. In the embodiment of FIG. 8, pMOST's are inserted between $V_{C1}$ and the sources of the transistors $M_{1i}(i=1$ to n) and the gates thereof are all connected to $N_1$. In the embodiment of FIG. 10, furthermore, a pMOST is inserted between the source of $M_{12}$ and $V_{C1}$ and the gate thereof is connected to $N_1$.

Figure 13:
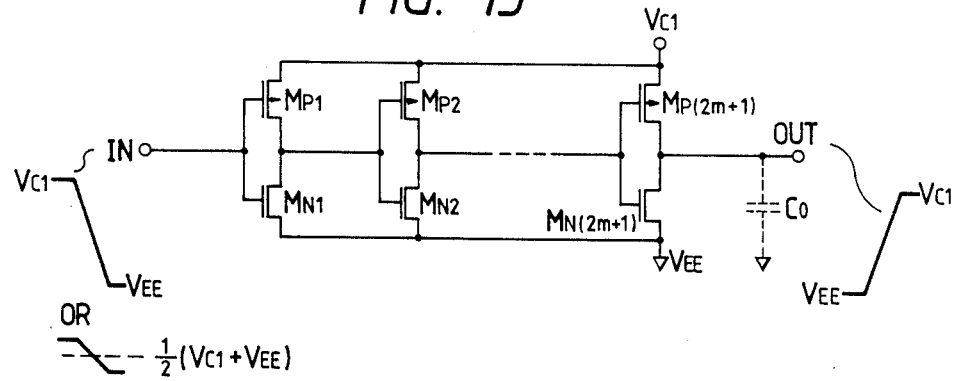
FIG. 13 is a diagram illustrating a conventional CMOS multistage inverter.

Drivers of the embodiments are FIGS. 11A and 11B will be compared with the CMOS circuit. FIG. 13 shows a CMOS circuit for comparison. In an ordinary CMOS circuit, CMOS inverter circuits are connected in many stages in order to drive a large load capacity $C_O$ at a high speed and to decrease the input capacity as viewed from IN. The ratio of gate widths of the neighboring inverter circuits is set to be, for example, 2.5. Performances of FIGS. 11A, 11B and 13 will now be compared under an equal input capacity condition. In the embodiments of FIGS. 11A and 11B, the gate width ratio $W_4/W_3$ of the MOST's $M_3$ and $M_4$ is set to be considerably great so that a large current flows into $M_4$. Therefore, the gates of CMOS inverter circuits $M_5$ and $M_6$ can be driven with one stage of current mirror circuit. In the CMOS circuit of FIG. 13, on the other hand, the interstage gate width ratio is usually 2.5 times. Therefore, an increased number of stages are required if its is attempted to constitute the circuit to have the input capacity and the output driving capability that are the same as those of the embodiments of FIGS. 11A and 11B. Accordingly, the current consumption increases in the CMOS circuit. Furthermore, if a delay time of one stage of the CMOS inverter is denoted by $\tau$, the total delay time becomes $(2m+1)\times\tau$, and the delay time becomes smaller in the embodiments of FIGS. 11A and 11B. Generally, furthermore, the input amplitude of the CMOS circuit requires a difference ($V_{C1}-V_{EE}$) in the supply voltage. When the input amplitude is smaller than this, a feed-through current flows into the first stage. For instance, when the input has a small amplitude of about 0.8 V with ($V_{C1}+V_{EE}$)/2 as a center, the levels are converted into signals of large amplitudes of $V_{C1}$ and $V_{EE}$ in the $2m+1$ stages after. In the first several stages, however, there flows a feed-through current and the operation speed is slow. According to this embodiment, e.g., in the embodiment of FIG. 11A, the level can be converted at a high speed from the input of a small amplitude having the high level of $V_{C1}$ through one stage. As described above, the feed-through current flows into $M_1$ and $M_3$ which, however, can be sufficiently decreased. It is also allowable to permit the flow of feed-through current only at the time when the signal is changed like in FIG. 11B.

Figure 14A:
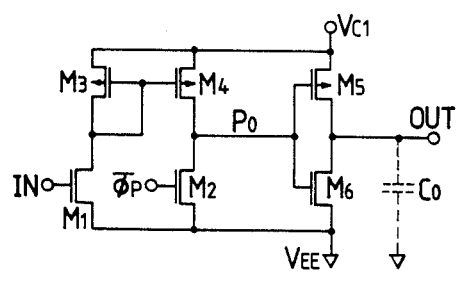
FIGS. 14A and 14B are diagrams illustrating the internal circuit according to a third embodiment of the present invention.
Figure 14B:
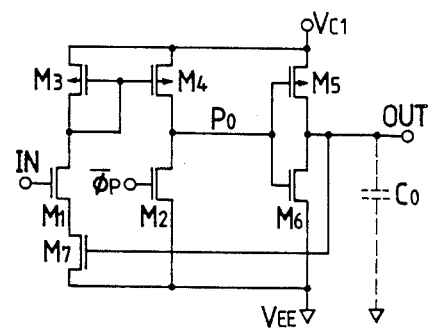

FIGS. 14A and 14B illustrate further embodiments in which the present invention is used as an ordinary driver. In FIG. 14A, symbol $M_2$ denotes a precharge transistor, $M_3$ and $M_4$ constitute a current mirror circuit that operates on a gate input of $M_1$, and $M_5$ and $M_6$ form a CMOS inverter for producing inverted outputs. A first feature of this embodiment is that the level can be converted by using the current mirror circuit even when the input signal has a small amplitude such as 0.8 V in order to generate an output amplitude of $V_{C1}-V_{EE}$. A second feature is that a large input gate capacity of the CMOS inverter circuit for driving a large load $C_O$ can be driven at a high speed by using the current mirror circuit. FIG. 14B shows an embodiment which decreases the current consumption based on the same means as that of FIG. 11B. In the embodiment of FIG. 14B, an nMOST $M_7$ is inserted between the source of the input nMOST $M_1$ and the power supply $V_{EE}$, and the gate thereof is connected to the output OUT of the inverter. When the transistor $M_1$ is turned on in FIG. 14A, a current path is formed from $V_{C1}$ to $V_{EE}$. In the embodiment of FIG. 14B, therefore, this current path is cut off by utilizing the signal OUT. In this embodiment, the current consumption can be decreased while obtaining the feature of the embodiment of FIG. 14A.

Figure 15:
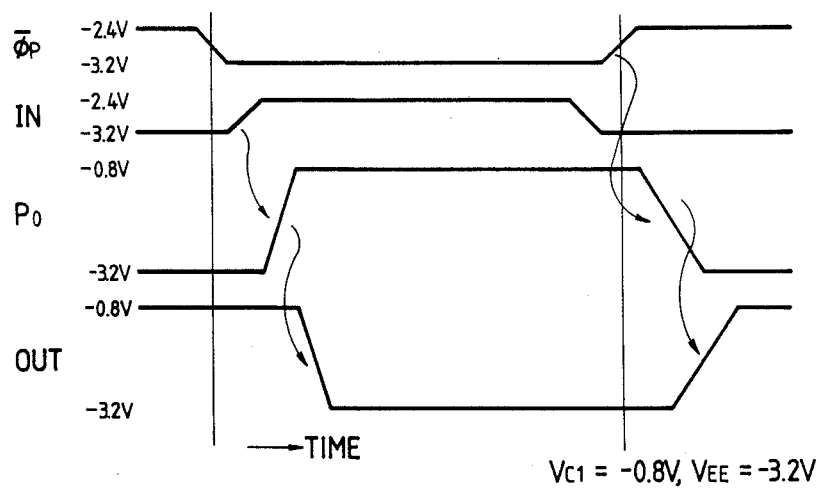
FIG. 15 is a diagram for explaining the operation of FIG. 14.

FIG. 15 illustrates the operation of the circuit of FIG. 14B. First, the precharge signal $\overline{\phi_P}$ is $-2.4$ V, the input signal IN is $-3.2$ V, the MOS transistor $M_1$ is turned off, the MOS transistor $M_2$ is turned on, and the node PO is precharged to $-3.2$ V and the output OUT is $-0.8$ V. Since the output OUT is $-0.8$ V, the transistor $M_7$ in FIG. 14B is turned on. Then, when the precharge signal $\overline{\phi_P}$ changes from $-2.4$ V into $-3.2$ V and the input signal IN changes from $-3.2$ V into $-2.4$ V, $M_2$ is turned off, $M_1$ is turned on, the current mirror circuit is turned on, and the node PO is charged to $-0.8$ V at a high speed. Then, OUT is discharged to $-3.2$ V. The transistor $M_7$ is turned off at a moment (b) when OUT is discharged to $-3.2$ V, and the current no longer flows into $M_1$ and $M_3$. Next, as $\overline{\phi_P}$ changes from $-3.2$ V into $-2.4$ V and IN changes from $-2.4$ V into $-3.2$ V, $M_2$ is turned on, $M_1$ is turned off, the current mirror circuit is turned off, and the node PO is precharged again to $-3.2$ V, and OUT is charged to $-0.8$ V. Therefore, $M_7$ of (b) is turned on again.

According to the aforementioned embodiments of the present invention shown in FIGS. 11A, 11B, 14A and 14B, a circuit can be constituted that generates an output signal having a large amplitude from input signals having small amplitudes at a high speed and that features a large driving capability. The input signals IN and $\phi_P$ having small amplitudes may be independently generated maintaining such a relationship that the input signal $\phi_P$ precedes the input signal IN under the set condition and the input signal IN precedes the input signal $\phi_P$ under the reset condition as shown in FIG. 12 or 15, or they may be output of another inverter circuit, respectively.

Figure 16A:
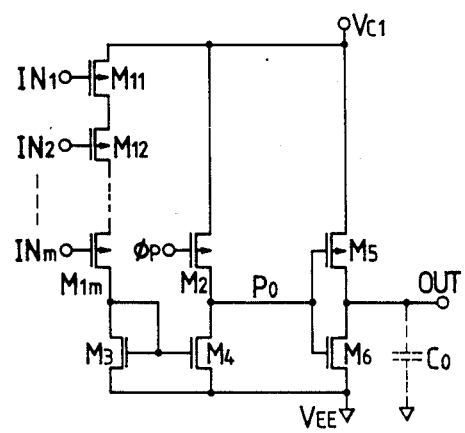
FIGS. 16A and 16B are diagrams showing embodiments of FIGS. 11 and 14 but which are modified to receive many inputs.
Figure 16B:
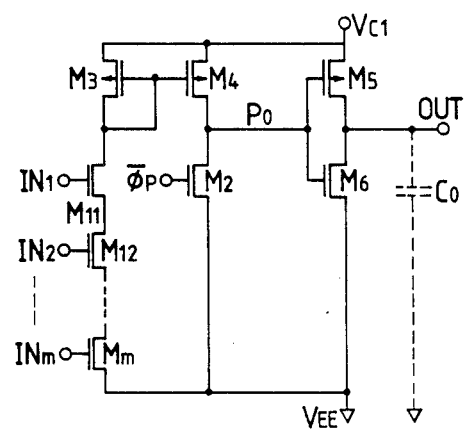

FIGS. 16A and 16B illustrate embodiments in which the embodiments of FIGS. 11A, 11B, 14A and 14B are adapted to a logic circuit. FIG. 16A corresponds to FIGS. 11A, 11B and FIG. 16B corresponds to FIGS. 14A, 14B. Relationships of the supply voltage and the input signal voltage of FIGS. 16A and 16B are the same as those of FIGS. 11A, 11B and FIGS. 14A, 14B. In FIGS. 16A and 16B, the MOS transistors $M_{11}$ to $M_{1m}$ connected in series obtain a logic of input signals $IN_1$ to $IN_m$ of small amplitudes, and the current mirror circuit converts the level. The feature of this embodiment resides in that a logic is obtained from the input signals of small amplitudes and the result is subjected to the level conversion to drive the output maintaining a large amplitude at a high speed. Like the transistor $M_7$ of FIG. 11B or 14B, a MOST may be inserted in series with the MOST's $M_{11}$ to $M_{1m}$ that are connected in series, in order to decrease the current consumption.

Figure 17:
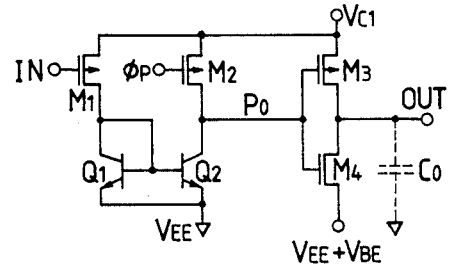
FIG. 17 is a diagram of an embodiment in which the current mirror circuit of FIG. 11 is constituted by bipolar transistors.

FIG. 17 is an embodiment in which a current mirror circuit is constituted by using bipolar transistors. Since the node PO assumes a low-level potential, i.e., $V_{EE}+V_{BE}$, the source potential of $M_4$ is set to $V_{EE}+V_{BE}$. The currents flowing into the bipolar transistors $Q_2$ and $Q_1$ vary in proportion to their emitter areas. According to this embodiment, the level can be converted at a further increased speed owing to a high current driving capability of the bipolar transistors.

Figure 18A:
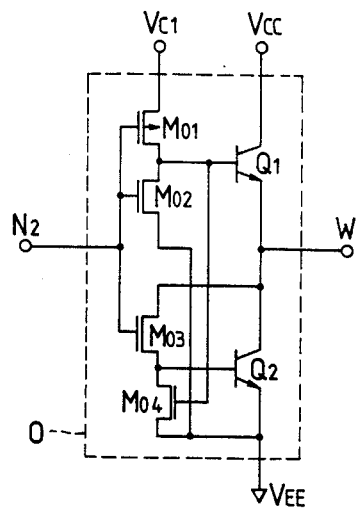
FIGS. 18A and 18B are diagrams illustrating other constitutions of the block O of FIG. 4.
Figure 18B:
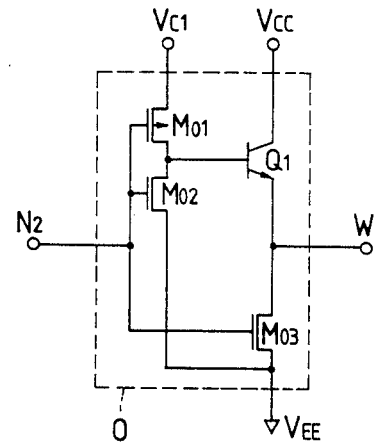

If the CMOS inverter operation voltage ($V_{C1}-V_{EE}$) is greater than 3.0 V in the circuit block O that drives the output W in FIG. 4 and that drives the output OUT in FIGS. 11A, 11B, 14A, 14B, 16A and 16B, it is allowed to use a BiCMOS driver shown in FIGS. 18A and 18B instead of the CMOS inverters. When the above operation voltage is greater than 4.0 V, in particular, it is preferred to use the BiCMOS driver of FIG. 18A. This enables the output to be charged or discharged at a further increased speed owing to the high current driving capability of the BiCMOS driver.

Figure 19A:
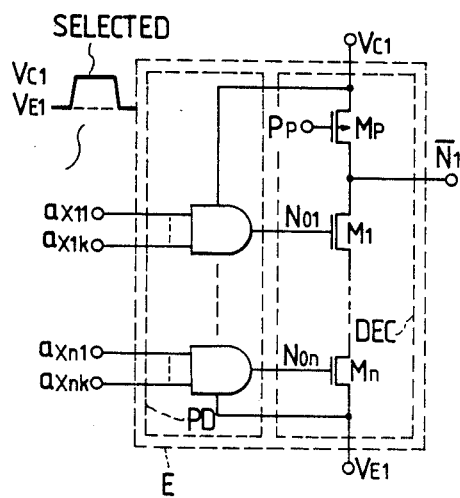
FIGS. 19A and 19B are diagrams illustrating the cases where a predecoder PD and a decoder DEC are used instead of the block E of FIG. 4.
Figure 19B:
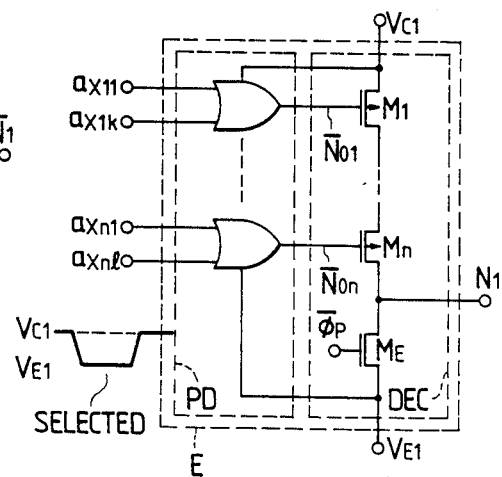

In the decoder circuits shown in FIGS. 4, 6, 8 and 10, $\overline{N_1}$ changes in many nonselected circuits when even one of the inputs $a_{x1}$ to $a_{xn}$ changes, but $\overline{N_1}$ does not change in one or in a small number of selected circuits. It is, however, also allowable to so constitute that $\overline{N_1}$ changes in one or in a small number of selected circuits but $\overline{N_1}$ does not change in many nonselected circuits. With this constitution, $\overline{N_1}$ changes in a small number of circuits only and the total current consumption can be decreased. This will now be described. FIGS. 19A and 19B illustrate basic embodiments of this method. Symbol PD denotes a predecoder and DEC denotes a decoder. They exhibit in combination the function of the blocks E of FIGS. 4, 6, 8, and 10. In the blocks E of FIGS. 4, 6, 8 and 10, the logical sum circuit is constituted using the MOST's $M_1$ to $M_n$ that are connected in parallel. In the DEC of FIG. 19A or 19B, on the other hand, a logical product circuit is constituted using MOST's $M_1$ to $M_n$ that are connected in series. Relationships of supply voltages $V_{CC}$, $V_{EE}$, $V_{C1}$, $V_{E1}$ and input signals $a_{xde}$ (d=1 to n, e=1 to k) are the same as those of FIG. 5. The predecoder PD is necessary because of the reasons described below.

Considered below is the case where $a_{xde}$ (correspond to $a_{x1}$ to $a_{xn}$ in the block E of FIG. 4) are directly connected to the gates of the MOST's $M_1$ to $M_n$. For instance, when only one circuit is to be selected among 4096 circuits, the signals must be decoded from 12 address inputs. Even when two address inputs are decoded by $\overline{X_{ij}}$, the signals must be decoded from 10 address inputs. In the case of the block E of FIG. 4, the speed does not decrease even when 10 address inputs are treated since the MOST's $M_1$ to $M_n$ are connected in parallel. In the CED of FIG. 19A or 19B, however, the MOST's $M_1$ to $M_n$ are connected in series and the driving capability decreases strikingly when 10 of them are connected in series. The driving capability decreases further for the inputs having small amplitudes. In FIGS. 19A and 19B, therefore, the predecoder circuit PD is provided in a preceding stage in order to decrease the number of MOST's $M_1$ to $M_n$ that are connected in series. In FIG. 19A, the predecoder circuit PD is constituted by a plurality of AND circuits, and the decoder circuit DEC is constituted by a precharge circuit $M_P$ and the nMOST's $M_1$ to $M_n$ connected in series. The predecoder circuit have input signals $a_{xde}$ (d=1 to n, e=1 to·k) and output signals $N_{O1}$ to $N_{On}$ of the high level $V_{C1}$ and the low level $V_{E1}$. First, the input signals $a_{xde}$ all have the low level like those of FIG. 5 and remain at the low level or change from the low level into the high level in response to the external address signals when the chip enable signal $\overline{CE}$ changes from the high level into the low level. Upon receipt of these inputs, the predecoder PD produces the outputs $N_{Oi}$ (i=1 to n) of the high level only when all of the inputs have the high level. Only when these outputs $N_{Oi}$ all have the high level, the output $\overline{N_1}$ is discharged to $V_{E1}$. Therefore, the output $\overline{N_1}$ changes only when the inputs $a_{xde}$ (d=1 to n, e=1 to k) all have the high level. This embodiment is so constituted that a small number of outputs $N_1$ change but a large number of outputs $N_1$ do not change, making it possible to reduce the current consumption. The feature of this embodiment resides in that a decoder circuit is realized that consumes a reduced amount of current and that operates on a small amplitude. To the output $N_1$ is directly connected the circuit block I of FIG. 4. In the circuit of FIG. 19B, the DEC is constituted by a precharge MOS $M_E$ and pMOST's $M_1$ to $M_n$ that obtain a logical product, and the predecoder PD consists of an OR circuit. Unlike FIG. 19A, the inputs $a_{xde}$ are, first, all of the high level. When the chip enable signal $\overline{CE}$ changes from the high level into the low level, the inputs $a_{xde}$ remain at the high level or change from the high level into the low level depending upon the external addresses. An inverter may be put to the output $N_1$ and may be connected to the circuit block I of FIG. 3.

Figure 20A:
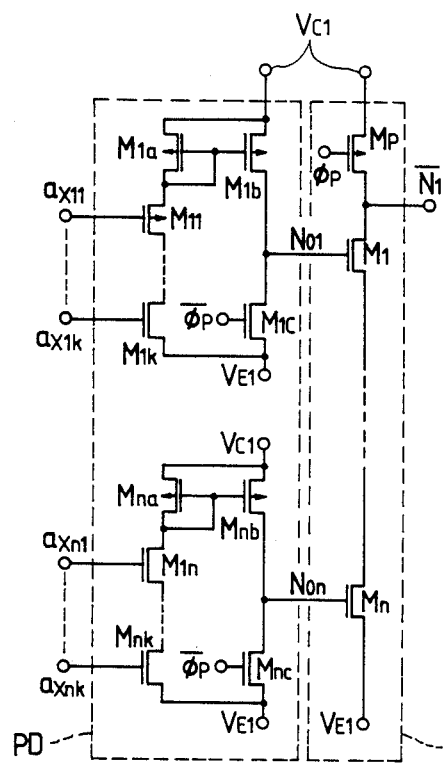
Figure 20B:
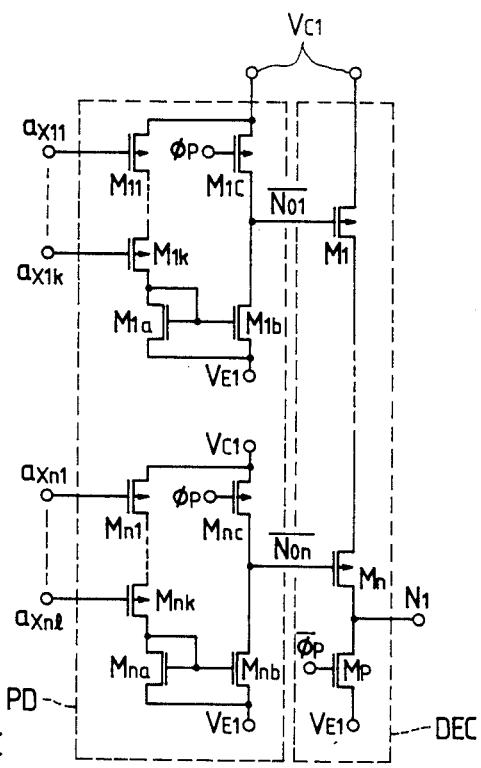

FIGS. 20A and 20B illustrate embodiments which concretely constitute the predecoder circuits PD of FIGS. 19A and 19B. FIG. 20A corresponds to FIG. 19A and FIG. 20B corresponds to FIG. 19B. In FIG. 20A, the predecoder circuit PD consists of an AND circuit of FIG. 16B in which the CMOS inverter of the final stage is omitted and $V_{EE}$ is replaced by $V_{E1}$. The current mirror circuit is turned on to electrically charge the output $N_{Oi}$ (i=1 to n) only when the precharge circuits $M_{1C}$ to $M_{nC}$ are turned off and the inputs $a_{xde}$ all assume the high level. The DEC is the same as the DEC of FIG. 19A. The feature of this embodiment is that the predecoder circuit is constituted by an AND circuit using a current mirror circuit and is operated at high speeds. In both the predecoder and the decoder circuits, furthermore, the electric currents are consumed by a small number of selected circuits only but the currents are not consumed by many nonselected circuits, enabling the current consumption to be decreased as a whole.

The predecoder circuit PD of FIG. 20B is constituted by the OR circuit of FIG. 16A but in which the CMOS inverter of the final stage is omitted and $V_{EE}$ is replaced by $V_{E1}$. The current mirror circuit is turned on to discharge the output $N_{Oi}$ only when the precharge circuits $M_{1C}$ to $M_{nC}$ are turned off and the inputs $a_{xde}$ all assume the low level in the AND circuits. The DEC operates in the same manner as the DEC of FIG. 19B. The feature of this embodiment resides in that the predecoder circuit is constituted by the OR circuit using a current mirror circuit and is operated at high speeds.

The present invention can be applied in a variety of ways and can particularly effectively be adapted to such semiconductor memory devices as a dynamic random access memory (DRAM) having a MOS memory cell array, a static random access memory (SRAM), a read-only memory (ROM), and the like. This is because these memories require signals of large amplitudes to drive the MOS memory cells, and the decoder circuits that are operated on inputs of small amplitudes make it easy to carry out the operation at high speeds, to lower the noise and to employ a low supply voltage. Described below is an embodiment in which the present invention is adapted to the DRAM.

Figure 21:
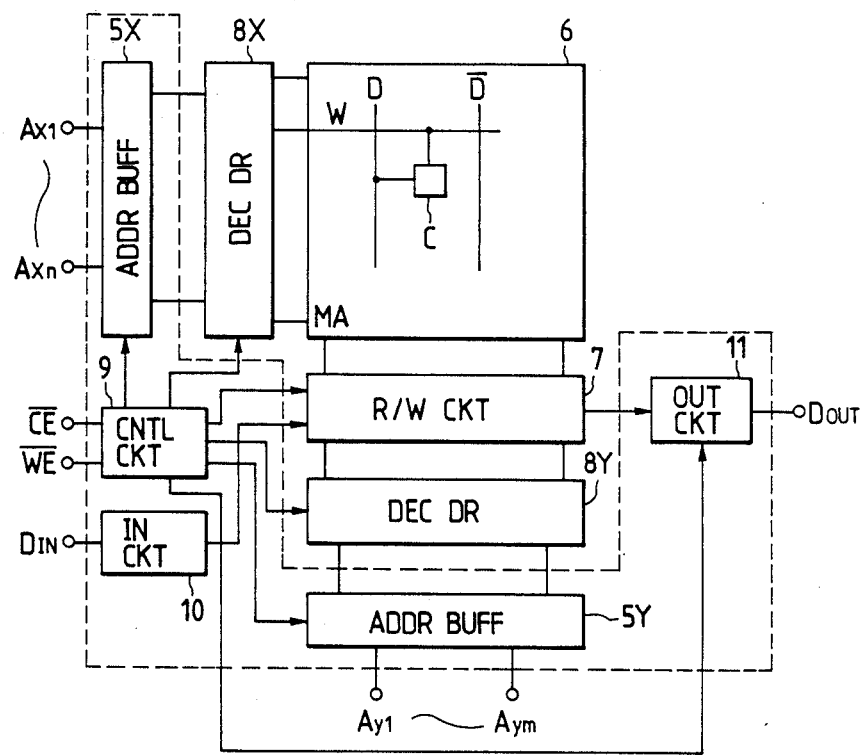
FIG. 21 is a block diagram of a semiconductor memory device.

FIG. 21 is a block diagram of a semiconductor memory device (DRAM, SRAM, ROM) having a MOS memory cell array, exemplifying a MOS memory cell array 6 of N×M bits and a group of peripheral circuits. In FIG. 21, the MOS memory cell array 6 has N word lines W and M pairs of data lines D, $\overline{D}$ that are arranged intersecting one another, and MOS memory cells C of a number of N×M are arranged at the intersecting points of the word lines and the data lines. Address buffers 5X and 5Y are served with address inputs $A_{xl}$ to $A_{xn}$ and $A_{yl}$ to $A_{ym}$, and send output signals to the decoder driver circuits 8X and 8Y. As required, a signal from a control circuit 9 is applied to 5X and 5Y. The word lines are driven by the decoder driver circuit 8X and the write/read circuit 7 is driven by the decoder driver circuit 8Y to write data onto the MOS memory cells C or to read data from the MOS memory cells C. Upon receipt of the chip enable signal $\overline{CE}$ and the write enable signal $\overline{WE}$, the control circuit 9 controls the decoder driver circuits 8X, 8Y, write/read circuit 7, input circuit 10, output circuit 11, and address buffers 5X and 5Y. The input circuit 10 generates, upon receipt of an input signal $D_{IN}$, a write data signal that is to be input to the write/read circuit 7. The output circuit 11 produces data read by the write/read circuit 7 to the terminal Dout. In FIG. 21, the X-system address inputs $A_{xl}$ to $A_{xn}$ and the Y-system address inputs $A_{yl}$ to $A_{ym}$ are input through separate input terminals. It is, however, also allowable to commonly use these input terminals to receive the inputs maintaining a time difference, i.e., to employ a so-called address multiplexing.

In dealing with such a semiconductor memory device according to the present invention, the signal amplitude is set to be, for example, 0.8 to 1.6 V for the peripheral circuits other than the peripheral circuits (decoder driver circuits 8X, 8Y) that directly control the MOS memory cells C which require signals of large amplitude, making it possible to accomplish both the high-speed operation and low-noise operation. The input/output circuit surrounded by a broken line in FIG. 21 is constituted by a current switch or a BiCMOS circuit that includes bipolar transistors. This makes it possible to operate the semiconductor memory device at a high speed yet suppressing the noise. Moreover, the present invention can be widely applied even to a circuit with mixed analog and digital functions and to an ASIC. As described above, the semiconductor memory device consists of a circuit group (corresponds to E of FIG. 4) that operates maintaining a small amplitude and a MOS memory cell array drive circuit (corresponds to block O of FIG. 4) that operates maintaining a large amplitude, and makes it necessary to operate at high speeds the circuit of small-amplitude signal and to decrease the current consumption thereof as well as to operate at high speeds the level converter circuit (corresponds to the block I of FIG. 4) that connects both of them and to decrease the current consumption thereof.

In order to realize the present invention, the chip should have a cross sectional structure as shown, for example, in FIGS. 7, 17 to 20 of Japanese Patent Laid-Open No. 119958/1987.

Figure 22:
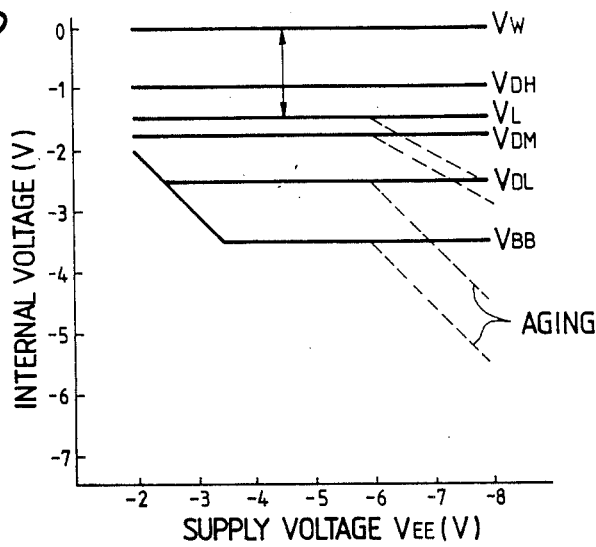
FIGS. 22 and 23 are diagrams showing two methods of setting relationships between the internal voltage of the DRAM and the supply voltage of an external unit.
Figure 23:
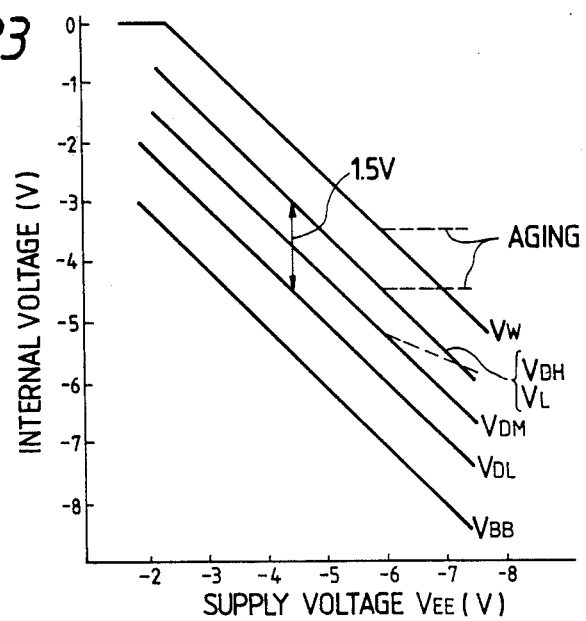

In adapting the present invention to the DRAM, described below, first, is a relationship between the internally generated voltage and the voltage applied from an external unit. A high supply voltage $V_{CC}$ (0 V for the ECL interface and, for example, 5 V for the TTL interface) and a low supply voltage $V_{EE}$ (for example, $-4.5$ V for the ECL interface and 0 V for the TTL interface) are applied from an external unit to the chip. Based on these supply voltages, the chip generates various internal voltages. Principal internal voltages include a voltage $V_L$ for peripheral circuits (peripheral circuit voltage), a substrate voltage $V_{BB}$, data line voltages (low level: $V_{DL}$, high level: $V_{DH}$), a data line precharge voltage $V_{DM}$, and word line high voltage $V_W$. The voltages $V_{C1}$, $V_{E1}$ and the like mentioned in the aforementioned embodiments are all denoted by $V_L$. From the standpoint of stable circuit operation, it is desired that the voltage differences among the internally generated voltages remain constant irrespective of changes in the supply voltages from the external unit except the case of when the supply voltages from the external unit are so low that the voltage converter circuit does not properly operate. In the ECL interface DRAM, in this case, there can be employed a method in which an internal voltage is set with $V_{CC}$ that is ground voltage as a reference as shown in FIG. 3A in order to maintain constant the internal voltage irrespective of a change of $V_{EE}$, and a method in which an internal voltage is set with $V_{EE}$ as a reference as shown in FIG. 3B in order to change the internal voltage depending upon a change of $V_{EE}$. Either method may be employed by taking into consideration the easiness for designing the voltage generating circuit, easiness for converting ECL into TTL, and the like. In the embodiments of DRAM of FIG. 28 and subsequent drawings, use is made of a method of setting voltage shown in FIG. 23. Voltage setting of FIG. 22 constitutes the DRAM internal voltage based on the idea of FIG. 3A and in which the word line voltage $V_W$ has the greatest value $V_{CC}$ ($=0$ V) and other voltages are determined based thereupon. On the other hand, the voltage setting of FIG. 23 corresponds to FIG. 3B wherein the data line voltage (low level) $V_{DL}$ is brought into agreement with the power source voltage $V_{EE}$ and other voltages are determined based thereupon. In FIGS. 22 and 23, the substrate voltage $V_{BB}$ is $V_{DL}-1$ V, the data line voltage (high level) $V_{DH}$ is $V_{DL}+1.5$ V (storage voltage of memory cell, 1.5 V), the word line voltage $V_W$ is $V_{DH}+1$ V, and the data line precharge voltage $V_{DM}$ is $(V_{DL}+V_{DH})/2$. Further, the peripheral circuit voltage $V_L$ is $V_{CC}-1.5$ V in FIG. 22 and is $V_{EE}+1.5$ V in FIG. 23, such that the peripheral circuits can be operated maintaining a predetermined amplitude of 1.5 V. In FIG. 22, $V_{BB}$ is set to be $V_{DL}-1$ V. In a circuit that directly uses $V_{EE}$ in the peripheral of the memory, however, the voltage $V_{BB}$ involves inconvenience. In such a case, the voltage $V_{BB}$ of FIG. 22 should be applied to the memory cell array and to the substrate of the sense amplifier and the voltage $V_{EE}$ or a voltage lower than this should be applied to the substrate of other peripheral circuits as disclosed in Japanese Patent Laid-Open No. 119958/1987. The solid lines in FIGS. 22 and 23 are intended to stably operate the whole chip while maintaining the voltage differences constant even in the regions where $|V_{EE}|$ is greater than 6 V. In some cases, however, it may become necessary to subject the integrated circuits to the aging test. In such a case, however, the data line amplitude and the peripheral circuit operation voltage should be increased in a region of great $|V_{EE}|$ in order to determine the presence of any failed element in the chip based on the operation test of large $|V_{EE}|$. When the method of setting the internally generated voltages to be dependent upon $V_{EE}$ shown in FIG. 23 is used in the TTL interface (with $V_{CC}=+5$ V as a center and apply $V_E=0$ V), the internally generated voltages become constant as viewed from $V_{EE}$.

Figure 24A:
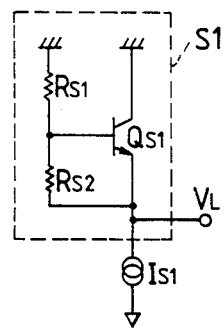
FIGS. 24A to 26 are diagrams which concretely illustrate the constitutions of an internal voltage generating circuit.

FIGS. 24A to 25C illustrate circuits for generating the voltage $V_L$ for the peripheral circuits. Among them, the circuits of FIGS. 24A to 24C generate the voltage $V_L$ of characteristics shown in FIG. 22 and the circuits of FIGS. 25A to 25C generate the voltage $V_L$ of characteristics shown in FIG. 23. In FIG. 24A, the voltage $V_L$ is $-(1+R_{S1}/R_{S2})\times B_{BE}$ and in FIG. 24B, the voltage $V_L$ is $-(1+R_{S1}/R_{S2})\times 2V_{BE}$.

Figure 24B:
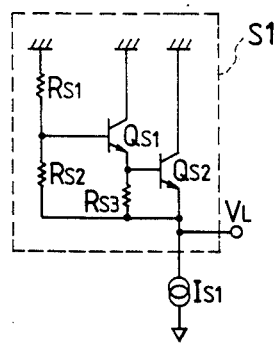
Figure 24C:
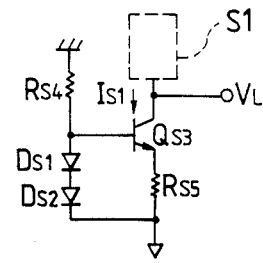
Figure 25A:
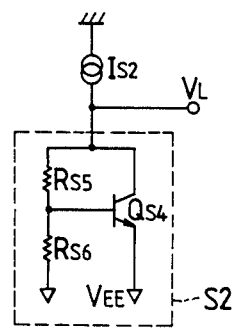
Figure 25B:
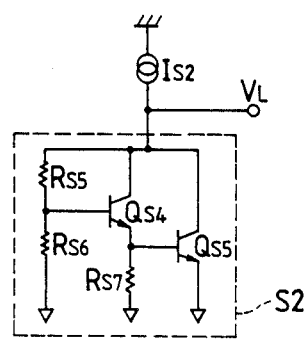
Figure 25C:
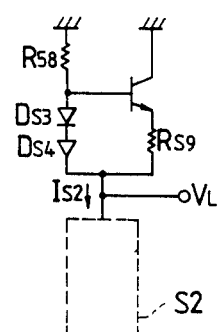

In FIGS. 24A and 24B, there is no dependency upon $V_{EE}$. In FIGS. 24A and 24B, the supply source $I_{S1}$ is constituted by a bipolar transistor, diodes and resistors as shown in FIG. 24C. The voltage $V_L$ is determined by $V_{BE}$ and a resistance ratio, and features a high precision and small dependency upon $V_{EE}$. The resistance ratio is changed to obtain the voltages $V_L$ of two or more values which are denoted by $V_{C1}$, $V_{E1}$ or $V_{E2}$ and are supplied to the CMOS circuits of FIGS. 4 to 19C so that these circuits produce output voltages of predetermined levels relative to GND and maintaining constant signal amplitudes. In FIG. 25A, $V_L=V_{EE}+(1+R_{S1}/R_{S2})\times V_{BE}$ and in FIG. 25B, $V_L=V_{EE}+(1+R_{S1}/R_{S2})\times 2V_{BE}$. In FIGS. 25A and 25B, the current supply $I_{S2}$ is constituted by a bipolar transistor, diodes and resistors as shown in FIG. 25C. The voltage $V_L$ is also determined by $V_{BE}$ and a resistance ratio; i.e., a predetermined voltage is generated maintaining a high precision relative to $V_{EE}$. The resistance ratio is changed to obtain the voltages $V_L$ of two or more values which are denoted by $V_{C1}$, $V_{E1}$ or $V_{E2}$ and are supplied to the CMOS circuits of FIGS. 4 to 19B so that these circuits produce output voltages of predetermined levels relative to $V_{EE}$ and maintaining predetermined signal amplitudes.

Figure 26:
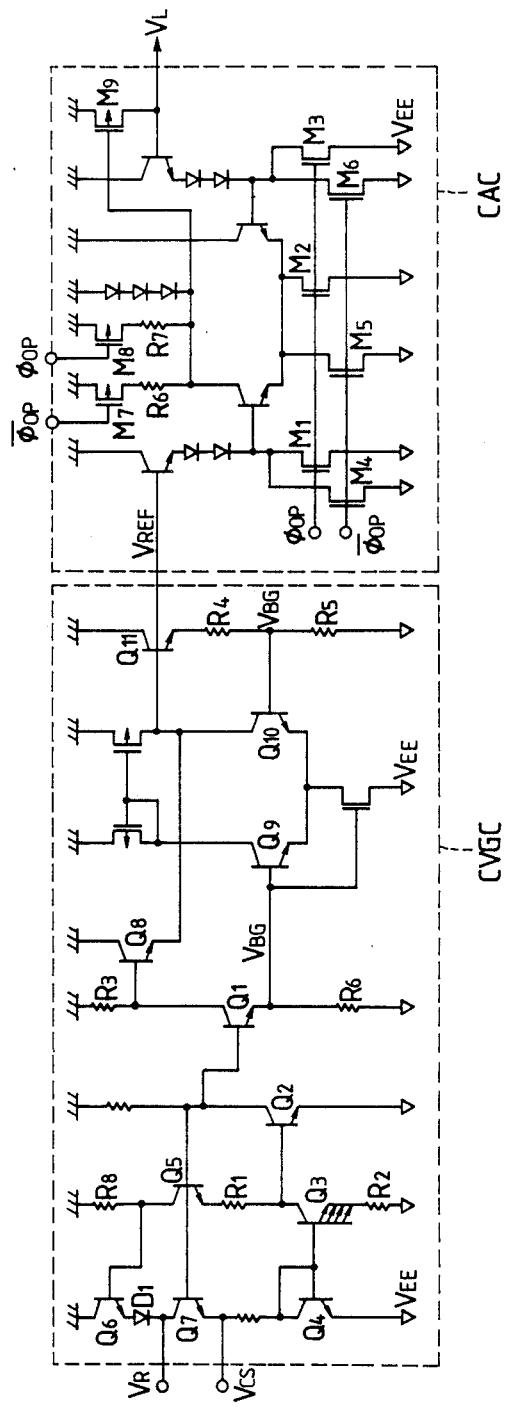

The voltage $V_L$ generating circuits of FIGS. 24A to 25C are simple in construction and are little dependent upon $V_{EE}$ but are dependent upon the temperature. This is because $V_{BE}$ has a negative temperature dependency ($-1.6$ mV/° C.). The voltage $V_L$ which is little dependent upon both the supply voltage ($V_{EE}$) and the temperature can be generated by using a bipolar band-gap generator. FIG. 26 shows a voltage $V_L$ generating circuit which is obtained by modifying the circuit for TTL disclosed in detail in Japanese Patent Application No. 123797/1987 to be adapted to the ECL in accordance with the method of FIG. 2. Reference voltages $V_R$ and $V_{CS}$ for the ECL input/output circuits are also obtained in addition to the voltage $V_L$. The voltage $V_L$ should be used as $V_{C1}$ or $V_{C2}$ in the embodiments of FIGS. 4 to 19 or in the embodiments that will be described later. The voltage $V_L$ cannot be used as $V_{E1}$. This is because $V_L$ of FIG. 26 is capable of supplying a current but is not capable of absorbing the current. If the voltage $V_L$ is supplied as $V_{C1}$ for the CMOS circuits, the output voltage of these circuits assume $V_{C1}$ (high) or $V_{EE}$ (low) and the signal amplitude (high—low) becomes constant independently of $V_{EE}$ or the temperature. The reference voltage $V_R$ is used for the ECL input current switch as will be described in the subsequent embodiments. The current supply control voltage $V_{CS}$ is used for the ECL output current switch as will be described in the subsequent embodiments. Described below are the operations of a constant-voltage generating circuit CVGC and a current amplifier circuit CAC of FIG. 26. The constant-voltage generating circuit CVGC is constituted by using a so-called band-gap generator, and generates voltages $V_{REF}$, $V_R$ and $V_{CS}$ from the external supply voltages GND and $V_{EE}$. In this embodiment, the output voltage $V_{REF}$ can be set to any value depending upon a ratio of $R_4$ and $R_5$. The current amplifier circuit CAC generates a voltage $V_L$ that is equal to the voltage $V_{REF}$. Owing to the provision of the current amplifier circuit CAC using bipolar transistors, a large current supplying capability is obtained from $V_L$. Moreover, the output voltage $V_L$ can be percisely maintained to be equal to $V_{REF}$ even when the load current quickly changes with the lapse of time. It may often be desired to obtain $V_L$ of two or more values such as $V_{C1}$ and $V_{C2}$. In such a case, there should be provided two or more sets of the $V_{REF}$ generating circuit and the current amplifier circuit having dissimilar $R_4$ to $R_5$ ratios. The $V_{BG}$ generating circuit can be commonly used. The voltages $V_{BG}$, $V_{REF}$, $V_R$ and $V_{CS}$ are expressed as follows:

$$V_{BG} \approx V_{EE} + \{V_{BE} + kT.\ln\gamma.R_1/q.R_2\} \quad (1)$$

$$V_{REF} \approx V_{EE} + (V_{BG} - V_{EE}).(R_4 + R_5)/R_5 + V_{BE} \quad (2)$$

$$V_R \approx -2V_{BE} - kT.\ln\gamma.R_8/q.R_2 \quad (3)$$

$$V_{cs} \approx V_{EE} + \{V_{BE} + kT.\ln\gamma.R_1/q.R_2\} \quad (4)$$

where k denotes the Boltzmann's factor, T denotes the absolute temperature, q is the electron charge, $V_{BEi}$ represents a base-emitter forward voltage of Qi, and $\gamma$ represents a ratio of emitter current densities of $Q_4$ and $Q_3$ and which can be adjusted depending on the emitter areas of $Q_4$ and $Q_3$.

For the purpose of easy explanation, here, $V_{BE1}$, $V_{BE2}$, $V_{BE5}$, $V_{BE6}$ and $V_{BE7}$ are all equal to $V_{BE}$. In practice, this can be realized by making the emitter current densities to be equal to each other. As is well known, this circuit is called a band-gap generator since its temperature coefficient becomes zero as $V_{BG} - V_{EE}$, $V_{CS} - V_{EE}$ and $|V_R|$ approach the band gap voltage (1.2 V) of silicon.

The above circuit makes the voltage $V_{REF} - V_{EE}$ constant even when the external supply voltage $V_{EE}$ becomes excessive, and whereby fine MOSTs are protected from the destruction in the circuit groups in the chip. This, on the other hand, may not be necessarily adapted to being subjected to the aging test. Therefore, $R_3$ and $Q_8$ are added so that in case the external supply voltage $V_{EE}$ becomes excessive, the voltage $V_{REF} - V_{EE}$ increases with the decrease in $V_{EE}$. In the current amplifier circuit of FIG. 26 which uses bipolar transistors, a feedback is applied to the gate voltage of $M_9$ even when the output $V_L$ undergoes a change, so that $V_L$ becomes equal to $V_{REF}$. Symbols $\phi_{OP}$ and $\overline{\phi_{OP}}$ denote signals for switching the chip into the stand-by mode and the operation mode; the switching is accomplished being interlocked to the operation current of the differential amplifier and the load resistance. This is to operate the circuit at a high speed with a large current when it is to be operated ($\phi_{OP}$: high, $\overline{\phi_{OP}}$: low) and to suppress the current during the stand-by state ($\phi_{OP}$: low, $\overline{\phi_{OP}}$: high). Here, symbols $M_1$, $M_2$ and $M_3$ denote nMOSTs having a large W/L, symbols $M_4$, $M_5$ and $M_6$ denote nMOSTs having a small W/L (L: gate length, W: gate width), $R_6$ denotes a small resistance and $R_7$ denotes a large resistance.

Figure 27A:
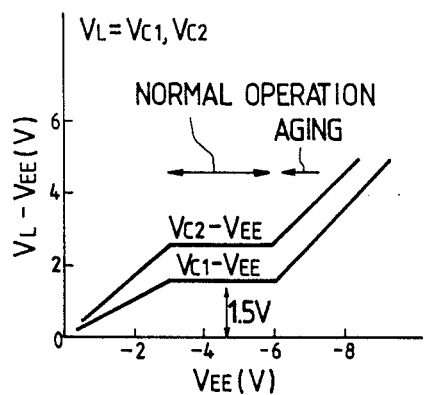
FIGS. 27A to 27C illustrate the dependency of the voltage generated by the circuit of FIG. 26 upon the supply voltage.
Figure 27B:
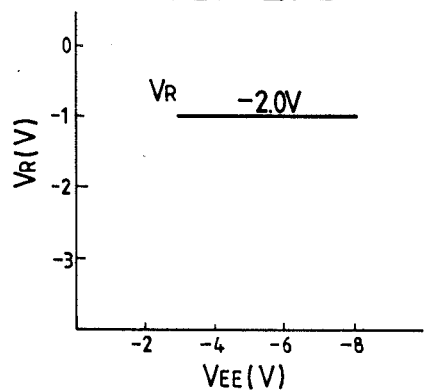
Figure 27C:
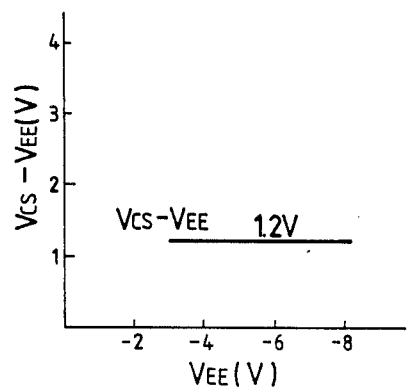

FIGS. 27A to 27C show dependency of outputs $V_L - V_{EE}$, $V_R$ and $V_{CS} - V_{EE}$ of the circuit of FIG. 26 described above upon $V_{EE}$. In FIG. 27A, $V_{C1}$ and $V_{C2}$ are shown as $V_L$. The output $V_L - V_{EE}$ remains constant in a normal operation range ($-3V > V_{EE} > -6$ V). In the aging resion, $V_{EE}$ is smaller than $-6$ V and $V_L - V_{EE}$ increases with the increase in $|V_{EE}|$. On the other hand, $V_R$ and $V_{CS} - V_{EE}$ remain constant when $V_{EE}$ is smaller than $-3$ V. When $V_{EE}$ is greater than $-3$ V, the band-gap generator does not operate normally. Furthermore, though not diagramed, the temperature dependency can be decreased to almost zero utilizing the features of the band-gap generator.

Figure 28:
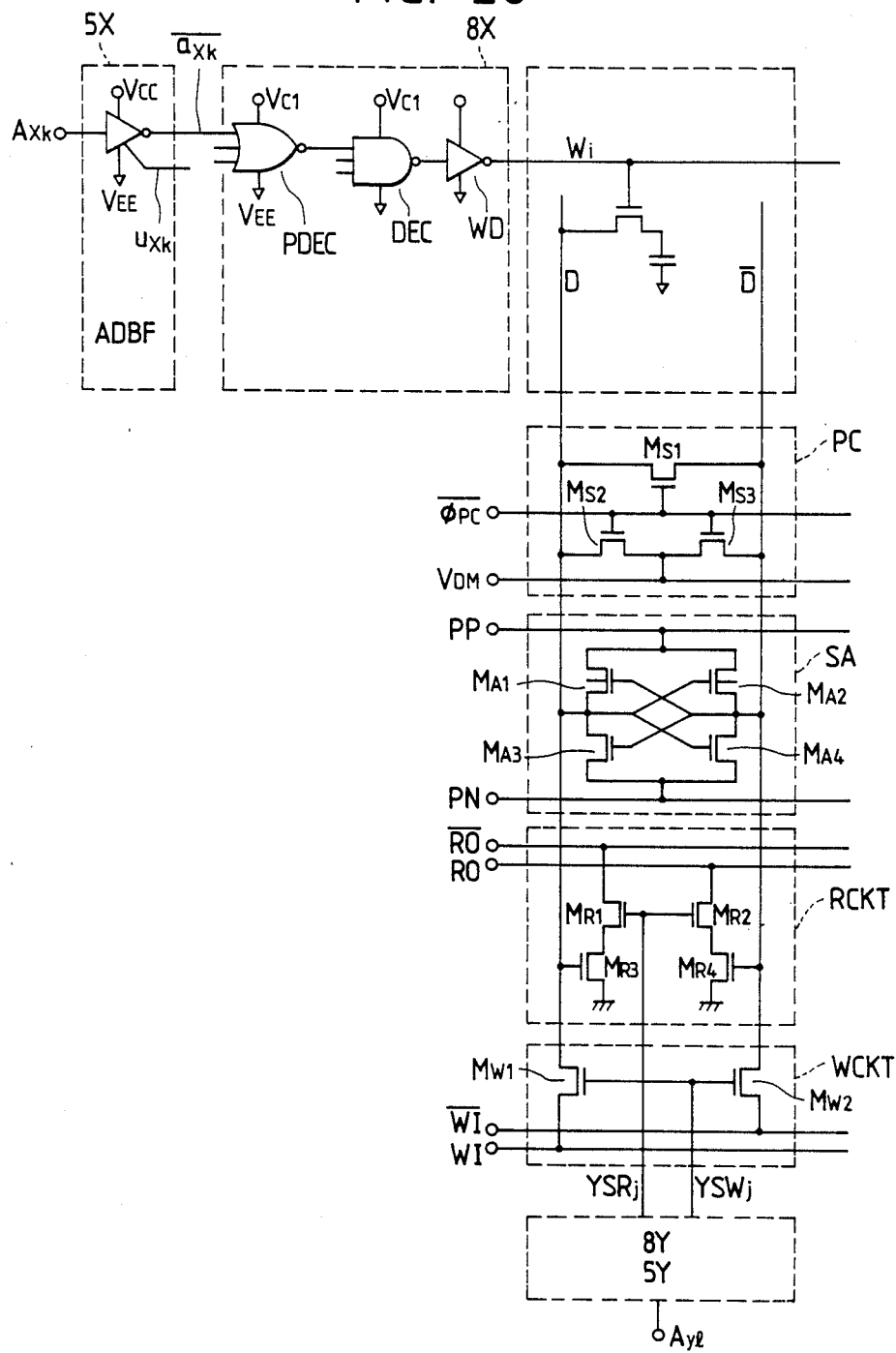
FIG. 28 illustrates an embodiment in which a DRAM is constituted according to the present invention.

FIG. 28 illustrates an embodiment in which the memory cell array of the DRAM and the read/write circuits are concretely constituted. The read/write system shown here serves as a basis for the subsequent embodiments of DRAM. FIG. 28 simply illustrates an address buffer 5X (ADBF) and an X-decoder word driver 8X (predecoder PDEC, decoder DEC, word driver WD) in addition to principal portions of DRAM that correspond to the blocks 6 and 7 of FIG. 21. The memory cell array consists of well-known dynamic memory cells each using a transistor and a capacitor, and further consists of a precharge circuit PC constituted by MOS transistors, a sense amplifier SA, a read circuit RCKT and a write circuit WCKT. The feature of this constitution resides in that the read circuit is isolated from the write circuit. When one of the word lines W is driven to a high potential, a small read voltage appears on a data line (either D or $\overline{D}$) from a memory cell that is connected to the above word line. This is amplified by the sense amplifier for each of the pairs of data lines and is rewritten onto the memory cell. The reading operation is carried out by the read circuit in parallel therewith.

The read circuit RCKT is a differential amplifier that converts a small voltage signal that is read out of the data line into a current signal, and is constituted by four MOSTs $M_{R1}$, $M_{R2}$, $M_{R3}$ and $M_{R4}$. The gates of $M_{R3}$ and $M_{R4}$ are connected to the data lines and the gates of $M_{R1}$ and $M_{R2}$ are connected to the Y-system drive circuit output $YSR_j$. A current flows into the read circuit only in which $YSR_j$ has a high level, and a current signal appears on the output line. The write circuit consists of MOS transistors $M_{W1}$ and $M_{W2}$ that connect the write data input lines WI, $\overline{WI}$ to the data lines D, $\overline{D}$. FIG. 28 illustrates only one memory cell, one sense amplifier and one pair of D, D. In practice, however, when, for example, a 4-megabit device is to be constituted using 4096 word lines × 1024 pairs of data lines, there exist 1024 pairs of Ds and $\overline{D}$s, 4194304 memory cells, and the sense amplifier SA is provided for each of the pairs of data lines.

Figure 29:
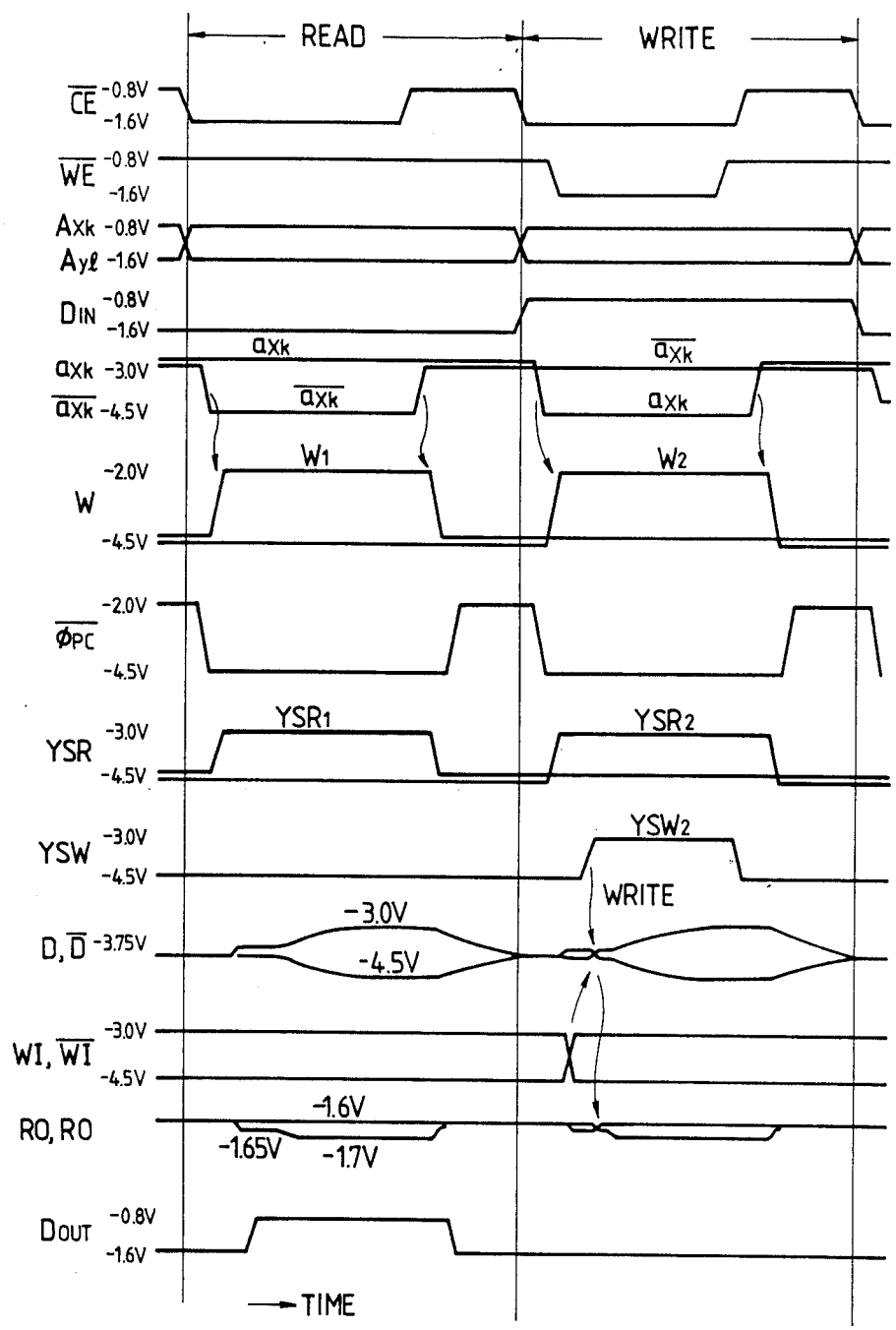
FIG. 29 is a diagram explaining the reading and writing operations of FIG. 28.

The reading and writing operations of the embodiment of FIG. 28 will now be described in conjunction with FIG. 29. Presuming here the ECL interface, described below is the case of when $V_{CC}=0$ V, $V_{EE}=-4.5$ V, and $V_{C1}=-3.0$ V. Further, the data line amplitude is 1.5 V, the low level is $-4.5$ V which is in agreement with $V_{EE}$, and the high level is $-3.0$ V. The word line signal voltage is $-4.5$ V ($V_{EE}$) when not selected and is $-2.0$ V when selected. First, described below is the operation of read cycle. At first, the chip enable signal $\overline{CE}$ has the high level $-0.8$ V and the chip is under the stand-by state. At this moment, the signals $a_{xk}$, $a_{xk}$ are fixed to the high level, i.e., $-3.0$ V, irrespective of the external address input signal $A_{xk}$, and the word line $W_i$ and the column select signal lines $YSR_j$ and $YSW_j$ are all the nonselected low level. Here, the signal $\overline{\phi_{PC}}$ has the high level, and the data lines D, D are precharged to an intermediate voltage of $-3.75$ V. The output $D_{OUT}$ has the low level of $-1.6$ V. Next, as the chip enable signal $\overline{CE}$ changes from the high level of $-0.8$ V to the low level of $-1.6$ V, the chip is put in operation. The signal $\phi_{PC}$ assumes the low level. The signals $a_{xk}$, $a_{xk}$ change due to external address input signals $A_{xk}$, $A_{yl}$ at that moment, and some of $W_i$ and $YSR_j$ (i = 1 to 4096, j = 1 to 1024) change from $-4.5$ V to the high level. As the word line $W_i$ assumes the high level of $-2.0$ V, the transistor of a memory cell connected to the word line is turned on, and a small signal voltage generates on the data line as shown in FIG. 29. Among the read circuits to which the pairs of data lines are connected, a current signal is obtained from the one that has $YSR_j$ of the high level and is sent to the output circuit. If the output circuit has a high sensitivity as will be described later, the output signal is generated on the output $D_{OUT}$ without the need of amplifying the data line signal by the CMOS sense amplifier. In parallel with the reading operation, small signal voltages of all data lines are differentially amplified by the CMOS sense amplifiers to the high level of $-3.0$ V and the low level of $-4.5$ V irrespective of whether the read circuits are selected by $YSR_j$ or not. At this moment, the word line $W_i$ is still assuming $-2.0$ V, and the data same as the one that is read out is written again onto the memory cell. In the read cycle, WE has the high level of $-0.8$ V and $YSR_j$ has the low level, so that the write circuit does not operate. As the chip enable signal $\overline{CE}$ changes again from the low level of $-1.6$ V to the high level of $-0.8$ V, the word lines $W_i$ and the outputs $YSR_j$ all assume the low level of $-4.5$ V. Further, the data lines D, $\overline{D}$ are both precharged to $-3.75$ V and $D_{OUT}$ assumes $-1.6$ V.

Next, in the write cycle, the initial condition is the same as the read cycle, but $\overline{WE}$ changes from the high level of $-0.8$ V to the low level of $-1.6$ V. Like in the read cycle, only one of $W_i$ and only one of $YSR_j$ assume the high level, respectively, and $YSR_j$ change from $-4.5$ V into $-3.0$ V and $M_{W1}$ and $M_{W2}$ are turned on. Therefore, the write data signals WI, $\overline{WI}$ are transmitted to the selected pairs of data lines and the data are written onto the selected memory cells. The data same as the initial ones are rewritten by the CMOS sense amplifies onto the memory cells that correspond to the non-selected $YSW_j$. When the signals $\overline{CE}$, $\overline{WE}$ change again from the low level ($-1.6$ V) to the high level ($-0.8$ V), the memory cells become all nonselected and the write circuit is turned off. Further, the precharge circuit starts its operation and the data lines D and $\overline{D}$ are both precharged to $-3.75$ V.

The circuits of FIGS. 4, 6, 8 and 10 can be used for the decoder and the word driver 8X of FIG. 28. Further described below are preferred embodiments of the decoder and word driver in the DRAM.

Figure 30:
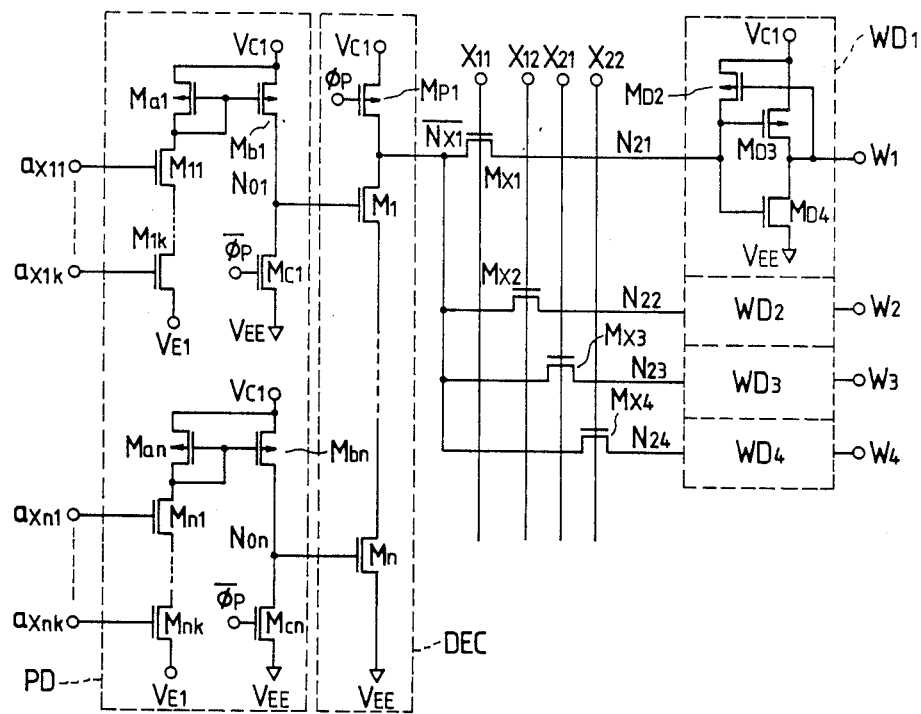
FIG. 30 is a diagram illustrating a constitution of the decoder and the driver of DRAM.
Figure 31:
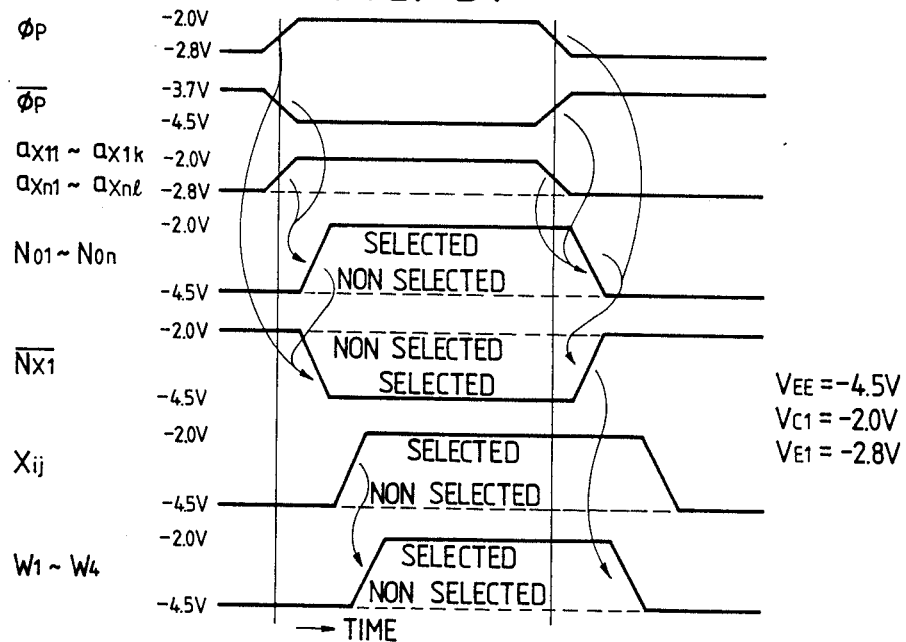
FIG. 31 is a diagram which explains the operation of FIG. 30.

FIG. 30 illustrates an embodiment of a circuit in which the level is converted by the predecoder PD and the decoder is operated maintaining a large amplitude ($=V_{C1}-V_{EE}$) same as that of the word lines. Symbol PD denotes a predecoder circuit constituted by current mirror circuits, and effects the predecoding of the AND logic and the level conversion at the same time. Symbol DEC denotes a decoder circuit which is constituted in the same manner as the DEC of FIG. 19A but which uses $V_{EE}$ instead of $V_{E1}$ used in FIG. 19A. Four word drivers are controlled by the output $\overline{N_{x1}}$ of a single DEC. Symbols $WD_1$ to $WD_4$ denote word drivers that are constituted in the same manner as the block O of FIG. 4. Symbols $M_{x1}$ to $M_{x4}$ denote nMOSTs that work as switches for connecting the output $\overline{N_{x1}}$ of DEC to the inputs of $WD_1$ to $WD_4$. Signals $a_{xde}$ (d = 1 to n, e = 1 to k), $\phi_p$ and $\overline{\phi_p}$ have small amplitudes and signals $X_{ij}$ ($X_{11}$ to $X_{22}$) have large amplitudes equal to the amplitude of the signal W. These signals are generated from the external address signals and $\overline{CE}$. The feature of this embodiment resides in that the decoding is effected at high speeds using current mirror circuits to obtain signals of large amplitudes from the signals $a_{xde}$ of small amplitudes. The operation of this circuit will be described with reference to FIG. 31, where it is presumed that $V_{C1}=-2.0$ V, $V_{E1}=-2.8$ V, and $V_{EE}=-4.5$ V. In the predecoder circuit PD, the signal $\overline{\phi_p}$ is first $-3.7$ V, the signals $a_{xde}$ are all $-2.8$ V, the transistors $M_{l1}$ to $M_{lk}$ and $M_{n1}$ to $M_{nk}$ are turned off, and the transistors $M_{C1}$ to $M_{Cn}$ are turned on. For this purpose, $N_{O1}$ to $N_{On}$ are precharged to $-4.5$ V. In the DEC, since $N_{O1}$ to $N_{On}$ are $-4.5$ V, $M_1$ to $M_n$ are turned off; and since $\phi_p$ is $-2.8$ V, $M_{P1}$ is turned on. The output $\overline{N_{x1}}$ is precharged at $-2.0$ V. The signal $X_{ij}$ fed to the gate of $M_{ij}$ is $-4.5$ V, so that $M_{ij}$ is turned off. In the word drivers $WD_1$ to $WD_4$, $N_{21}$ to $N_{24}$ are $-2.5$ V and $W_1$ to $W_4$ are $-4.5$ V. Next, when CE changes from the high level into the low level, the signals $\phi_p$ and $\overline{\phi_p}$ are inverted, whereby the precharge circuit is turned off and the signals $a_{xde}$ remain at $-2.8$ V or assume $-2.0$ V depending upon the external address signals. The current mirror circuits are turned on only when the input signals $a_{xde}$ are all $-2.0$ V in the transistors $M_{l1}$ to $M_{lk}$ and $M_{n1}$ to $M_{nk}$, and the nodes $N_{Oi}$ (i = 1 to n) are charged at $-0.8$ V (selection state). Only when all of the nodes $N_{Oi}$ are charged, the output $\overline{N_{x1}}$ is discharged (selection state). When the input signal $X_{1l}$ assumes $-2.0$ V under the condition where $\overline{N_{x1}}$ is discharged, the transistor $M_{x1}$ is turned on, the node $N_{21}$ is discharged to $-4.5$ V and the word line $W_1$ is charged to $-2.0$ V (selection state). As the chip enable signal $\overline{CE}$ changes from the low level into the high level, the signals $\phi_p$ and $\overline{\phi_p}$ are inverted again, whereby the precharging circuit is turned on, the signals $a_{xde}$ all assume $-2.8$ V, the nodes $N_{Oi}$ (i=1 to n) all assume $-4.5$ V, the transistors $M_l$ to $M_n$ are turned off, the output $\overline{N_{x1}}$ is precharged again to $-2.0$ V, and the node $N_{21}$ rises to $-2.0$ V-$V_{TH}$ ($M_{x1}$) and further rises to $-2.0$ V through the feedback MOS $M_{O3}$. Thereafter, $X_{ij}$ all assume $-4.5$ V and $M_{ij}$ are turned off. This causes all of the word lines $W_i$ to assume the low level of $-4.5$ V.

Figure 32:
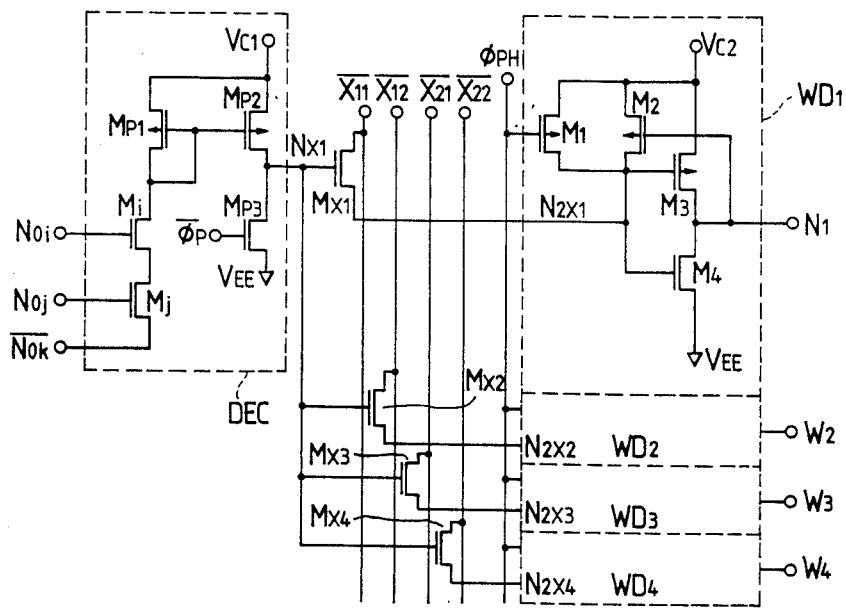
FIG. 32 is a diagram illustrating another constitution of the decoder and the driver of DRAM.

FIG. 32 shows a circuit which decodes input signals $N_{Oi}$, $N_{Oj}$, $\overline{N_{Ok}}$ and $X_{ij}$ (i, j=1, 2) of a small amplitude (1.5 V) from the predecoder to generate the signals $W_i$ (i=1 to 4) of a large amplitude (2.5 V). The input signals of the small amplitude are the outputs of the low-voltage CMOS predecoders or the outputs $N_{Ol}$ to $N_{Om}$ of the predecoder PD of the current mirror constitution shown in FIG. 20. Compared with FIG. 30, the input signals $X_{ij}$ need have a small amplitude, and the drain drive helps decrease the parasitic capacity enabling the speed of operation to be increased. In the DEC, the nodes $N_{Oi}$, $N_{Oj}$ and $\overline{N_{Ok}}$ are connected to the gates or the sources of nMOSTs $M_i$, $M_j$ connected in series to obtain a logical product of $N_{Oi}$, $N_{Oj}$ and $\overline{N_{Ok}}$, and a current mirror circuit constituted by $M_{P1}$, $M_{P2}$ is driven by the result thereof. The transistor $M_{P3}$ is for precharging and its gate is controlled by $\overline{\phi_p}$. The output $N_{X1}$ of the current mirror circuit is connected to the gates of nMOST's $M_{X1}$ to $M_{X4}$. The drains of $M_{X1}$ to $M_{X4}$ are connected to the input signals $X_{ij}$ and the sources thereof are connected to $N_{2X1}$ to $N_{2X4}$. In the word driver $WD_1$, $N_{2X1}$ serves as an input to the CMOS inverter circuit that is constituted by $M_3$ and $M_4$. The CMOS inverter circuit drives $W_1$. Symbol $M_1$ denotes a precharge circuit controlled by $\phi_{PH}$, $M_2$ denotes a circuit which applies a weak feedback to the input $N_{2X}$ from the output $W_1$ of the CMOS inverter circuit to prevent erroneous operation. The sources of $M_1$, $M_2$ and $M_3$ are connected to the high voltage $V_{C2}$ for word lines and the source of $M_4$ is connected to $V_{EE}$.

Figure 33:
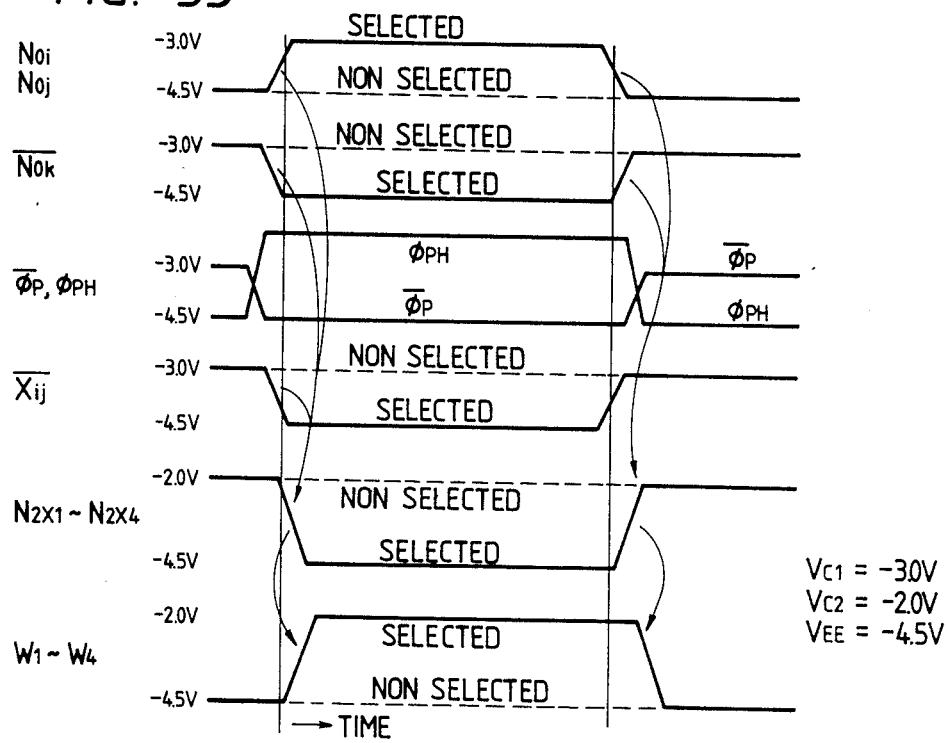
FIG. 33 is a diagram explaining the operation of FIG. 32.

The operation of FIG. 32 will now be described with reference to FIG. 33. This is the case where $V_{C2}=-2.0$ V, $V_{C1}=-3.0$ V, and $V_{EE}=-4.5$ V. First, the outputs $N_{Oi}$, $N_{Oj}$ of the predecoder circuits have the low level of $-4.5$ V, $\overline{N_{Ok}}$ has the high level of $-3.0$ V, and the current mirror circuit is turned off. Further, since $\overline{\phi_p}$ has the high level of $-3.0$ V, the output $N_{X1}$ of the current mirror circuit is precharged to $-4.5$ V, and $M_{X1}$ to $M_{X4}$ are turned off. The input signals $\overline{X_{ij}}$ all have the high level of $-3.0$ V. Further, since $M_1$ is turned on in the word drivers $WD_1$ to $WD_4$, the signals $N_{2X1}$ to $N_{2X4}$ are precharged to $-2.0$ V. Therefore, the outputs $W_1$ to $W_4$ are $-4.5$ V. Next, $\overline{\phi_p}$ and $\phi_{PH}$ are inverted so that the precharge circuit is turned off. Only when $N_{Oi}$ and $N_{Oj}$ have the high level and $\overline{N_{Ok}}$ have the low level, the current flows into $M_i$ and $M_j$, and the current mirror circuit is turned on. Only when the current mirror circuit is turned on and accordingly $N_{X1}$ is charged to $-3.0$ V and $\overline{X_{ij}}$ changes to $-4.5$ V, the signals $N_{2X1}$ to $N_{2X4}$ are discharged to $-4.5$ V and so the word lines $W_i$ are charged to $-2.0$ V. Again, $\overline{\phi_p}$ is inverted to the high level, $\phi_{PH}$ is inverted to the low level, $N_{Oi}$ and $N_{Oj}$ all assume the low level, and $\overline{N_{Ok}}$ all assume the high level. Then, the current mirror circuit is turned off, the precharge circuit is turned on, and $W_i$ all assume $-4.5$ V.

Figure 34:
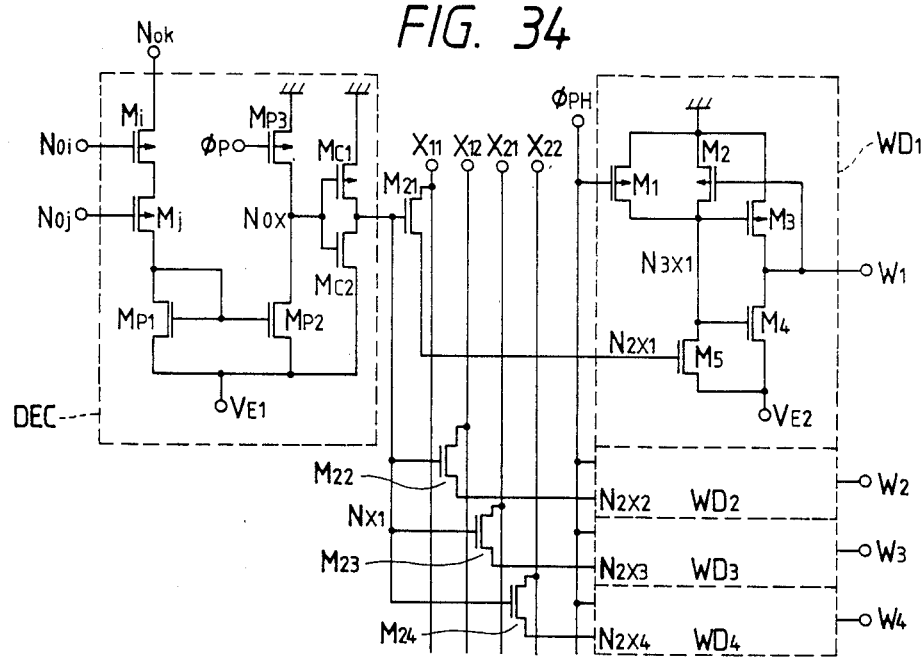
FIG. 34 is a diagram illustrating a further constitution of the decoder and the driver of DRAM.

FIG. 34 shows an embodiment in which the DEC of FIG. 32 is modified, the logical product is obtained by pMOSTs, and the current mirror circuit is constituted by nMOSTs. The feature resides in that use is made of pMOS decoders and that the input signal voltages are all based on $V_{CC}$ as a reference. In the DEC of FIG. 34, the signals $\overline{N_{Oi}}$, $\overline{N_{Oj}}$ and $N_{Ok}$ are connected to the gates or the sources of pMOSTs $M_i$, $M_j$ that are connected in series to obtain a logical product of $\overline{N_{Oi}}$, $\overline{N_{Oj}}$ and $N_{Ok}$. This result is used to drive the current mirror circuit which is constituted by nMOSTs $M_{P1}$, $M_{P2}$. The transistor $M_{P3}$ is for precharging and its gate is controlled by $\phi_p$. The output $N_{OX}$ of the current mirror circuit is input to the CMOS inverter circuit constituted by $M_{C1}$ and $M_{C2}$. The output $N_{X1}$ of DEC is connected to the gates of nMOSTs $M_{X1}$ to $M_{X4}$. The signals $X_{ij}$ are input to the sources of $M_{X1}$ to $M_{X4}$. The drains of $M_{X1}$ to $M_{X4}$ are connected to $N_{2X1}$ to $N_{2X4}$. The signal $N_{2X1}$ is connected to the gate of $M_5$ in the word driver $WD_1$. The transistors $M_3$ and $M_4$ constitute a CMOS inverter circuit to drive the word line $W_i$. Symbol $M_1$ denotes a precharging circuit controlled by $\phi_{PH}$, and $M_2$ denotes a circuit which applies a weak feedback to the input $N_{3X1}$ from the output $W_1$ of the CMOS inverter circuit in order to prevent erroneous operation. The sources of $M_1$, $M_2$ and $M_3$ are connected to $V_{CC}$ (GND), and the sources of $M_4$ and $M_5$ are connected to $V_{E2}$. The high level of the word line is equal to GND and the low level is equal to $V_{E2}$.

Figure 35:
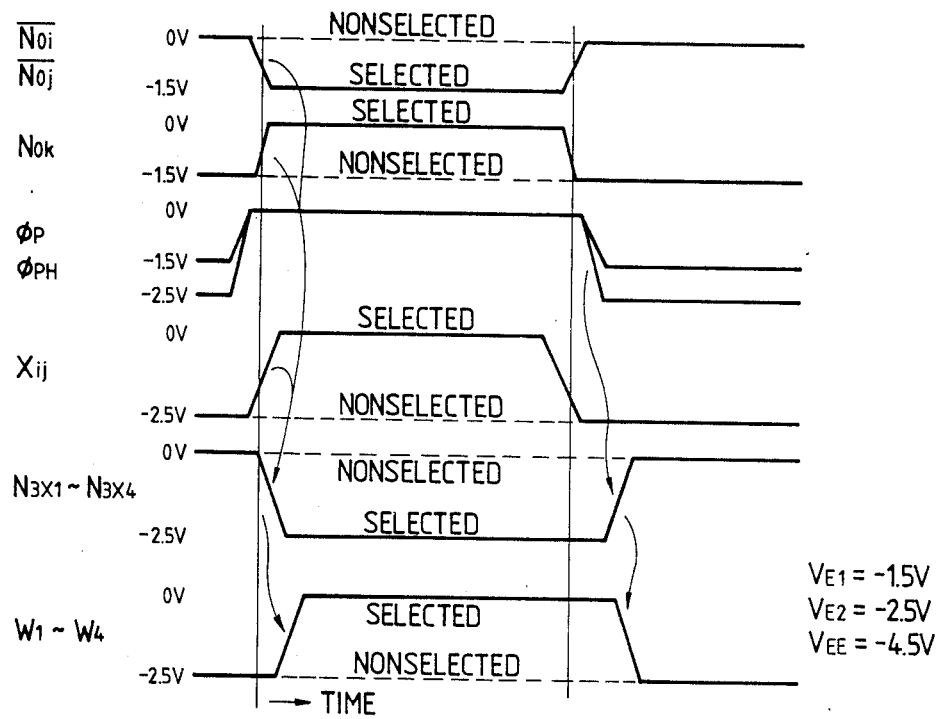
FIG. 35 is a diagram for explaining the operation of FIG. 34.

The operation of FIG. 34 will now be described with reference to FIG. 35. This is the case of when $V_{E1}=-1.5$ V, $V_{E2}=-2.5$ V and $V_{EE}=-4.5$ V. First, the outputs $\overline{N_{Oi}}$, $\overline{N_{Oj}}$ of the predecoder circuits have the high level of 0 V, $N_{Ok}$ has the low level of $-1.5$ V, and the current mirror circuit is turned off. Further, since $\phi_p$ has the low level of $-1.5$ V, the output $N_{Ox}$ of the current mirror circuit is precharged to 0 V. Due to the CMOS inverter circuit, therefore, $N_{X1}$ has the low level of $-1.5$ V. Accordingly, the transistors $M_{X1}$ to $M_{X4}$ are turned off. The signals $X_{ij}$ are all $-2.5$ V. The gate of $M_5$ is $-2.5$ V; i.e., $M_5$ is turned off. Further, since $M_1$ is turned on in the word driver $WD_1$, $N_{3X1}$ is precharged to 0 V. Therefore, $W_1$ assumes $-2.5$ V. Other word drivers $WD_2$ to $WD_4$ all produce $-2.5$ V. Then, $\phi_p$ and $\phi_{PH}$ are inverted and the precharge circuit is turned off. Only when $\overline{N_{Oi}}$, $\overline{N_{Oj}}$ have the low levels of $-1.5$ V and $N_{Ok}$ have the high level of 0 V, an electric current flows into $M_i$ and $M_j$, and the current mirror circuit is turned on. As the current mirror circuit is turned on, $N_{OX}$ is discharged to $-1.5$ V and $N_{1X}$ is charged to 0 V. Here, only when $N_{X1}$ is charged to 0 V and $X_{ij}$ changes into 0 V, the signal $N_{2X1}$ changes from $-2.5$ V into 0 V and the transistor $M_5$ in $WD_1$ is turned on. This causes the signal $N_{3X1}$ to be discharged to $-2.5$ V, and the output $W_1$ is charged to 0 V. Then, again, the signals $\phi_p$, $\phi_{PH}$ assume the low level, $N_{Oi}$ and $N_{Oj}$ all assume the high level, $N_{Ok}$ all assume the low level, and the signals $X_{ij}$ assume the low level. Therefore, the current mirror circuit and the transistor $M_5$ are turned off and the precharge MOS $M_1$ is turned on, so that the word lines $W_i$ all assume again the low level of $-2.5$ V.

In the foregoing description, the current mirror circuit was used for the predecoder or for the decoder. The current mirror circuit operates at high speeds but is often turned on in the cases where it should have been turned off in case the level of the current mirror drive signals ($a_{x1}$ to $a_{xn}$, $N_{Oi}$, $N_{Oj}$, $N_{Ok}$, $\phi_p$, $\overline{\phi_p}$, etc.) undergo a variation or the supply voltage in the chip undergoes a variation, causing the word lines and the column select signal lines to be selected in a multiplexed manner. In order to avoid such erroneous operations, the threshold voltage $V_{TH}$ of MOS transistors (e.g., $M_{1l}$ to $M_{1n}$, $M_{nl}$ to $M_{nk}$, $N_{C1}$, $M_{Cn}$ in FIG. 30, $M_i$, $M_j$, $M_{P3}$ in FIGS. 32 and 34) for switching the current mirror circuit should be set to be greater than the threshold voltage $V_{TH}$ of ordinary MOS transistors. For instance, when the ordinary MOS transistors have the threshold voltage $V_{TH}$ of 0.2 V, the threshold voltage of the above transistors should be as great as 0.4 V.

Figure 36:
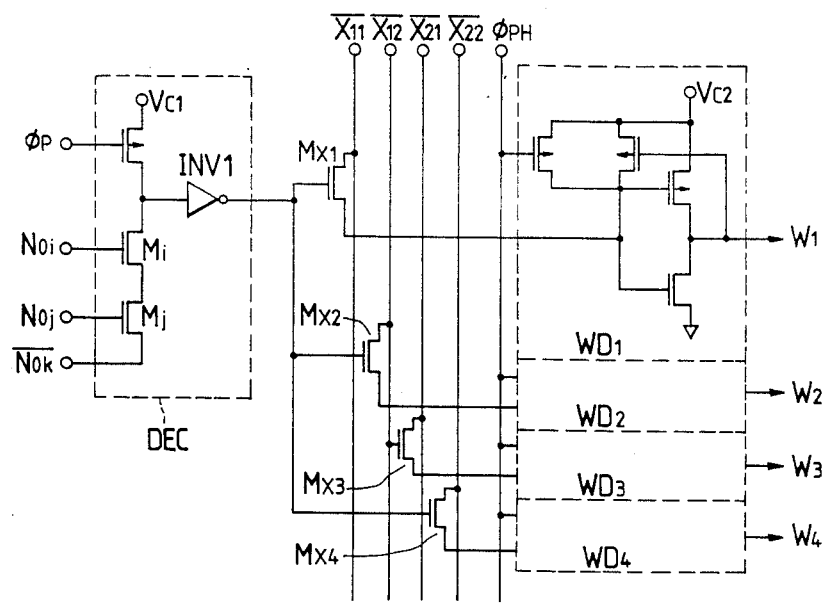
FIG. 36 is a diagram illustrating a still further constitution of the decoder and the driver of DRAM.

The basic embodiment of the present invention is shown in FIG. 1 and in which the current mirror circuit needs not be necessarily used for the predecoder or for the decoder. FIG. 36 illustrates the constitution of the decoder and the word drivers without using current mirror circuits. The circuit is nearly the same as that of FIG. 32 and the operation is nearly the same as that of FIG. 33. Since no current mirror circuit is used, the speed is slightly low but the operation is more stable. This is because even when the input MOS transistors $M_i$, $M_j$ are turned on in FIG. 36, erroneous operation does not take place unless the inverter INV 1 is inverted.

In the foregoing description, the address buffer outputs $a_{x1}$ to $a_{xn}$ were all of the high level or the low level when the chip enable signal $\overline{CE}$ was of the high level (stand-by state). Constitutions of address buffer circuits for generating outputs $a_{x1}$ to $a_{xn}$ will now be described in conjunction with FIGS. 37 to 46.

Figure 37:
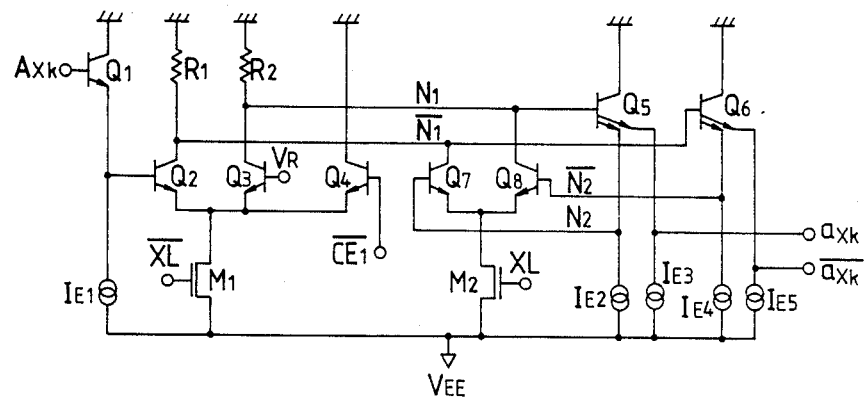
FIG. 37 is a diagram showing the address buffer of an ECL interface.
Figure 38:
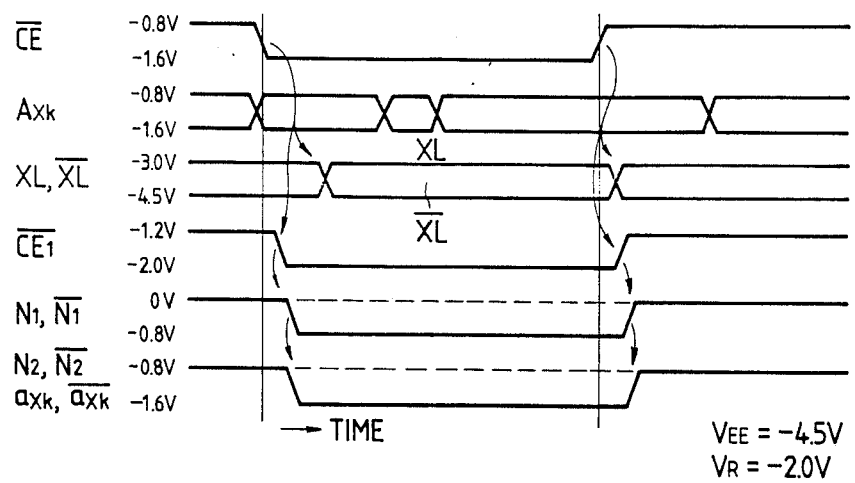
FIG. 38 is a diagram for explaining the operation of FIG. 37.

FIG. 37 shows an embodiment of an address buffer circuit that generates the outputs $a_{x1}$ to $a_{xn}$ upon receipt of $\overline{CE}$ and address input signals $A_{x1}$ to $A_{xn}$ (denoted representatively by $A_{xk}$) from a unit outside the chip. This circuit has a function to latch the output under the stand-by condition and during a period in which the circuit exhibits a function to fix the address buffer outputs to the high level. A transistor $Q_1$ and a current supply $I_{E1}$ form an emitter follower circuit that receives the external inputs $A_{xk}$ to lower the level. $V_R$ denotes a reference voltage of the current switch which is $-2.0$ V. Between the two sets of differential outputs from $Q_5$ and $Q_6$, the output signals $a_{xk}$, $\overline{a_{xk}}$ are sent to a circuit in a subsequent stage, and the feedback signals $N_2$, $\overline{N_2}$ are used for latching. Symbols $Q_7$, $Q_8$ denote current switching circuits for latching. The MOSTs $M_1$, $M_2$ and the gate control signals XL, $\overline{XL}$ therefor switch the current between the transistors $Q_2$, $Q_3$ that operate on address input signals and the transistors $Q_7$, $Q_8$ that effect latching. Symbol $Q_4$ denotes a transistor which fixes the outputs $a_{xk}$, $\overline{a_{xk}}$ to the high level irrespective of the address inputs when $\overline{CE_1}$ has the high level (stand-by state). The high level of $\overline{CE_1}$ is set to be higher than the high level of $A_{xk}'$ (a signal whose level is shifted by $V_{BE}$ from $A_{xk}$) and the low level thereof is set to be an intermediate value of the high level and the low level of $A_{xk}'$. The operation of FIG. 37 will be described with reference to FIG. 38. Under the stand-by condition in which $\overline{CE}$ is $-0.8$ V, the signal $\overline{XL}$ becomes $-3.7$ V, XL becomes $-4.5$ V, and the current switching circuits $Q_2$, $Q_3$ and $Q_4$ are activated. Since $\overline{CE_1}$ is as high as $-1.2$ V, the outputs $a_{xk}$ and $\overline{a_{xk}}$ are fixed to the high level irrespective of the address inputs $A_{xk}$. Then, as the signal $\overline{CE}$ changes from $-0.8$ V to $-1.6$ V, $\overline{CE_1}$ becomes $-2.0$ V and differential signals appear on $a_{xk}$, $\overline{a_{xk}}$ and $N_2$, $\overline{N_2}$ depending upon $A_{xk}$. Thereafter, XL and $\overline{XL}$ are inverted, and the current switching circuits $Q_7$ and $Q_8$ are activated to maintain the output condition of that moment. Even when $A_{xk}$ are changed under this condition, there is no change in the outputs $a_{xk}$, $\overline{a_{xk}}$. As $\overline{CE}$ changes again from $-1.6$ V to $-0.8$ V, $\overline{CE_1}$ returns to $-1.2$ V, and the signals $a_{xk}$, $\overline{a_{xk}}$ and $\overline{N_2}$, $N_2$ are fixed to the high level. The amplitude of the signals $a_{xk}$, $a_{xk}$ is determined by $I_{CS1} \times R_1$ and can be adjusted to be about 0 to 2 V.

Figure 39:
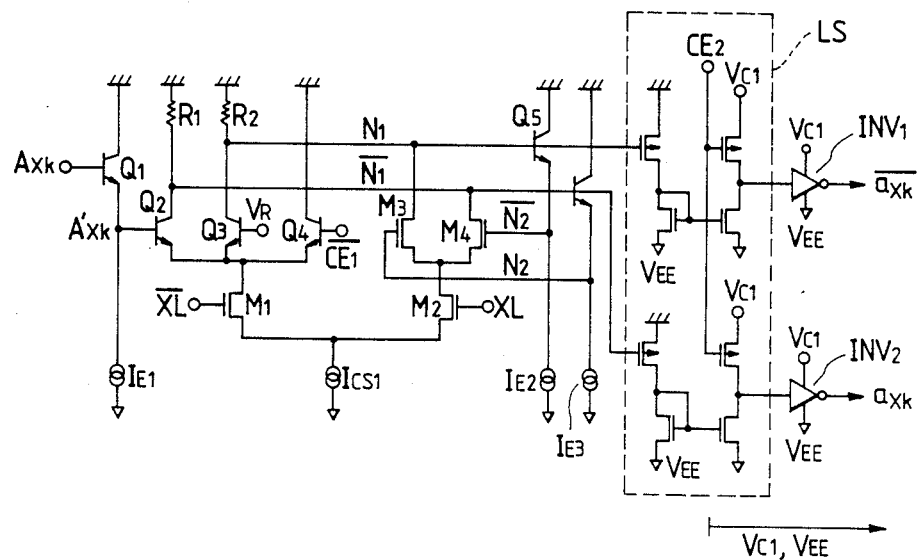
FIG. 39 is a diagram showing another address buffer of the ECL interface.
Figure 40:
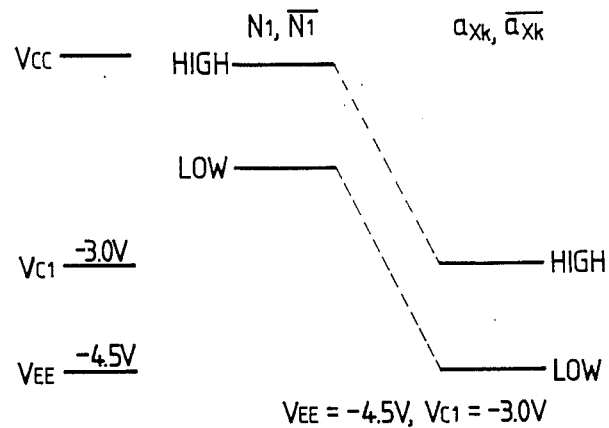
FIG. 40 is a diagram for explaining the level conversion of FIG. 39.
Figure 41:
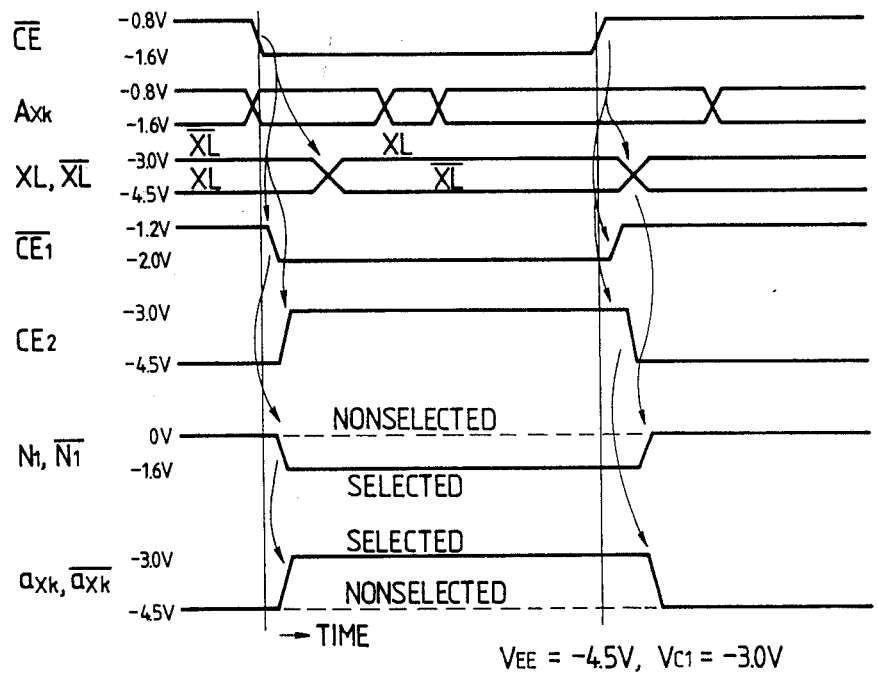
FIG. 41 is a diagram for explaining the operation of FIG. 39.

FIG. 39 illustrates an embodiment in which a level converter circuit LS is connected to the output terminal of the address buffer to generate output signals with $V_{EE}$ as a reference. This circuit also has a function to latch the output under the stand-by condition and during a period in which it exhibits a function to fix the address buffer outputs. Difference from the circuit of FIG. 37 is that the level converter circuit LS is provided, the latch circuit is constituted by a MOS differential circuit, a current supply is provided at a common source point of $M_1$ and $M_2$ in the latch circuit, and the signals $a_{xk}$, $\overline{a_{xk}}$ are fixed at the low level in the stand-by state. These effects will now be described. First, FIG. 40 shows the effects of the level converter circuit LS. Potentials of the outputs $N_1$, $\overline{N_1}$ of the current switching circuit are determined from $V_{CC}$ in principle. The outputs of the level converter circuit or the inverter outputs $a_{xk}$, $\overline{a_{xk}}$ thereof have the high level of $V_{C1}$ and the low level of $V_{EE}$. This means that the $V_{CC}$ reference (FIG. 3A) is changed into the $V_{EE}$ reference (FIG. 3B). This is the signal level that is suited when the voltages $V_{C1}$, $V_{EE}$ are to be applied to the CMOS circuit of a subsequent stage to drive it. Embodiments of the circuit of the subsequent stage mentioned in FIGS. 30 to 34 can all be used here. Furthermore, since the latch circuit is constituted by the MOS differential circuit instead of bipolar transistors, parasitic capacities adherent to $N_1$, $\overline{N_1}$ can be decreased, and the response speed of from $A_{xk}$ to $a_{xk}$, $\overline{a_{xk}}$ can be increased. Conversely, the speed of the latch circuit becomes slow which, however, does not arouse any problem since it is not a critical pulse in access time. Since a current supply is provided at a common source point of $M_1$ and $M_2$ in the latch circuit, the signals XL and $\overline{XL}$ need be differential ones and their levels can be easily set. FIG. 41 illustrates the operation of the circuit of FIG. 39. Under the stand-by condition, the signals $a_{xk}$, $\overline{a_{xk}}$ are fixed to the low level due to the low level of $\overline{CE_2}$. In operation, $CE_1$ assumes the low level, $CE_2$ assumes the high level, and the signals $a_{xk}$, $\overline{a_{xk}}$ change due to address inputs.

Figure 42:
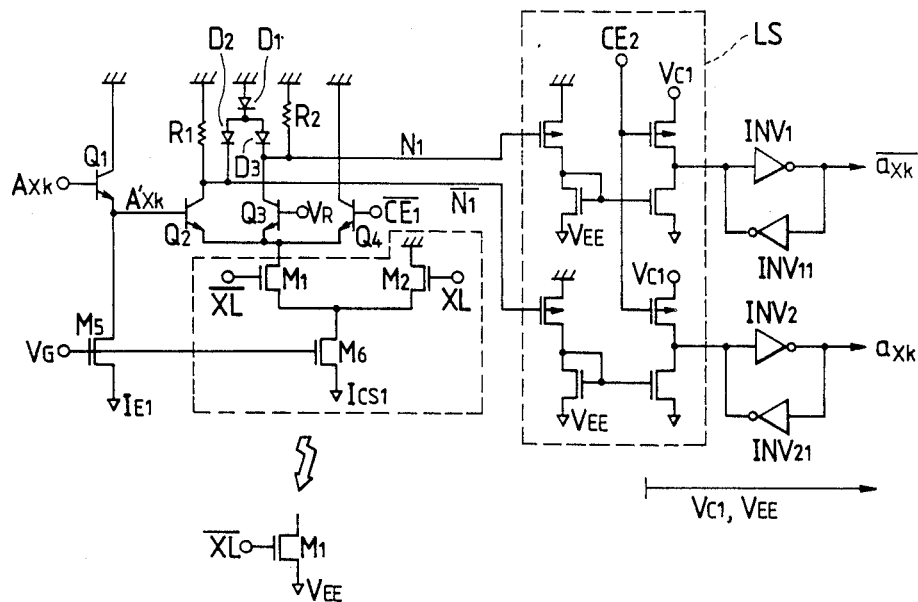
FIG. 42 is a diagram showing a further address buffer of the ECL interface.

FIG. 42 is an improvement of FIG. 39. What makes a difference from FIG. 39 is that automatic latch circuits are constituted by INV 1, INV 11 and INV 2, INV 21 of a subsequent stage while removing the MOS differential circuit for latching, that a diode for clamping is put to the collector load of the current switch, and that the current supplies $I_{E1}$ and $I_{CS1}$ are constituted by MOS transistors. Symbol $V_G$ denotes a constant voltage with $V_{EE}$ as a reference. The operation is the same as that of FIG. 41. Parasitic capacities adherent to $N_1$, $\overline{N_1}$ become further small since the MOS differential circuit is removed. Symbols $D_1$ to $D_3$ denote clamp diodes for preventing saturation of the bipolar transistors $Q_2$ and $Q_3$. The low collector potential is clamped to $V_{CC} - 2 V_{BE}$. The inverters INV 11 and INV 21 should be CMOS inverters having a small driving capability since they do not prevent the inverters INV 1 and INV 2 from inverting. The transistors $M_1$, $M_2$ and $M_6$ surrounded by a broken line may be substituted by one MOS transistor $M_1$ as shown in FIG. 42. As the signal $\overline{XL}$ assumes the low level, the latched condition is established, the current is reduced to zero and the consumption of power can be decreased. However, when the currents of many address buffers are simultaneously turned on and off by XL, the power supply noise increases inside the outside the chip.

Figure 43:
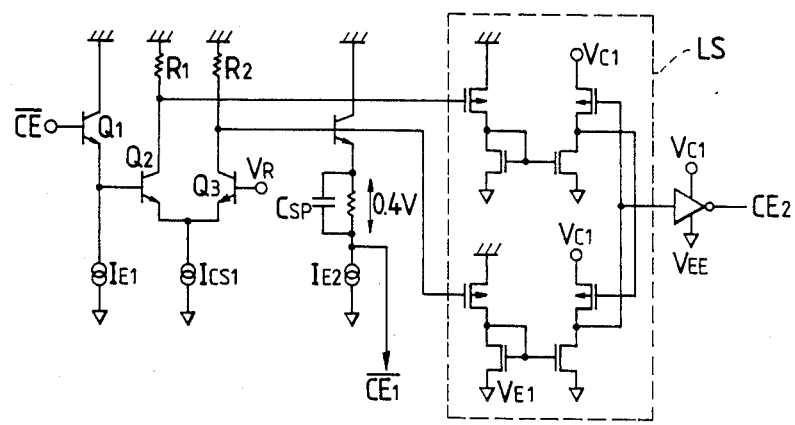
FIG. 43 is a diagram showing the constitution of a CE input buffer of the ECL interface that generates address input buffer control signals.
Figure 44:
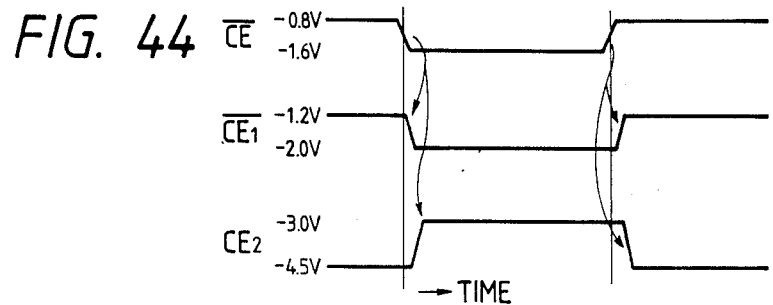
FIG. 44 is a diagram for explaining the operation of FIG. 43.

FIG. 43 shows the constitution of a $\overline{CE}$ input buffer that generates pulses $\overline{CE_1}$, $CE_2$ for controlling the address buffer of FIGS. 37, 39 and 42, and FIG. 44 shows the operation waveforms thereof. There is provided a 0.4 V level shift circuit using resistors to produce a signal level of $\overline{CE_1}$. Symbol $C_{SP}$ denotes a speed-up capacitor. The signal $CE_2$ has the high level $V_{C1}$ and the low level $V_{EE}$.

As another constitution of the ECL address buffer, furthermore, the wired OR connection may be accomplished by the emitter follower output of the address buffer to operate the predecoder or to fix the voltage during the stand-by state as shown in FIGS. 16 and 32 of Japanese Patent Laid-Open No. 170992/1986.

The ECL interface was explained in the foregoing with reference to FIGS. 37 to 43. However, the present invention can also be put into practice even in the TTL interface constitution to obtain the features of the present invention. FIG. 45 illustrates an embodiment of an address buffer circuit of TTL interface, and FIG. 46 is a diagram which explains the operation thereof. In FIG. 45, the inverter INV 1 receives the external address input signal $A_{xk}$ and amplifies them to the $V_{CC}$ and GND levels. Transistors $M_{P1}$ to $M_{P4}$, $M_{n1}$ to $M_{n4}$ and and INV 2 form a latch circuit that is controlled by XL, $\overline{XL}$, and NAND 1 and NAND 2 work upon receipt of $CE_1$ to fix the outputs to the high level during the stand-by state and to change the one output only to the low level during the operation. As shown in FIG. 45, the supply voltages $V_{CC}$, GND are applied to the INV 1 of the initial stage only, and voltages $V_{C1}$ and GND are applied to the stages subsequent to the latch circuit to operate them maintaining a small amplitude. In FIG. 46, the voltage $V_{C1}$ is 1.5 V, the external input signals $\overline{CE}$, $A_{xk}$ have the high level of 2.4 V and the low level of 0.8 V to cope with the worst condition in the TTL input. First, when $\overline{CE}$ has the high level, $\overline{XL}$ has the low level and XL the high level. Therefore, the signal $N_1$ changes depending on a change in $A_{xk}$. Further, since $CE_1$ has the low level, the outputs $a_{xk}$, $\overline{a_{xk}}$ are fixed to the high level. Then, when $\overline{CE}$ changes from the high level into the low level, $CE_1$ changes from the low level into the high level, and the output signals $a_{xk}$, $\overline{a_{xk}}$ change depending upon the signal $N_1$. The signals XL, $\overline{XL}$ are switched and the signal $N_1$ is fixed. As the signal $\overline{CE}$ changes again from the low level into the high level, the signal $CE_1$ changes from the high level into the low level, and the signals $a_{xk}$, $\overline{a_{xk}}$ are fixed to the high level. The signals XL, $\overline{XL}$ are switched and the latch is released to be ready for the next cycle.

Figure 47:
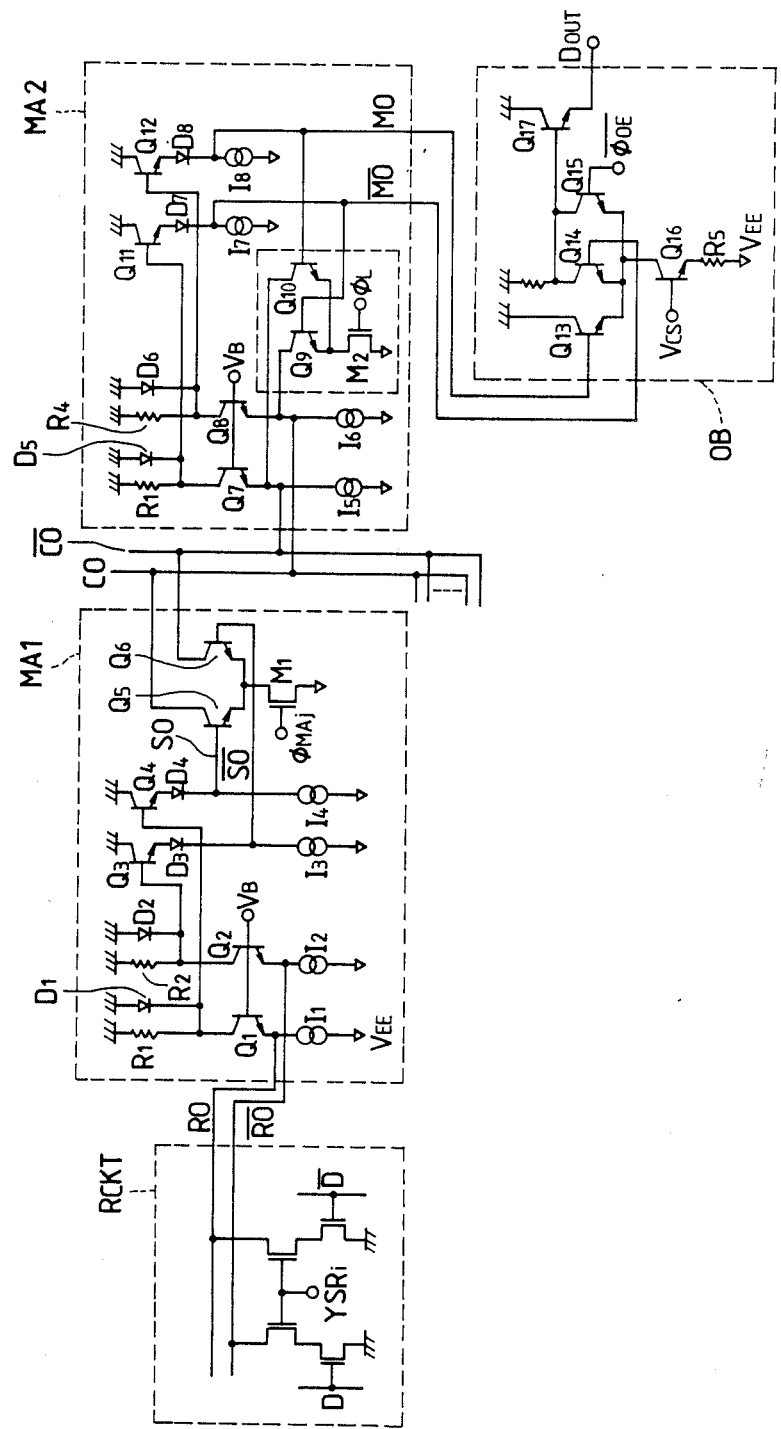
FIG. 47 is a diagram which illustrates an output circuit.
Figure 48:
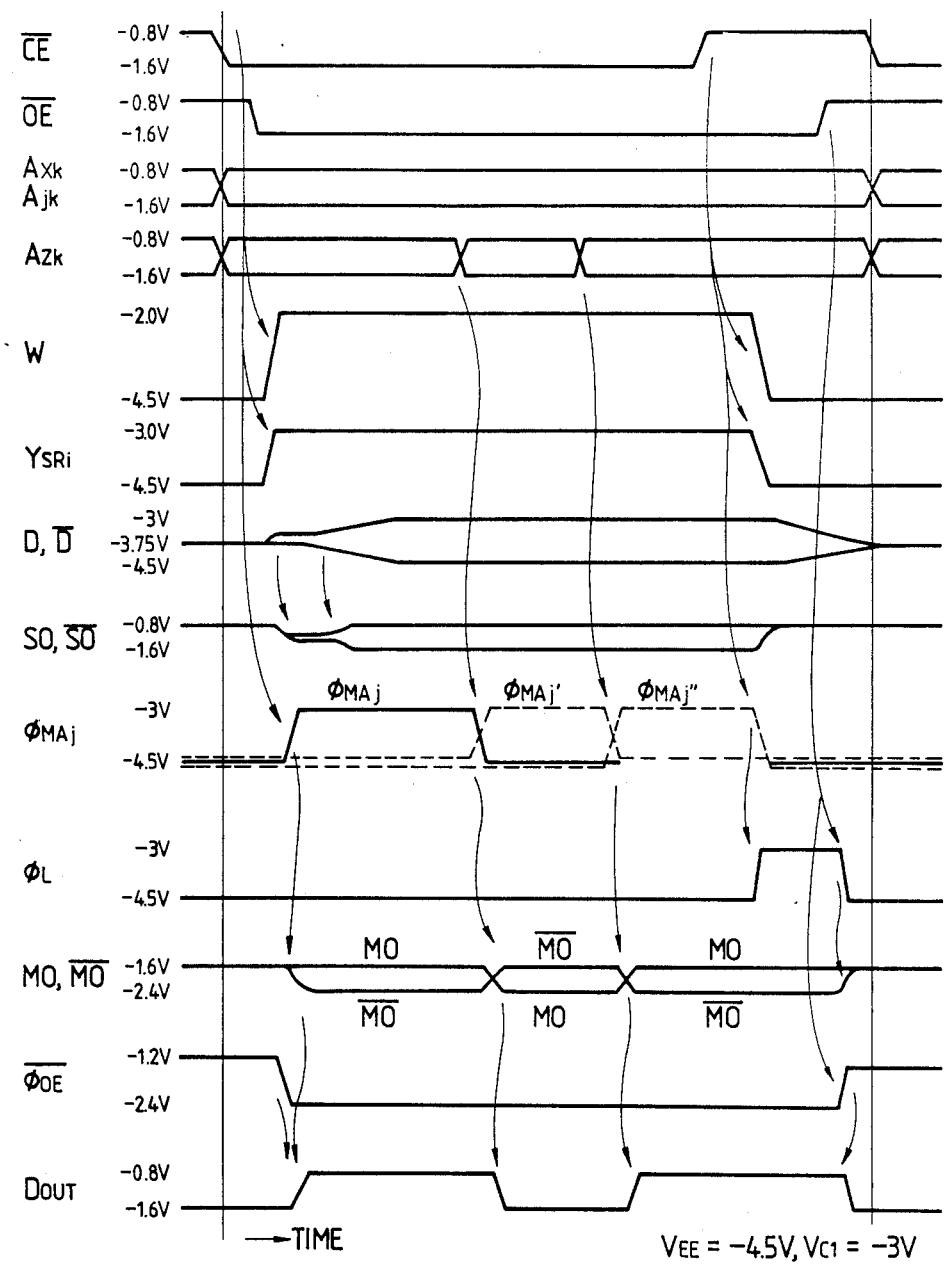
FIG. 48 is a diagram for explaining the operation of FIG. 47.

Described below is the constitution of an output circuit used, for example, in the embodiment of FIG. 20. FIG. 47 illustrates the constitution of an ECL interface output circuit and FIG. 48 is a diagram explaining the operation thereof. The circuit constituted chiefly by bipolar transistors requires a supply voltage of greater than 3 V; therefore, the supply voltages of $V_{CC}$ and $V_{EE}$ are applied thereto. The output circuit can conveniently be divied into three circuit blocks MA1, MA2 and OB as indicated by broken lines in FIG. 47. The circuit block MA1 receives output lines RO, $\overline{RO}$ from the memory cell read circuit and produces outputs CO, $\overline{CO}$ via a current-voltage converter circuit and a bipolar differential amplifier circuit. Current signals appear on the output lines RO, $\overline{RO}$ depending upon the signal voltages of data lines. The circuits $Q_1$ to $Q_4$, $R_1$, $R_2$, $D_1$, $D_2$, and $I_1$ to $I_4$ convert the current signals into voltage signals. To the bases of $Q_1$ and $Q_2$ is applied a constant voltage $V_B$ (e.g., $-0.8$ V) to suppress the voltage change of RO and $\overline{RO}$ by utilizing the fact that the value $V_{BE}$ does not much change depending upon the current. This helps decrease the delay caused by parasitic capacities of RO, $\overline{RO}$. The transistors $Q_5$, $Q_6$ and $M_1$ form a differential amplifier circuit which is activated $\phi_{MAj}$ generated from $\overline{CE}$, $\overline{WE}$, and address inputs. For instance, the circuit block MA1 is provided for each subarray to select the data of which subarray be transmitted to the subsequent stages depending upon $\phi_{MAj}$. The data from a plurality of memory cells are switched at high speeds by switching $\phi_{MAj}$ only while the word lines and column select lines of the memory cells are being selected in order to carry out the so-called static operation. Current signals appear on CO and $\overline{CO}$, too. Like the circuit block MA1, the circuit block MA2 converts the current signals into voltage signals to produce MO and $\overline{MO}$. In the circuit block MA2, the transistors $Q_9$, $Q_{10}$ and $M_1$ surrounded by a broken line form a latch circuit which holds the data read from the memory cells. The read data can be continuously sent to the terminal $D_{OUT}$ even during the operation for rewritting data onto the DRAM cells or during the period of precharging operation. The latch circuit may be provided in the block MA1. In this case, SO and $\overline{SO}$ are base inputs and RO and $\overline{RO}$ are collector outputs. This constitution makes it possible to carry out the so-called static operation by switching $\phi_{MAj}$ only even during the operation for rewriting data onto the DRAM cells or during the precharging operation. The block OB is an output buffer which obtains $D_{OUT}$ from the emitter of $Q_7$. The signal $\overline{\phi_{OE}}$ works to turn a transistor $Q_{15}$ on and to fix the output $D_{OUT}$ to the low level during the stand-by state or during the write cycle.

FIG. 48 is a diagram which illustrates the reading operation inclusive of the above static column operation. Symbols $\overline{CE}$, $\overline{OE}$, $A_{xk}$, $A_{yk}$, and $A_{zk}$ denote external input signals. Among them, symbol $\overline{OE}$ denotes an output enable signal which sends an effective data to $D_{OUT}$ when it has the low level. Symbol $A_{xk}$ denotes a group of address signals of the word type, $A_{yk}$ denotes a group of address signals of the column select type, and $A_{zk}$ denotes a group of address signals for switching $\phi_{MAj}$. During the period in which $\overline{CE}$ and $\overline{OE}$ have the low level, $A_{zk}$ only are switched to carry out the static column operation. When $\overline{OE}$ has the low level during the precharging period in which $\overline{CE}$ has the high level, an effective data is sent to $D_{OUT}$. Though not diagramed in FIG. 47, the output lines RO, $\overline{RO}$, CO, $\overline{CO}$, MO and $\overline{MO}$ have large parasitic capacities. In the high-speed continuous cycle operation, therefore, the history of the previous cycle may affect the access time. In such a case, MOS for equalizer should be provided for the differential signal lines to obtain an equal potential during the stand-by period.

FIG. 49 illustrates a TTL interface output circuit. The blocks MA1, MA2 of the preceding stage may be constituted in the same manner as those of FIG. 47. Here, however, the supply voltages should be changed into GND→$V_{CC}$ and $V_{EE}$→GND according to FIG. 2. Due to the constitution of the block OB, the outputs MO, $\overline{MO}$ of the block MA2 should not be shifted for their levels by the diodes. Furthermore, it is desired that the signal amplitude be increased from 0.8 V to about 1.5 V. The block OB is different from that of FIG. 47. In the block OB, the input signals MO, $\overline{MO}$ are converted into signals of a large amplitude through the current mirror circuits $M_3$ to $M_{13}$ to drive the output transistors $M_{14}$, $M_{15}$. In the TTL, the signal $\phi_{OE}$ of the high level renders the output $D_{OUT}$ to possess a high impedance during the stand-by condition or during the write cycle. No feed-through current flows in the circuit block OB during the stand-by condition or during the write cycle. The signal $\overline{\phi_{OE}}$ should have an amplitude $V_{CC}$. FIG. 49 also shows a level converter circuit from a small-amplitude system ($V_{CI}$, GND operation). This circuit resembles the driver of FIG. 13, but no precharge signal is used and differential signals $\phi_{OE}$, $\overline{\phi_{OE}}$ of small amplitudes are used for controlling the current mirror circuits. The levels can be converted easily and at high speeds.

Figure 50:
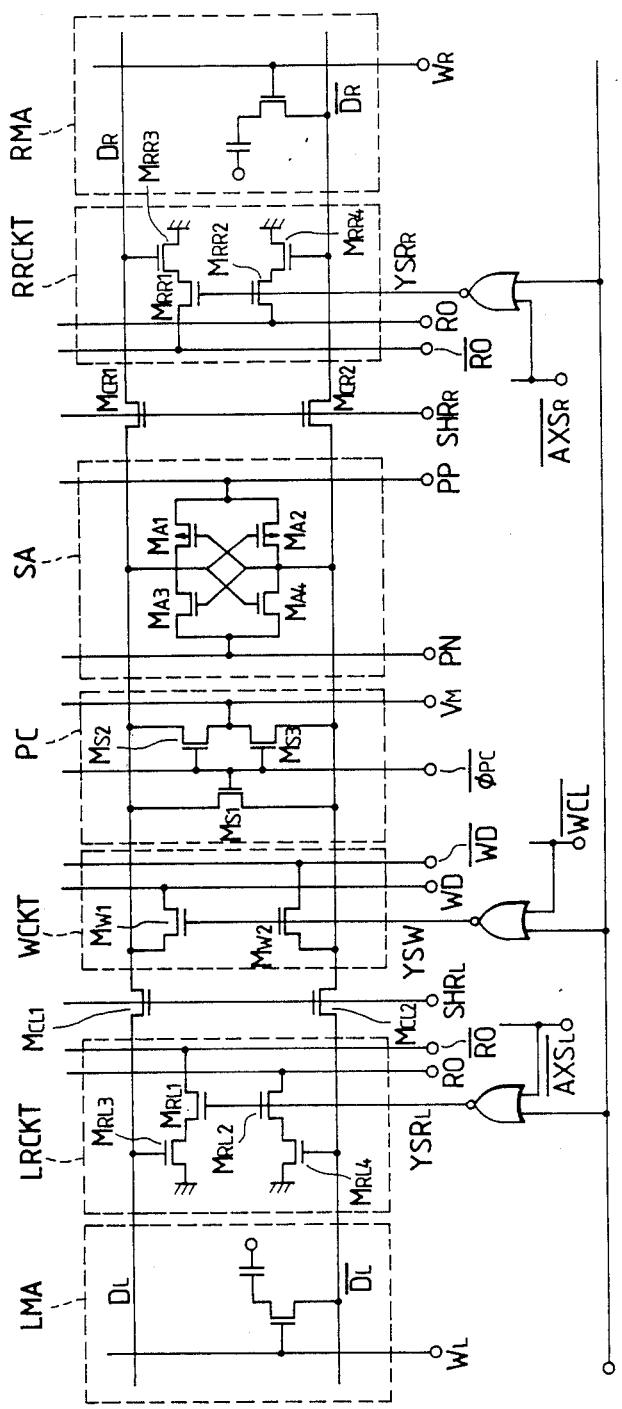
FIG. 50 is a diagram of a circuit in which the sense amplifier, write circuit and precharge circuit of DRAM are commonly used in the two subarrays.

Described below is the memory cell array constitution that does not occupy large areas at high speeds. The description did not refer to dividing the data lines in the memory cell array constitution of FIG. 28 consisting of N word lines x M pairs of data lines. When the number of M increases in the memory of a large capacity, parasitic capacities of data lines increase, and the read signal voltage of data lines decreases, making it difficult to carry out the reading operation at high speeds maintaining stability. Japanese Patent Laid-Open No. 198592/1982 teaches a method of dividing the data lines in order to decrease parasitic capacities of the data lines. This system can be directly applied to FIG. 28. That is, the constitution of FIG. 28 is provided for each subarray. However, it becomes necessary to provide a sense amplifier, a precharge circuit, a write circuit and a read circuit for each of the divided data lines, resulting in an increase in the chip area and impairing the degree of integration that is a feature of the DRAM. In order to read the DRAM as shown in FIGS. 28 and 29, a small voltage difference in the data lines must be detected immediately after the memory cell is read but before being amplified through the sense amplifier and must then be sent to an output circuit in the subsequent stage. It can therefore be contrived to commonly use the sense amplifier and the write circuit in the two divided subarrays to suppress the chip area from increasing while connecting the read circuit to the data lines to maintain the feature of high-speed reading operation. In FIG. 50 the read circuits LRCKT, RRCKT are provided for each left and right two pairs of data lines $D_L$, $\overline{D_L}$ and $D_R$, $\overline{D_R}$. The write circuit WCKT ($M_{W1}$, $M_{W2}$), data line short circuit (precharge circuit) PC ($M_{S1}$, $M_{S2}$, $M_{S3}$) and sense amplifier SA ($M_{A1}$, $M_{A2}$, $M_{A3}$, $M_{A4}$) are commonly used in the two subarrays LMA, RMA. Further, to which pair of data lines these circuits should be connected is controlled by turning on and off the MOS switches $M_{CL1}$ and $M_{CL2}$ or $M_{CR1}$ and $M_{CR2}$. Symbols $SHR_L$ and $SHR_R$ denote gate control signals. The write circuit and the read circuit are the same as the write circuit and the read circuit shown in FIG. 28. The read circuit connected to $D_L$, $\overline{D_L}$ is controlled by $YSR_L$ and the read circuit connected to $D_R$, $\overline{D_R}$ is controlled by $YSR_R$. The signals $YSR_L$ and $YSR_R$ are generated from the signal $\overline{YS}$ and the signal $\overline{AX_{SL}}$ or $\overline{AX_{SR}}$ through a NOR circuit. The write circuit is controlled by YSW which is generated from $\overline{YS}$ and $\overline{WCL}$ through the NOR circuit. The features of this circuit are as described below. First, the write circuit, sense amplifier and precharge circuit are commonly used for the two pairs of data lines to decrease the number of elements and to decrease the layout area. Second, the write circuit, sense amplifier and precharge circuit are separated from the pairs of data lines when the read circuit is in operation. Therefore, parasitic capacities of the data lines decrease during the reading operation and the speed can be increased owing to an increase in the data line signal voltage. Parasitic capacities of the data lines at the time of reading the data are decreased by about 30% since the sense amplifier, precharge circuit and write circuit are not connected.

Figure 51:
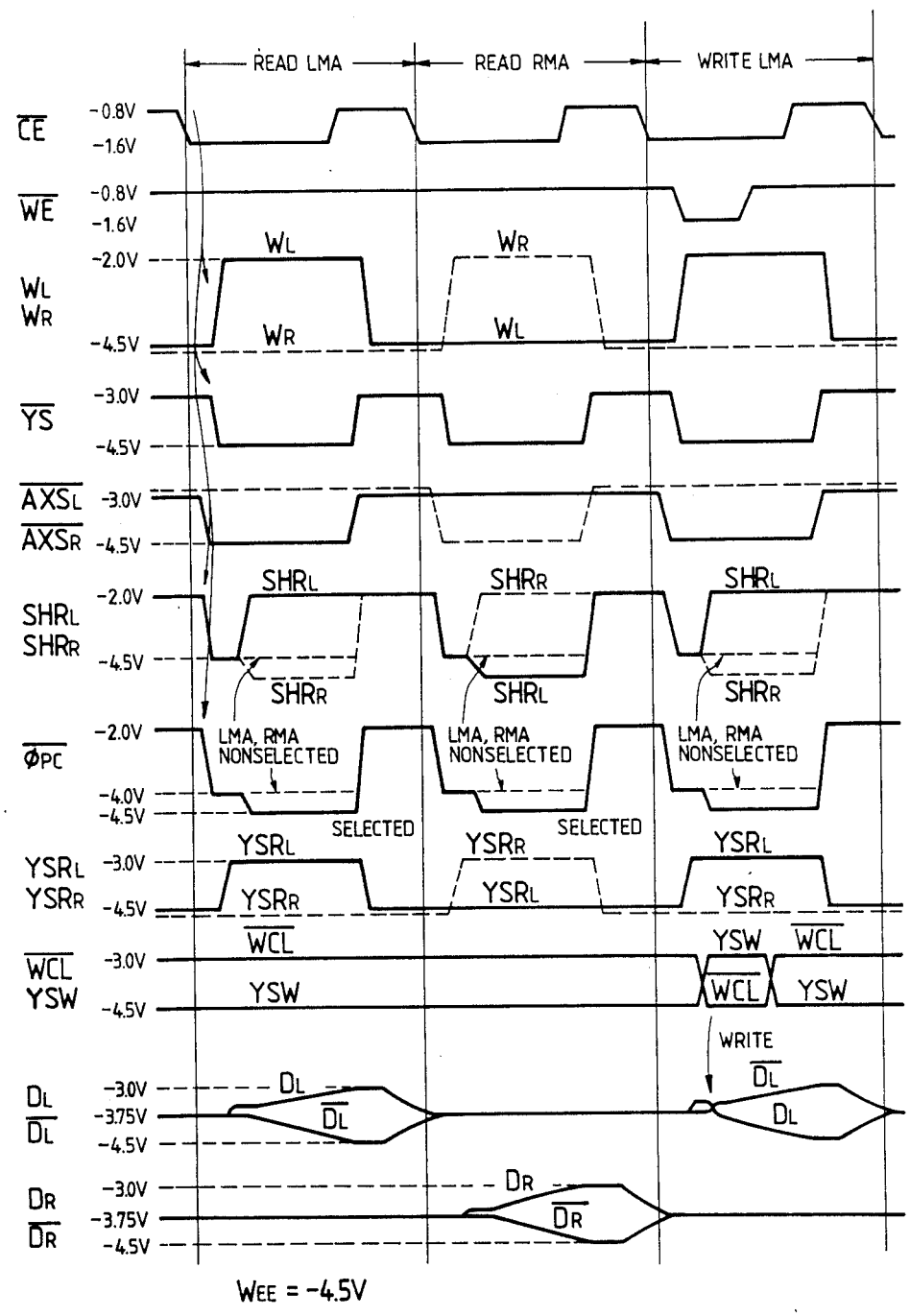
FIG. 51 is a diagram for explaining the operation of FIG. 50.

FIG. 51 illustrates a continuous three-cycle operation consisting of left subarray LMA reading, right subarray RMA reading and left subarray LMA writing. The switching between the left subarray LMA and the right subarray RMA is effected by $\overline{AX_{SL}}$ and $\overline{AX_{SR}}$, and the switching between the reading and writing is effected by $\overline{WCL}$. Described below is the case of the ECL interface where $V_{EE} = -4.5$ V, word line voltage $V_W = -2.0$ V, data line high voltage $V_{DH} = -3.0$ V, data line low voltage $V_{DL} = -4.5$ V, and precharge voltage $V_{DM} = -3.75$ V. The left subarray word line $W_L$, right subarray word line $W_R$, $SHR_L$, $SHR_R$, and $\phi_{PC}$ have an amplitude of 2.5 V and others have an amplitude of 1.5 V. The circuit of FIG. 50 is provided for each of the subarrays and exists in many number in the chip. However, these circuits are not necessarily driven by the signals $SHR_L$, $SHR_R$ and $\phi_{PC}$ sent through each of their own signal lines. Usually, the circuits are driven in a divided manner by the address signals. First, the signal $\overline{CE}$ has the high level of $-0.8$ V, the whole word lines W have the low level of $-4.5$ V, the whole column select signal lines $\overline{YS}$ have the high level of $-3.0$ V, both $SHR_L$ and $SHR_R$ have the high level of $-2.0$ V, and $\phi_{PC}$ has the high level of $-2.0$ V. Accordingly, the data lines $D_L$, $\overline{D_L}$ and $D_R$, $\overline{D_R}$ are short-circuited through a common precharge circuit to assume $-3.75$ V. When the signal $\overline{CE}$ changes from the high level of $-0.8$ V to the low level of $-1.6$ V, the signals $SHR_L$, $SHR_R$ and $\phi_{PC}$ once drop from $-2.0$ V to $-4.0$ V. These signals may be dropped to $-4.5$ V. These operations are better effected all simultaneously without relying upon address signals to increase the operation speed by an amount that is not based upon the address control. Therefore, the pairs of data lines are separated from the write circuit, sense amplifier and data line short-circuiting circuit that are used in common. Then, when, for example, the word line $W_L$ is selected to assume the high level of $-2.0$ V in the left subarray, small signal voltages appear on the pair of data lines $D_L$, $\overline{D_L}$. When YS is selected to assume the low level of $-4.5$ V, the small signal voltages are readily transmitted to the output circuit by the read circuit. Only one of the right or the left read circuit is operated by $YSR_L$, $YSR_R$. The small signal voltages on the pair of data lines are then amplified by the CMOS sense amplifier. Just before this moment, $SHR_L$ assumes $-2.0$ V, and the data lines $D_L$, $\overline{D_L}$ are connected to the CMOS sense amplifier and are amplified. However, $SHR_R$ assumes $-4.5$ V and no signal is transmitted to the data lines $D_R$, $\overline{D_R}$ even when the CMOS amplifier is operated. There may exist the case where neither the right subarray nor the left subarray is selected. In this case, the sense amplifier does not operate. Both $SHR_L$ and SHR$_R$ may assume the intermediate level as indicated by a broken line in FIG. 51 or may be returned to the high level. Before the CMOS sense amplifier operates, $\overline{\phi_{PC}}$ is further dropped to −4.5 V. When neither the right subarray nor the left subarray is selected, $\overline{\phi_{PC}}$ are maintained at the intermediate potential as indicated by a broken line in FIG. 51 and should all be returned to the high potential during the precharging period. The signals D$_L$, $\overline{D_L}$ are amplified by the CMOS sense amplifier to voltages large enough for being rewritten. Next, when $\overline{CE}$ changes from the low level into the high level, W and $\overline{YS}$ are not selected, and the read circuit and the sense amplifier are turned off. Thereafter, $\overline{\phi_{PC}}$ assumes the high level of −2.0 V so that the pair of data lines are short-circuited. Then, SHR$_L$ and SHR$_R$ assume −2.0 V again and the right and left data lines are precharged to −3.75 V. Even when the read circuit is constituted as shown in FIG. 50, the operation speed cannot be sufficiently increased unless there is used an amplifier of high sensitivity in the subsequent stage. The amplifier of high sensitivity is constituted using chiefly bipolar transistors as shown, for example, in FIG. 47 or 49. Or, the amplifier of high sensitivity can be constituted based on the CMOS circuit alone. An example of this circuit has been disclosed in ISSCC, Digest of Technical Papers, FIG. 3, 1988, pp. 174–175. In the arrangement of this circuit, when the Y-decoder driver that generates $\overline{YS}$ is provided between the subarrays that are divided from the memory cell array, the YS signal lines do not run in parallel with the data lines and no noise is induced on the data lines by the signals $\overline{YS}$. Furthermore, when the Y-decoder drivers are arranged being concentrated in one place in the chip as shown in FIG. 28, the signals $\overline{YS}$ must control the read circuits and the write circuits pertaining to a number of subarrays as shown in FIG. 50. In this case, the $\overline{YS}$ signal lines pass over the memory cell array presenting a problem of noise that is induced on the data lines due to capacitive coupling. In particular, the problem becomes serious in the system that reads small signals on data lines of before being amplified. This problem is solved if use is made of memory cells in which data lines and $\overline{YS}$ lines are formed by dissimilar wiring layers or if a plate layer for shielding is provided between them as shown, for example, in IEDM, Digest of Technical Papers, FIG. 1, 1988, pp. 596–599. The wiring constitution of the memory cells will now be described. The word lines have a composite structure consisting of polysilicon and a first aluminum layer and are short-circuited at several portions. The data lines are composed of silicide on the polysilicon word lines. A common plate layer of polysilicon or tungsten is formed thereon for the memory cell storage capacity. A word line consisting of the first aluminum layer is provided thereon. Then, the $\overline{YS}$ line consisting of the second aluminum layer is formed thereon at right angles with the word line and in parallel with the data line. This makes it possible to lower the resistance of the word lines and the data lines, to prevent the coupling between the $\overline{YS}$ lines and the data lines, and to constitute the cell array as described later in conjunction with FIGS. 53, 54 and 57.

Figure 52:
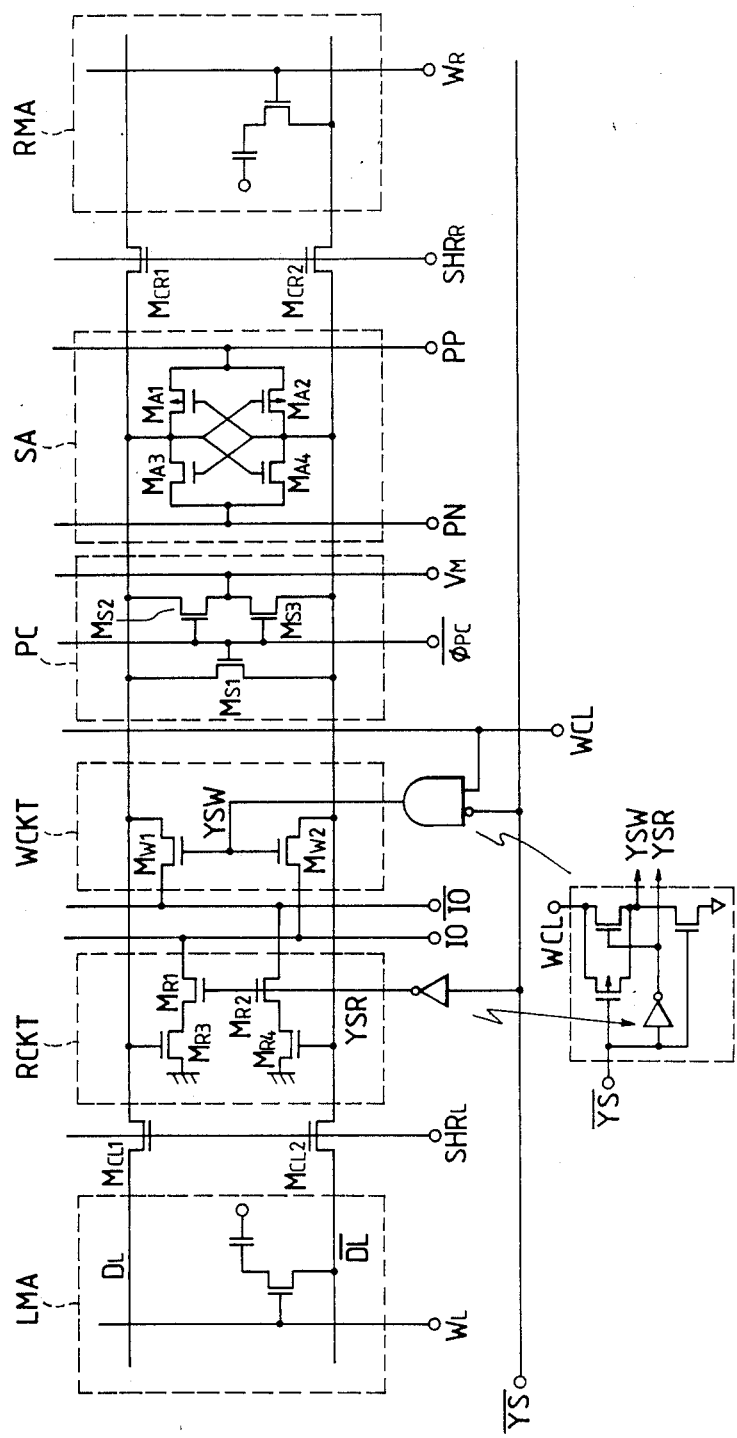
FIG. 52 is a diagram of a circuit in which the sense amplifier, read circuit, write circuit and precharge circuit of DRAM are commonly used in the two subarrays.

FIG. 52 shows a circuit in which the read circuit, write circuit, precharge circuit and sense amplifier are all commonly used in the right and left subarrays and, further, the read output lines (RO, $\overline{RO}$) and the write input lines (WI, $\overline{WI}$) are commonly used. According to this system, the occupied areas can be further decreased as the circuits are commonly used though the speed of operation becomes somewhat slow due to an increased number of timings for controlling SHR$_L$, SHR$_R$ before the read circuit operates. The signal YSR is an inverter output of the $\overline{YS}$ signal. The write circuit is controlled by YSW which is generated from the logic circuit of $\overline{YS}$ and WCL. The logic circuit may be an ordinary NOR or NAND circuit as shown in FIG. 50. In this case, however, the parasitic capacity of the WCL line increases resulting in an increase in the delay time of the WCL signal. This is because WCL commonly drives the logic circuits for every number of pairs of data lines. FIG. 52 shows a concrete circuit structure for decreasing the parasitic capacity of the WCL lines. This circuit decreases the parasitic capacity of the WCL lines by utilizing the fact that the drain capacity of the MOS transistor is smaller than the gate capacity. The gate capacity is seen only in a small number of selected columns (YS: low).

Figure 53:
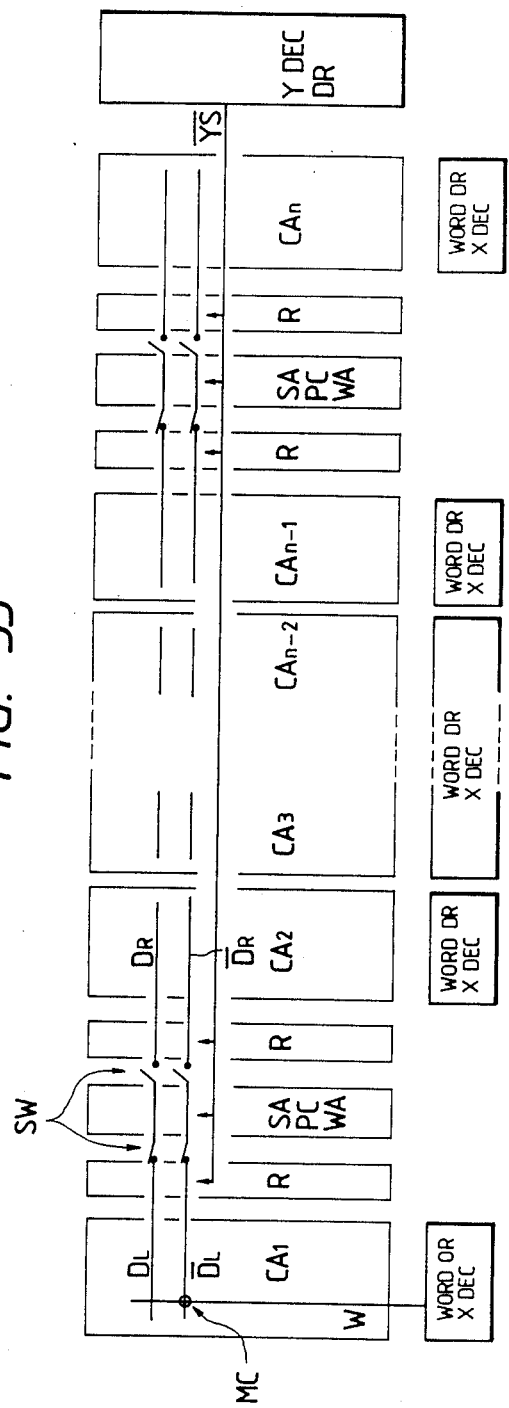
FIG. 53 is a diagram for arranging the chips of the circuit of FIG. 50.
Figure 54:
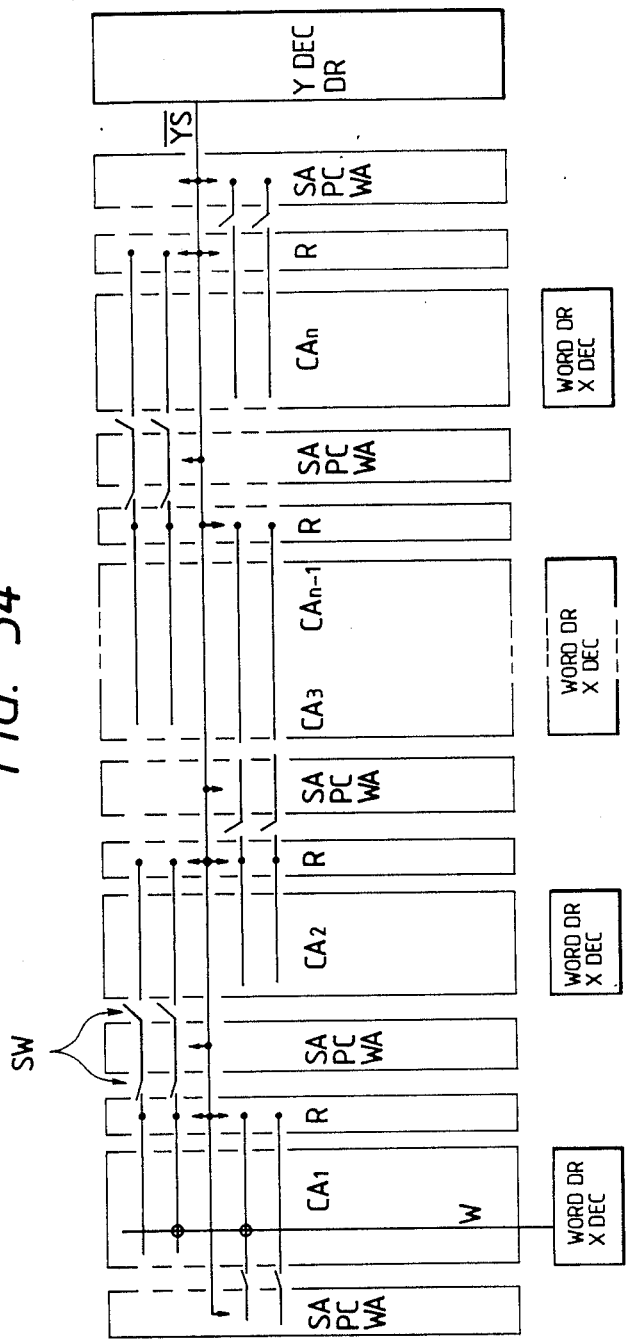
FIG. 54 is a diagram for arranging other chips of the circuit of FIG. 50.

FIG. 53 illustrates the read circuit, write circuit, precharge circuit, and sense amplifier that are commonly used in a plurality of memory subarrays. Symbols CA$_1$ to CA$_n$ denote memory subarrays that are divided into n in the direction of data lines. Symbol R denotes a read circuit connected directly to the data lines, and symbols SA, PC, and WA denote a sense amplifier, a precharge circuit and a write circuit that are commonly used in the right and left subarrays. MOS switches mentioned with reference to FIG. 52 are provided among the left and right pairs of data lines D$_L$, $\overline{D_L}$, D$_R$, $\overline{D_R}$, and SA, PC, WA. The output. $\overline{YS}$ of the Y-decoder driver finds logics of $\overline{AXS_L}$, $\overline{AXS_R}$, $\overline{WCL}$ mentioned with reference to FIG. 50 at plural portions of the read circuits R and write circuits WA to activate required circuits only. In FIG. 53, one $\overline{YS}$ line controls only one pair of data lines. However, plural pairs of data lines may be controlled by one YS line. This is because it becomes difficult to place a Y-decoder driver having a large area for every pair of data lines as the size of the memory cells becomes small. In this case, two or more pairs of read circuits and write circuits corresponding to two or more pairs of data lines are activated by one YS line. Therefore, two or more pairs of read and write data must be squeezed by an output circuit or a write input buffer using some address signals. In FIG. 54, two pairs of data lines are controlled using a single $\overline{YS}$ line. In FIG. 54, furthermore, the sense amplifier, precharge circuit and write circuit are commonly used in the right and left subarrays like in FIG. 53, but are arrayed each in a number of one on the side opposite to the subarrays for two pairs of data lines. This is because, as the size of the memory cells becomes further small, it becomes difficult to place even the sense amplifier, precharge circuit and write circuit each in a number of one for a pair of data lines. Then, the size of the memory cells is not affected by the sizes of the complex Y-decoder driver, sense amplifier, precharge circuit and write circuit, and can be reduced to limit of working technology having storage capacities necessary as memory cells. Further, the sense amplifier, precharge circuit and write circuit are commonly used in the right and left subarrays except both ends of the chip. Therefore, the chip length in the lateral direction of FIG. 54 is nearly equal to that of FIG. 53. The chip length in the vertical direction can be decreased to a degree that is determined only by the memory cells from FIG. 53.

The read circuit, write circuit, precharge circuit and sense amplifier can be commonly used in several ways by taking the operation speed and the occuplied areas into consideration in addition to the embodiments of FIGS. 20 and 52. For instance, the read circuit and the precharge circuit may not be commonly used but may be arranged for every subarray.

Although the foregoing embodiments have dealt with the read circuit, write circuit, precharge circuit and sense amplifier in the DRAM, they need not necessarily be limited to the DRAM only. For instance, the read circuit and write circuit may be separated provided as shown in FIGS. 28, 50 and 52 even when the SRAM that needs neither the precharge circuit nor the sense amplifier is to be operated at high speeds. Even in this case as shown in FIG. 50, the read circuit is provided for every subarray, and the write circuit is commonly used for the right and left subarrays.

Figure 55:
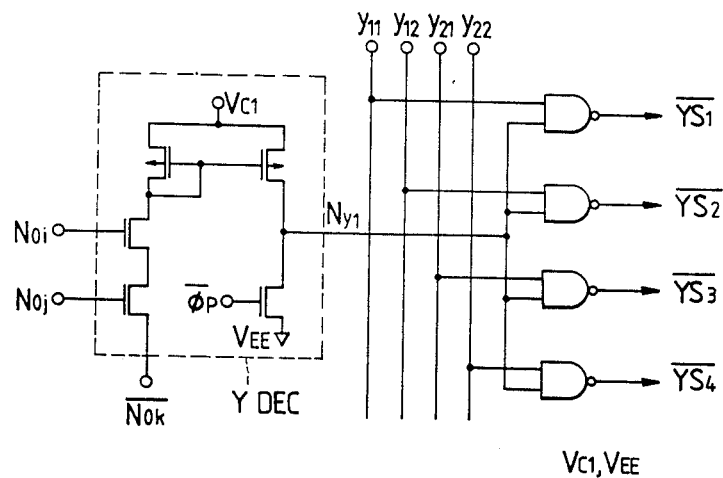
FIGS. 55 and 56 illustrate embodiments of the Y-decoder driver.
Figure 56:
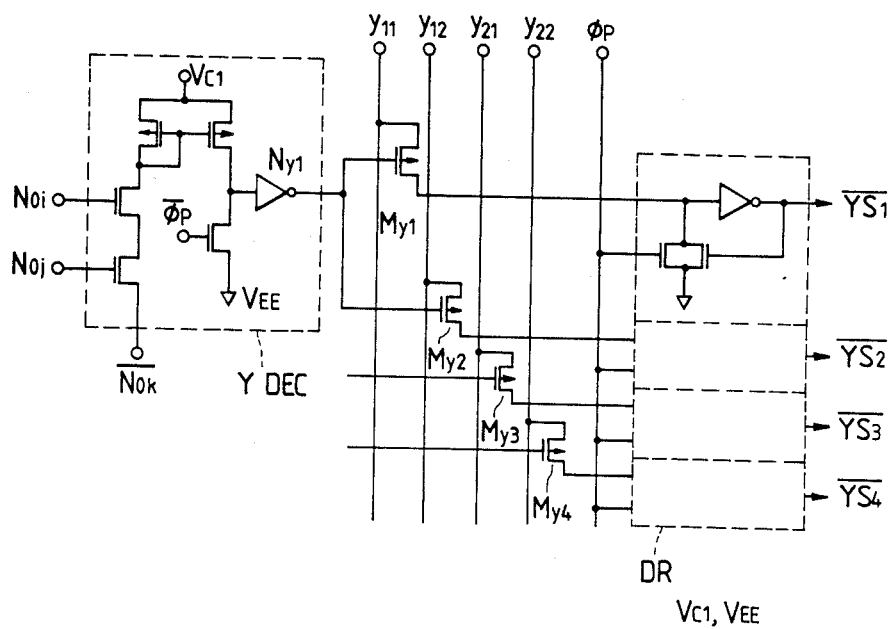

FIG. 55 illustrates an embodiment of the Y-decoder driver circuit for generating the column select signal $\overline{YS}$ used in FIGS. 50 and 52. The Y-decoder is the same as the X-decoder shown in FIGS. 32 and 34. The signals $\overline{YS_1}$ to $\overline{YS_4}$ of four columns are generated from the four drivers that use a decoder and NAND circuits. When the decoder output $N_{Y1}$ using a current mirror assumes the high level and any one of $Y_{11}$ to $Y_{22}$ assume the high level, only one of the signals $\overline{YS_1}$ to $\overline{YS_4}$ assumes the low level of the selected condition. The signals $\overline{YS_1}$ to $\overline{YS_4}$ may have a small amplitude (e.g., 1.5 V) like the input signals $N_{Oi}$, $\overline{N_{Oj}}$, $N_{Ok}$, $y_{11}$ to $y_{22}$, and $\overline{\phi_P}$. FIG. 56 illustrates another example for generating the $\overline{YS}$ signals $\overline{YS_1}$ to $\overline{YS_4}$ like in FIG. 55. The circuit operates in the same manner as in FIGS. 32 and 34. Here, however, the transfer transistors $M_{y1}$ to $M_{y4}$ for inputting the signals $y_{11}$ to $y_{22}$ are the pMOS transistors. This is because the polarity for selecting or not selecting the signals $\overline{YS_1}$ to $\overline{YS_4}$ is opposite to that of FIGS. 32 and 34.

Figure 57:
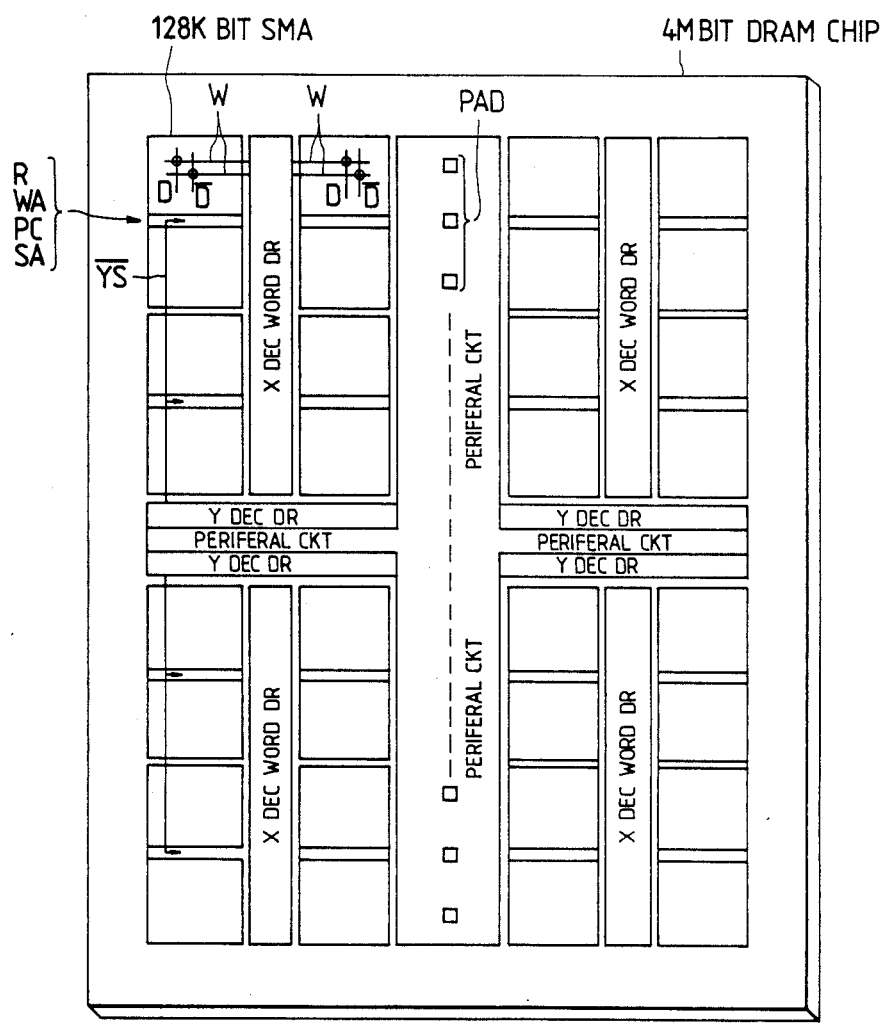
FIG. 57 is a diagram illustrating the arrangement of a whole chip of DRAM.

FIGS. 53 and 54 illustrate chip arrangements in the direction of data lines, and FIG. 57 illustrates the arrangement of the whole chip of a 4-megabit DRAM inclusive of X-decoder and word drivers as well as address buffers. The peripheral circuits are placed in a crossing manner at the center of the chip. The bonding pads are arranged at the center of the chip in the vertical direction so as to be buried in the group of peripheral circuits. Thus, the wiring lengths are shortened from the bonding pads to the input and output circuits, and are rendered to be as equal to each other as possible. The memory cell array has 4096 word lines x 1024 pairs of data lines. The data lines are divided into eight in the vertical direction. Memory cells of a number of 256 are connected to a single data line. The word lines are divided into four in the lateral direction. Memory cells are connected in a number of 128 to a single word line. A memory subarray that is divided is of 128 kilobits consisting of 512 word lines x 256 pairs of data lines. The read circuit (R), write circuit (WA), precharge circuit (PC) and sense amplifier (SA) are commonly used in the upper and lower two memory subarrays as shown in FIGS. 50 and 53. In FIGS. 58A and 58B, the chip of FIG. 57 is bonded onto an LOC (lead on chip) package. This bonding method has been disclosed in Japanese Patent Laid-Open No. 241959/1986. FIG. 58A is a plan view looked at from the upper direction and FIG. 58B is a section view cut along a dot-dash chain line of FIG. 58A. The stem STM for bonding presses from the upper direction most of the chip CHIP other than the portion near the bonding pads PAD and effects the bonding from the conductor pattern CPTN on the right and left stems using wires WIR that are as short as possible. The sum of wiring lengths can be very shortened from the pins PIN of the package PKG to the input and output circuits, and the delay time caused by the wiring can be reduced, too. Further, the inductance decreases so that the package is adapted to very high-speed DRAMs. Moreover, if the conductor pattern CPTN on the stem is made in the multilayer wiring structure, it is allowed to increase the number of bonding pads for power supply without limited by the number and positions of the pins for power supply of the package and, hence, to decrease the inductance in the power supply wiring.

FIG. 59 shows the pin constitution of a 4-megabit ECL DRAM. In the case of the 4-M words x 1 bit constitution, there are 22 address inputs. Symbols $A_0$ to $A_{11}$ denote X-system addresses for switching the word lines, $A_{12}$ to $A_{18}$ are Y-system addresses for switching the data lines, and $A_{19}$ to $A_{21}$ are Z-system addresses for switching the main amplifier as mentioned with reference to FIG. 47, i.e., address inputs for effecting the static column operation. Reference numeral $\overline{OE}$ denotes an output enable signal that works as described with reference to FIGS. 47 and 48. Symbol $\overline{REF}$ denotes a refresh control signal which, though it was not mentioned in the foregoing embodiments, works to automatically effect the refresh with address signals generated from the address counter in the chip instead of effecting the refresh operation by switching the ordinary signals $A_0$ to $A_{11}$. It is desired to provide pins $V_{CCR}$ and $V_{EER}$ for the negative side to supply voltages with little fluctuation to a circuit that generates reference voltage in addition to the power supply pins $V_{CC}$ and $V_{EE}$ of the positive and negative sides. If the voltages $V_{CCR}$ and $V_{EER}$ are supplied to the circuit that generates reference voltage shown in FIG. 26, there is generated a more stable voltage.

Using the present invention as described above, most of the circuits in the chip are operated on small amplitudes, and the MOS memory cells are driven on signals whose levels are converted into large amplitudes through the level converter circuit, making it possible to realize a high-speed, low-noise and low-power-consumption semiconductor device. One of the applications of the present invention is a very high-speed ECL interface BiCMOS DRAM, featuring the performance of, for example, an access time of 5 ns and a cycle time of 10 ns when it has 4 megabits. With such a very high-speed DRAM, it is technically difficult to multiplex the X-system addresses and the Y-system addresses on the same pins, and it is desired to employ an address non-multiplexing in which separate pins are provided for the X-system and the Y-system. However, when it is desired to increase the mounting density by decreasing the number of pins of the package, it is recommended to use the address multiplexing which is the same as the ordinary DRAM though the high-speed performance is lost to some extent. Even in this case, the ECL interface permits the timings among the signals to be adjusted more precisely than in the TTL making it possible to achieve high-speed performance from the standpoint of both the chip design and the design of mounting. On the other hand, when the device of 4 megabits is constituted by the CMOS transistors only, it is not allowed to realize the ECL interface, and the access time of 50 ns and the cycle time of 120 ns are the possible limits in the TTL. Such a very high-speed performance stems from the bipolar input and output circuits, very small CMOS elements and high-speed array constitution. That is, the input and output circuits are constituted by bipolar current switches, and the outputs thereof are not subjected to the level conversion but are used to directly operate the CMOS predecoder and the decoder, contributing to decreasing the number of logical steps. Further, the decoder and the level converter circuit are formed as a unitary structure using current mirror circuits to detect a change in the input voltage maintaining high sensitivity and to generate signals of a large amplitude on the word lines. Further, the memory cell array includes static word drivers and is divided into many sections to directly sense very small signals on the data lines. This makes it possible to achieve an access time comparable with that of the SRAM. The very high-speed DRAM has a refresh performance of, for example, 8192 cycles/16 ms. A conventional CMOS 4-megabit DRAM has the refresh performance of 1024 cycles/16 ms. The loss of speed due to refresh is nearly the same between them as viewed from a user. This is because, even when the number of refresh cycles is eight times, the cycle time can be reduced to one-tenth or smaller, and the 4-megabit refresh time becomes nearly the same. The purpose of increasing the number of refresh cycles in the very high-speed DRAM is to decrease the number of the CMOS sense amplifiers that are driven simultaneously and to suppress the supply noise caused by the charge and discharge of data lines and the consumption of current (which. varies in reverse proportion to the cycle time). The number of refresh cycles may be increased to 8 to 16 kilocycles. Desirable specifications for ECL are those of 100K of Motorola Co. (Vhd EE= −4.5 V) with a small supply voltage and small temperature dependency. However, 10K specifications of Motorola Co. ($V_{EE}= -5.2$ V) having slightly large supply voltage and temperature dependency can also be realized easily by simply modifying the circuit that generates a reference volotage for input and output circuits. Even in the case of the 10K specifications, the circuits in the chip can be operated on a voltage having little dependency upon the supply voltage and the temperature. The circuit constitution of the present invention can be directly utilized even for special specifications in which $|V_{EE}|$ has a smaller value. Use of the bipolar transistors gives an advantage in that the input/output circuits and read circuits can be operated at high speeds and that the circuit for generating internal voltage can be formed highly precisely. As is well known, $V_{BE}$ of a bipolar transistor is little dispersed and the internal voltage is generated maintaining precision. In particular, the band-gap generator makes it possible to generate a voltage having almost zero dependency upon the supply voltage and the temperature.

Combination of the present invention and a small BiCMOS device makes it possible to design not only the ECL interface but the BiCMOS DRAM of the TTL interface as well.

Furthermore combination of the decoder, word driver, memory array system, and small CMOS device of the present invention makes it possible to realize a TTL interface DRAM that operates at a considerably high speed even without using the bipolar transistors. In this case, the circuit for generating a constant voltage in the chip may be, for example, the one that is disclosed in IEEE Journal of Solid-State Circuits, Vol. 23, No. 5, October, 1988, pp. 1128–1132.

It is further understood by those skilled in the art that the foregoing description is a preferred embodiment of the disclosed device and that various changes and modifications may be made in the invention without departing from the spirit and scope thereof.

What is claimed is:

1. A semiconductor device comprising:
   first and second field-effect transistors having the same conductivity type, wherein the sources of said first and second field-effect transistors are electrically coupled to a first power supply;
   a first switch that opens and closes upon reception of a first input signal and that is provided between a second power supply and a terminal to which are electrically coupled the gate and drain of the first field-effect transistor and the gate of the second field-effect transistor; and
   a second switch that opens and closes upon reception of a second input signal and that is provided between a second power supply and an output terminal to which the drain of said second field-effect transistor is electrically coupled.

2. A semiconductor device according to claim 1, wherein the amplitudes of the first and second input signals are set smaller than the amplitude of the output signal.

3. A semiconductor device according to claim 1, further comprising a plurality of field-effect transistors having the same conductivity type, the gates of said field-effect transistors being coupled to dissimilar input terminals, the sources thereof being coupled to said second power supply, the drains thereof being coupled to said first input terminal, and an inverter which is comprised of complementary field-effect transistors, which uses said first and second power supplies, and which is coupled to said output terminal, wherein the input signals applied to the input terminals coupled to the respective gates of said field-effect transistors of the same conductivity type have amplitudes smaller than the amplitude of a signal generated on the output terminal of said inverter.

4. A semiconductor device according to claim 1, wherein the input signals having said small amplitudes are generated by emitter-coupled current switching circuits comprised of bipolar transistors.

5. A semiconductor device according to claim 1, wherein memory cells using field-effect transistors are coupled to the output terminal.

6. A semiconductor device according to claim 1, wherein the potentials of said small-amplitude signals and said large-amplitude signals remain nearly constant about the voltage of a high-voltage power supply of the semiconductor device as a reference irrespective of change in the voltage of a low-voltage power supply.

7. A semiconductor device according to claim 1, wherein the potentials of said small-amplitude signals and said large-amplitude signals vary depending upon a change in the voltage of the low-voltage power supply in the semiconductor device about the voltage of said low-voltage power supply as a reference.

8. A semiconductor device comprising:
   a plurality of subarrays formed by dividing a memory cell array comprised of MOS memory cells in a manner to divide data lines of said memory cell array;
   a MOS differential circuit for reading, which is provided for every pair of data lines to which a plurality of memory cells in said subarrays are coupled, which receives signals from the pair of data lines as gate inputs, and which produces outputs to the pair of common data lines for reading;

a circuit for transferring write data from a pair of common data lines for writing to a pair of data lines;

a CMOS sense amplifier which differentially amplifies the signals of the pair of data lines to rewrite data into memory cells; and a circuit for precharging said data lines, wherein at least one of said MOS differential circuit for reading, said circuit for transferring write data, said CMOS sense amplifier and said data line precharge circuit is commonly used in the two subarrays, and wherein two pairs of switches are provided between these circuits and the data lines of said two subarrays so that, during the reading or writing operation, these circuits are electrically coupled to one of the two subarrays through the switches but are electrically cut from the other subarrays.

9. A semiconductor device according to claim 8, wherein the memory cells are of the dynamic type compirsed of an MOS transistor and a storage capacitance.

10. A semiconductor memory device comprising:

a plurality of subarrays formed by dividing a memory cell array comprised of MOS dynamic memory cells in a manner to divide data lines of said memory cell array;

a MOS differential circuit for reading which is provided for every pair of data lines to which a plurality of memory cells are coupled in said subarrays, which receives signals from the pair of data lines as gate inputs, and which produces outputs to the pair of common data lines for reading;

a circuit for transferring write data from a pair of common data lines for writing to a pair of data lines;

a CMOS sense amplifier which differentially amplifies the signals of the pair of data lines to rewrite the data onto memory cells; and a circuit for precharging data lines, wherein the MOS differential circuit for reading detects a difference in the signal voltages read from the memory cell to the pair of data lines before said CMOS sense amplifier operates and sends the difference to a circuit of the succeeding stage, and wherein the data lines and the column select signal lines for selecting the MOS differential circuits for reading and the data transfer circuits for writing are formed of different wiring layers and are shielded from each other by a separate conductive layer.

11. A semiconductor memory device according to claim 10, wherein said conductive layers for shielding are plate layers for common electrodes of storage capacitances of dynamic memory cells.

12. A semiconductor device comprising:

a semiconductor chip;

input circuit means for receiving an input signal, provided on the semiconductor chip;

internal circuit means for receiving an output signal of the input circuit means, provided on the semiconductor chip;

output circuit means for receiving an output signal of the internal circuit means, provided on the semiconductor chip; and first voltage converter means for converting an external supply voltage to an internal supply voltage, provided on the semiconductor chip, wherein:

the input circuit means comprises bipolar transistors;

the output circuit means comprises bipolar transistors;

the internal circuit means comprises complementary insulated gate field-effect transistors;

the input circuit means receives the external supply voltage;

the output circuit means receives the external supply voltage; and the internal circuit means receives the internal supply voltage outputted by the first voltage converter means.

13. A semiconductor device according to claim 12, wherein:

the internal circuit means comprises bipolar transistors;

the input circuit means comprises complementary insulated gate field-effect transistors; and the output circuit means comprises complementary insulated gate field-effect transistors.

14. A semiconductor device according to claim 12, wherein an amplitude of the input signal is one of ECL or TTL level, and an amplitude of the output signal of the output circuit is one of ECL or TTL level.

15. A semiconductor device according to claim 12, wherein the internal supply voltage is lower than 1.5 volts.

* * * * *